US008508967B2

(12) United States Patent
Yamazaki et al.

(10) Patent No.: US 8,508,967 B2
(45) Date of Patent: Aug. 13, 2013

(54) SEMICONDUCTOR DEVICE AND DRIVING METHOD OF SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 162 days.

(21) Appl. No.: 13/223,490

(22) Filed: Sep. 1, 2011

(65) Prior Publication Data

US 2012/0057396 A1 Mar. 8, 2012

(30) Foreign Application Priority Data

Sep. 3, 2010 (JP) .................................. 2010-197559
Jan. 17, 2011 (JP) .................................. 2011-006632
May 13, 2011 (JP) .................................. 2011-107806

(51) Int. Cl.
*G11C 5/02* (2006.01)
*G11C 5/06* (2006.01)
*G11C 11/24* (2006.01)

(52) U.S. Cl.
USPC .................................. 365/51; 365/63; 365/149

(58) Field of Classification Search
USPC .......................................................... 365/51
See application file for complete search history.

(56) References Cited

U.S. PATENT DOCUMENTS

| 5,060,191 | A | 10/1991 | Nagasaki et al. |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,690,598 | B2 | 2/2004 | Oguchi et al. |
| 6,727,522 | B1 | 4/2004 | Kawasaki et al. |
| 6,765,844 | B2 * | 7/2004 | Fujisawa et al. ......... 365/230.03 |
| 6,791,863 | B2 | 9/2004 | Oguchi et al. |

(Continued)

FOREIGN PATENT DOCUMENTS

| CN | 1256792 A | 6/2000 |
| CN | 1977337 A | 6/2007 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Son Mai
(74) *Attorney, Agent, or Firm* — Fish & Richardson P.C.

(57) ABSTRACT

An object is to provide a semiconductor device having a novel structure, which can hold stored data even when not powered and which has an unlimited number of write cycles. A semiconductor device is provided with both a memory circuit including a transistor including an oxide semiconductor (in a broader sense, a transistor whose off-state current is sufficiently small) and a peripheral circuit such as a driver circuit including a transistor including a material other than an oxide semiconductor (in other words, a transistor capable of operating at sufficiently high speed). The peripheral circuit is provided in a lower portion and the memory circuit is provided in an upper portion; thus, the area and size of the semiconductor device can be decreased.

20 Claims, 34 Drawing Sheets

(56) References Cited

U.S. PATENT DOCUMENTS

| | | |
|---|---|---|
| 6,846,703 B2 | 1/2005 | Shimoda et al. |
| 6,881,975 B2 | 4/2005 | Anzai et al. |
| 6,972,985 B2 | 12/2005 | Rinerson et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,554,169 B2 | 6/2009 | Anzai et al. |
| 7,674,650 B2 | 3/2010 | Akimoto et al. |
| 7,696,063 B2 | 4/2010 | Tsuchiya |
| 7,732,819 B2 | 6/2010 | Akimoto et al. |
| 7,888,207 B2 | 2/2011 | Wager, III et al. |
| 7,910,490 B2 | 3/2011 | Akimoto et al. |
| 7,932,521 B2 | 4/2011 | Akimoto et al. |
| 7,939,831 B2 | 5/2011 | Anzai et al. |
| 8,008,137 B2 | 8/2011 | Wu et al. |
| 8,036,010 B2 * | 10/2011 | Maejima ......................... 365/51 |
| 8,274,077 B2 | 9/2012 | Akimoto et al. |
| 2001/0046027 A1 | 11/2001 | Tai et al. |
| 2002/0018357 A1 | 2/2002 | Oguchi et al. |
| 2002/0056838 A1 | 5/2002 | Ogawa |
| 2002/0132454 A1 | 9/2002 | Ohtsu et al. |
| 2003/0057423 A1 | 3/2003 | Shimoda et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0251461 A1 | 12/2004 | Anzai et al. |
| 2005/0017302 A1 | 1/2005 | Hoffman |
| 2005/0199959 A1 | 9/2005 | Chiang et al. |
| 2005/0243595 A1 | 11/2005 | Rinerson et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230435 A1 | 9/2009 | Maejima |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0156027 A1 | 6/2011 | Yamazaki et al. |
| 2011/0163311 A1 | 7/2011 | Akimoto et al. |
| 2011/0207251 A1 | 8/2011 | Anzai et al. |
| 2011/0299318 A1 | 12/2011 | Kaneko et al. |
| 2012/0063207 A1 * | 3/2012 | Kato et al. ..................... 365/149 |
| 2012/0063208 A1 | 3/2012 | Koyama et al. |
| 2012/0063209 A1 * | 3/2012 | Koyama et al. ............... 365/149 |

FOREIGN PATENT DOCUMENTS

| | | |
|---|---|---|
| EP | 1 017 100 A1 | 7/2000 |
| EP | 1 603 163 A2 | 12/2005 |
| EP | 1 737 044 A1 | 12/2006 |
| EP | 2 204 813 A1 | 7/2010 |
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-097366 A | 4/1994 |
| JP | 08-264794 A | 10/1996 |
| JP | 11-505377 A | 5/1999 |
| JP | 11-251518 A | 9/1999 |
| JP | 2000-044236 A | 2/2000 |
| JP | 2000-150900 A | 5/2000 |
| JP | 2002-026285 A | 1/2002 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |

| JP | 2004-103957 A | 4/2004 |
| JP | 2004-214645 A | 7/2004 |
| JP | 2004-273614 A | 9/2004 |
| JP | 2004-273732 A | 9/2004 |
| JP | 2007-096055 A | 4/2007 |
| JP | 2007-536680 A | 12/2007 |
| JP | 2009-135350 A | 6/2009 |
| JP | 2009-223971 A | 10/2009 |
| WO | 99/45593 A1 | 9/1999 |
| WO | 2004/114391 A1 | 12/2004 |
| WO | 2005/117021 A1 | 12/2005 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FDF '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FDF '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5Δ) Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,OrZn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Obserevation of Blue Phases in Chiral Networks," Liquid Crystals, 1993, vol. 14, No. 3, pp. 911-916

Kurokawa, Y et al., "UHF RFCPUS on Flexible and Glass Substrates for Secure RFID Systems,"Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park; et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2011/069241, dated Nov. 29, 2011, 4 pages.

Written Opinion, PCT Application No. PCT/JP2011/069241, dated Nov. 29, 2011, 5 pages.

Kamiya, T et al., "Carrier Transport Properties and Electronic Structures of Amorphous Oxide", Solid State Physics, Kotai Butsuri, Japan, vol. 44, No. 9, 2009, pp. 621-633 (with full English translation).

* cited by examiner

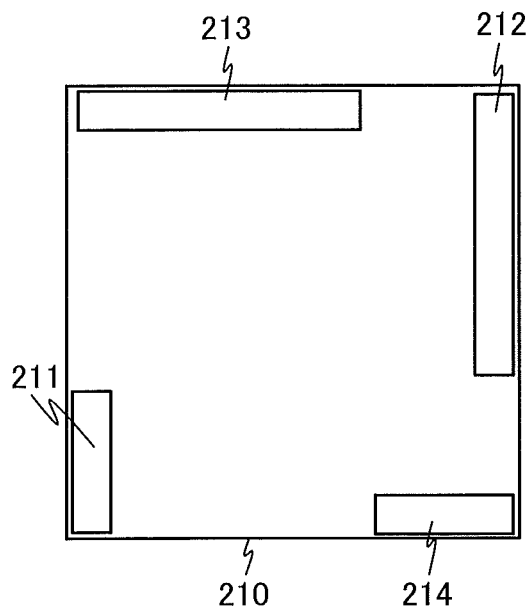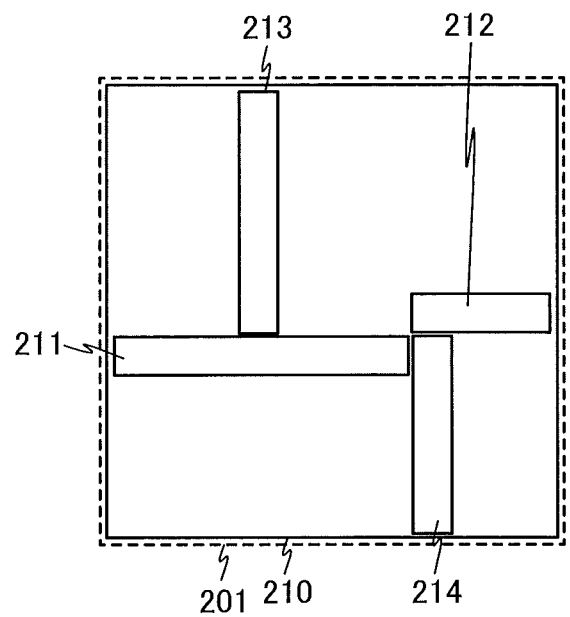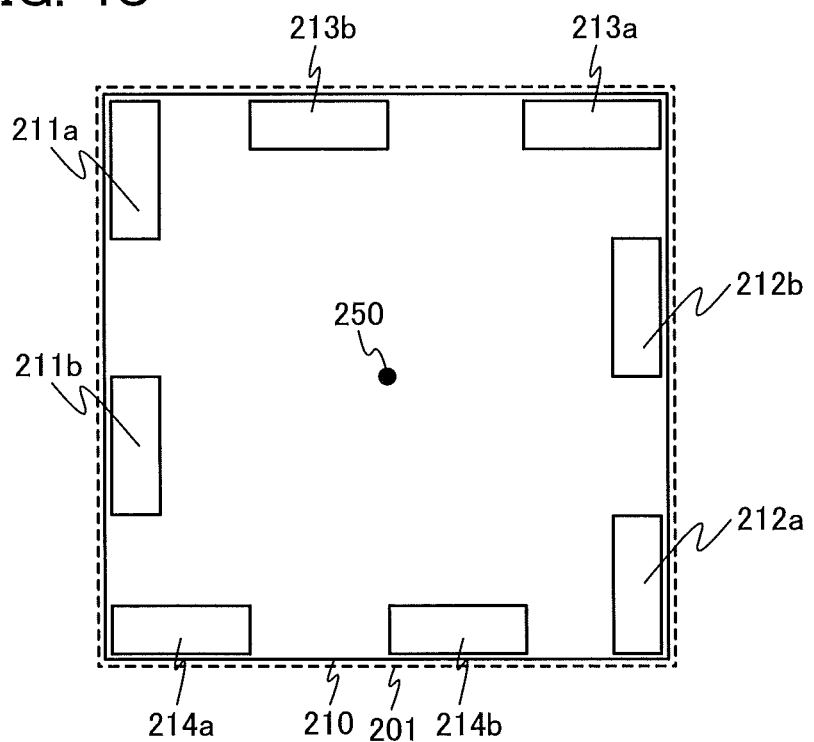

c-axis direction
charge is 0 charge is +1 charge is 0
a-b plane charge is −1 charge is 0

● In
◔ Sn
○ Zn
• O

● In
○ Ga
○ Zn
● O

- In
- Ga or Zn
- O

- In
- Ga
- Zn
- O

SEMICONDUCTOR DEVICE AND DRIVING METHOD OF SEMICONDUCTOR DEVICE

TECHNICAL FIELD

An embodiment of the invention disclosed herein relates to a semiconductor device including a semiconductor element and a driving method of the semiconductor device.

BACKGROUND ART

Memory devices including semiconductor elements are broadly classified into two categories: volatile memory devices that lose stored data when not powered, and nonvolatile memory devices that hold stored data even when not powered.

A typical example of volatile memory devices is a dynamic random access memory (DRAM). A DRAM stores data in such a manner that a transistor included in a memory element is selected and electric charge is stored in a capacitor.

When data is read from a DRAM, electric charge in a capacitor is lost according to the above-described principle; thus, another write operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, write operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of volatile memory devices is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of nonvolatile memory devices is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject charge into the floating gate or removing the charge, and a circuit for that purpose is required. Further, it takes a relatively long time to inject or remove electric charge, and it is not easy to increase the speed of writing or erasing data.

REFERENCE

[Patent Document 1] Japanese Published Patent Application No. S57-105889

DISCLOSURE OF INVENTION

In view of the foregoing problems, an object of one embodiment of the disclosed invention is to provide a semiconductor device having a novel structure, which can hold stored data even when not powered and which has an unlimited number of write cycles.

In one embodiment of the disclosed invention, a semiconductor device is formed using a material capable of sufficiently reducing the off-state current of a transistor, such as an oxide semiconductor material that is a widegap semiconductor. The use of a semiconductor material capable of sufficiently reducing the off-state current of a transistor allows data to be held for a long time.

One embodiment of the present invention is a semiconductor device which includes first to fourth driver circuits and a memory cell array including a plurality of memory cells arranged in a matrix over the first to fourth driver circuits. One of the plurality of memory cells includes a transistor having a gate electrode, a source electrode, a drain electrode, an oxide semiconductor layer, and a gate insulating layer and a capacitor having the source electrode or the drain electrode, the gate insulating layer, and an electrode layer. The first driver circuit and the second driver circuit are arranged so as to be symmetrical with respect to the center point of the memory cell array. The third driver circuit and the fourth driver circuit are arranged so as to be perpendicular to the first driver circuit and the second driver circuit, and the third driver circuit and the fourth driver circuit are arranged so as to be symmetrical with respect to the center point of the memory cell array.

In the above embodiment, the first to fourth driver circuits are preferably provided under the memory cell array. In addition, in the above embodiment, the first to fourth driver circuits are preferably provided so as to be covered with and not to extend beyond the memory cell array. Furthermore, in the above embodiment, the first and second driver circuits each include a column decoder and a sense amplifier portion, and the third and fourth driver circuits are each a row decoder. Morever, in the above embodiment, the first to fourth driver circuits include a material other than an oxide semiconductor.

In the above embodiment, the number of wirings connected to the first driver circuit and the memory cell array is preferably equal to the number of wirings connected to the second driver circuit and the memory cell array. In addition, the number of wirings connected to the third driver circuit and the memory cell array is preferably equal to the number of wirings connected to the fourth driver circuit and the memory cell array.

Note that although, in the above embodiment, the transistor may be formed using an oxide semiconductor, the disclosed invention is not limited thereto. A material capable of realizing off-state current characteristics comparable to those of an oxide semiconductor, for example, a widegap material (specifically, a semiconductor material having an energy gap Eg of more than 3 eV, for example), such as silicon carbide, or the like may be employed.

Note that the term "over" or "under" in this specification and the like does not necessarily mean that a component is placed "directly on" or "directly under" another component.

For example, the expression "a gate electrode over a gate insulating layer" does not exclude a structure where a component is placed between the gate insulating layer and the gate electrode. Moreover, the terms "over" and "under" are used simply for convenience of explanation.

In addition, the term "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification and the like Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and elements with a variety of functions as well as an electrode and a wiring.

Since the off-state current of transistors including an oxide semiconductor is extremely small, stored data can be held for an extremely long time owing to such transistors. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device according to the disclosed invention, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized. Additionally, there is an advantage in that operation for erasing data is not needed.

Since a transistor including a material other than an oxide semiconductor can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to operate at high speed.

A semiconductor device having a novel feature can be realized by being provided with both a peripheral circuit such as a driver circuit including a transistor including a material other than an oxide semiconductor (in other words, a transistor capable of operating at sufficiently high speed) and a memory circuit including a transistor including an oxide semiconductor (in a broader sense, a transistor whose off-state current is sufficiently small).

BRIEF DESCRIPTION OF DRAWINGS

FIGS. 4A to 4C are block diagrams of a semiconductor device.

BEST MODE FOR CARRYING OUT THE INVENTION

Figure 1:
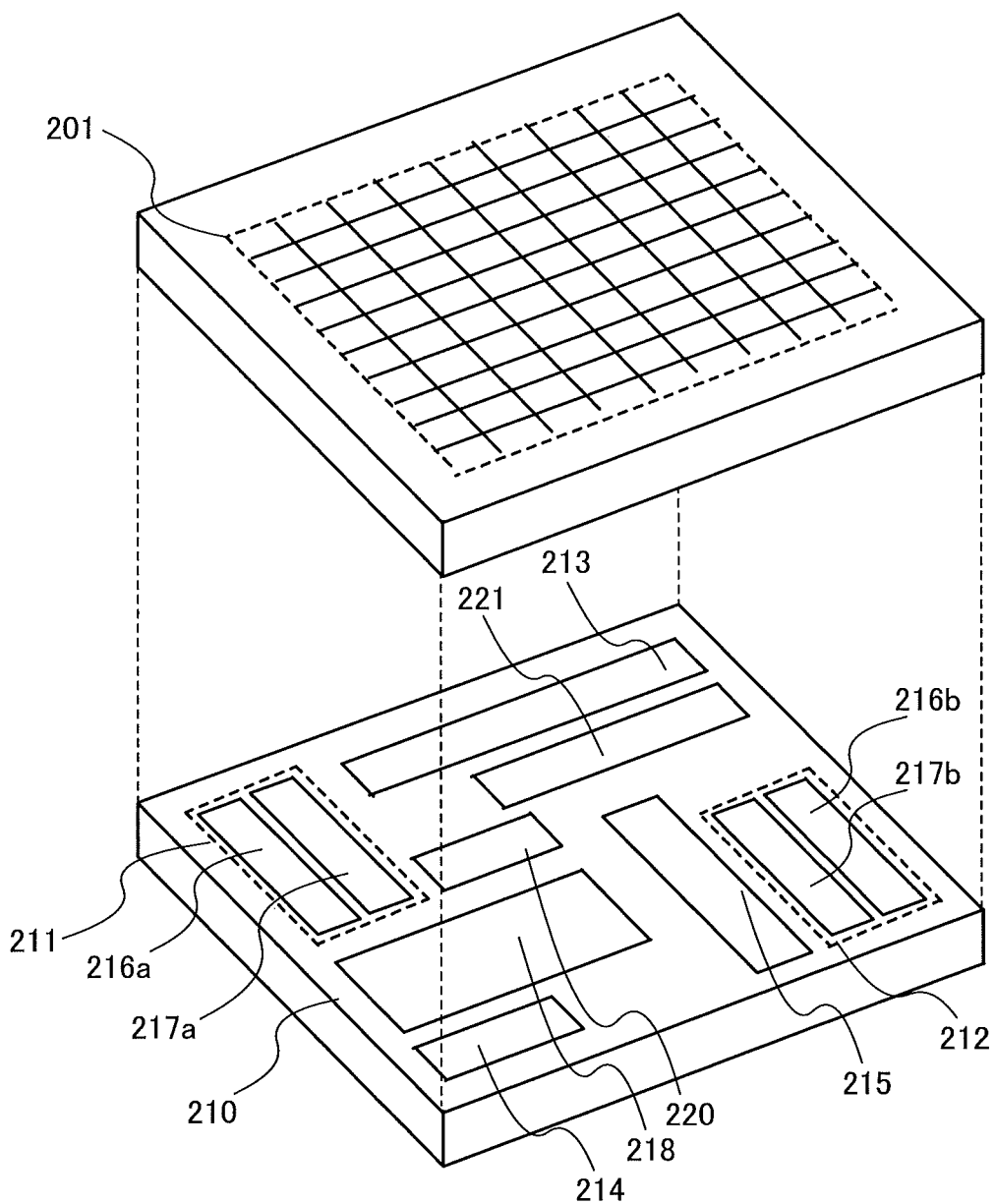
FIG. 1 is a schematic diagram of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

Structures of semiconductor devices according to one embodiment of the present invention will be described with reference to FIG. 1, FIGS. 2A and 2B, FIGS. 3A to 3C, FIGS. 4A to 4C, FIG. 5, FIG. 6, FIG. 7, and FIG. 8.

<Structure of Semiconductor Device>

FIG. 1 is a schematic diagram illustrating an example of a structure of a semiconductor device. The semiconductor device according to one embodiment of the present invention has a stacked-layer structure and includes a memory circuit in an upper portion and a peripheral circuit including a driver circuit, a control circuit, and the like, which needs to operate at high speed for driving the memory circuit, in a lower portion. Note that the driver circuit or the control circuit may be a logic circuit. The peripheral circuit may include an analog circuit, or may include an arithmetic circuit.

The semiconductor device illustrated in FIG. 1 includes a memory cell array 201 including a plurality of memory cells as a memory circuit in an upper portion and a peripheral circuit 210 including a first driver circuit 211, a second driver circuit 212, a third driver circuit 213, a fourth driver circuit 214, a fifth driver circuit 215, a controller 218, an address buffer 221, an I/O buffer 220, and the like, which is necessary for operating the memory cell array 201, in a lower portion. The first driver circuit 211 includes a column decoder 217a and a sense amplifier group 216a, and the second driver circuit 212 includes a column decoder 217b and a sense amplifier group 216b.

Figure 2A:
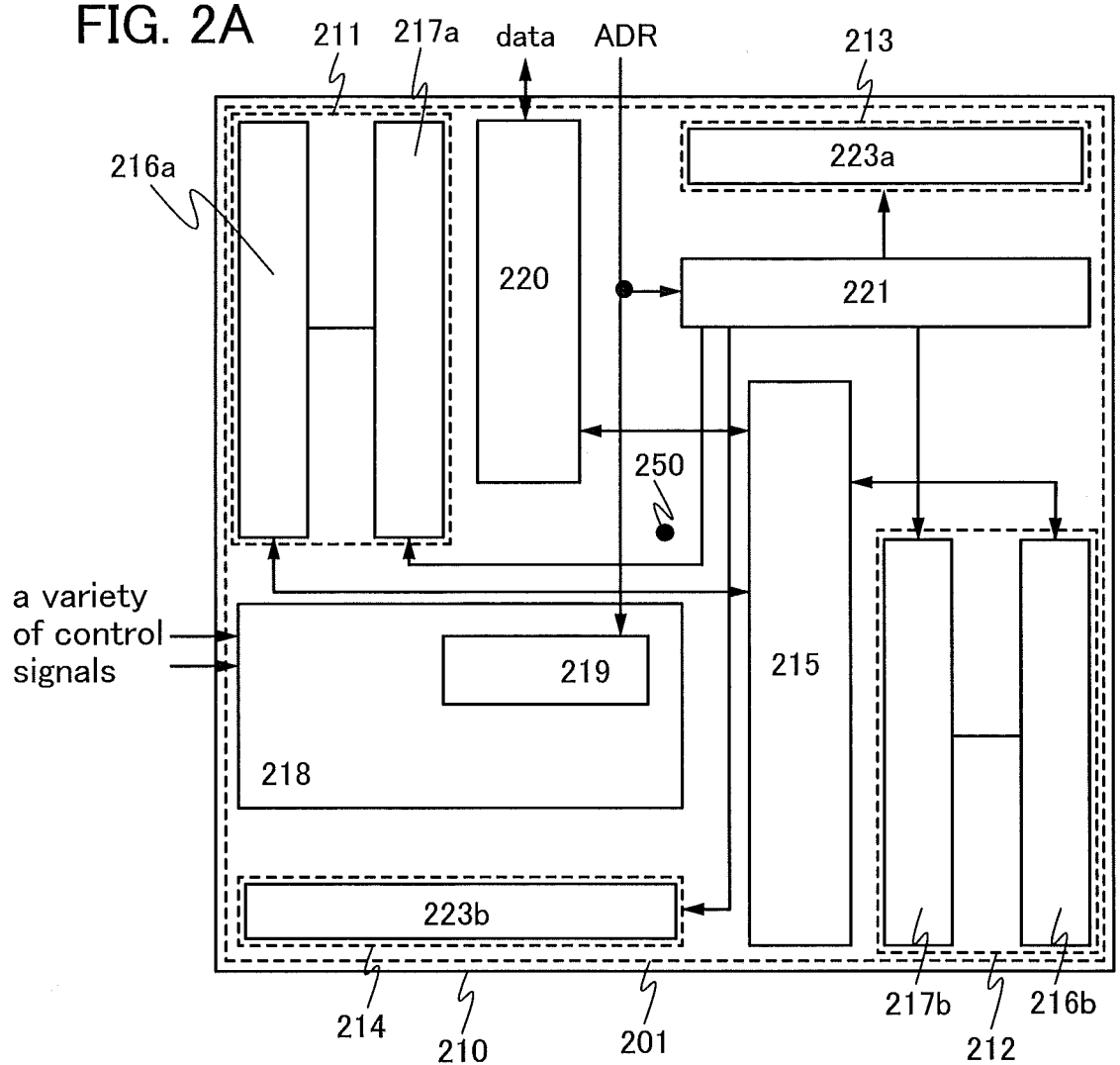
FIGS. 2A and 2B are block diagrams of a semiconductor device.
Figure 2B:
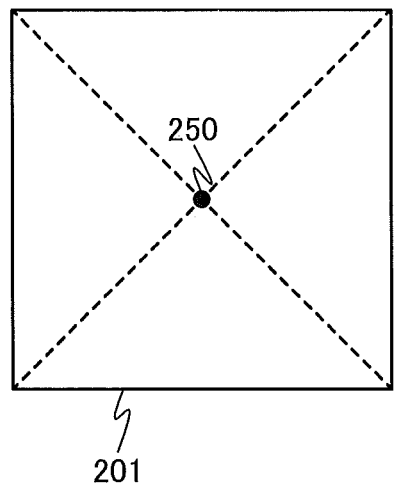

FIG. 2A is a block diagram of the peripheral circuit 210 in the lower portion of the semiconductor device illustrated in FIG. 1, and FIG. 2B illustrates the symmetry with respect to a center point 250 of the memory cell array 201. FIG. 2A illustrates the case where the peripheral circuit 210 is provided under the memory cell array 201.

The peripheral circuit 210 illustrated in FIG. 2A includes the first driver circuit 211, the second driver circuit 212, the third driver circuit 213, the fourth driver circuit 214, the fifth driver circuit 215, the controller 218, the address buffer 221, and the I/O buffer 220. The first driver circuit 211 includes the column decoder 217a and the sense amplifier group 216a, and the second driver circuit 212 includes the column decoder 217b and the sense amplifier group 216b. The third driver circuit 213 and the fourth driver circuit 214 include a row decoder 223a and a row decoder 223b, respectively. The fifth driver circuit 215 includes a write circuit, a read circuit, and a latch circuit group. The controller 218 includes a mode register 219.

As a substrate where the peripheral circuit 210 illustrated in FIG. 2A is provided, a semiconductor substrate including a Group 14 element, such as silicon, germanium, silicon germanium, or silicon carbide, a compound semiconductor substrate, such as gallium arsenide or indium phosphide, an SOI substrate, or the like can be used, for example. Note that the term "SOI substrate" generally means a substrate where a silicon layer is provided over an insulating surface. In this specification and the like, the term "SOI substrate" also means a substrate where a semiconductor layer containing a material other than silicon is provided over an insulating surface. Moreover, the SOI substrate can be a substrate having a structure in which a semiconductor layer is provided over an insulating substrate such as a glass substrate, with an insulating layer interposed therebetween. It is preferable to form the peripheral circuit 210 using any of the above-described substrates because the peripheral circuit 210 can be made to operate at high speed.

The address buffer 221 outputs a row address signal to the row decoder 223a and the row decoder 223b, or a column address signal to the column decoder 217a and the column decoder 217b, according to a variety of control signals on an input of an address signal ADR from the outside. The row decoder 223a and the row decoder 223b select a row specified by a row address according to the input row address signal. The column decoder 217a and the column decoder 217b select a column specified by a column address according to the input column address signal.

The sense amplifier groups 216a and 216b are connected to bit lines BL, and detect and amplify the potentials of the bit lines BL.

The fifth driver circuit 215 includes the read circuit, the write circuit, and the latch circuit group, and is connected to the sense amplifier groups 216a and 216b. The read circuit receives an output signal of a sense amplifier of a column specified by a column address as an input signal, and reads out data stored in a memory cell. The write circuit outputs a signal corresponding to data to be written to a bit line BL of a column specified by a column address. The latch circuit group stores data read from a memory cell or data to be written to a memory cell.

The I/O buffer 220 receives data which is input from the outside through a data signal line, and outputs data to the read circuit, the write circuit, and the latch circuit group of the fifth driver circuit 215. In addition, the I/O buffer 220 receives data which is stored in the read circuit, the write circuit, and the latch circuit group, and outputs data to the outside.

The controller 218 includes a command decoder, the mode register 219, and the like and receives a variety of control signals (e.g., /CS, /RAS, /CAS, and /WE). The command decoder decodes a command that is input by means of the variety of control signals. The mode register 219 is a register for setting an operation mode of the semiconductor device. Data is written to the mode register 219 according to a command and supplied with data to be written thereto by means of an address signal. The controller 218 generates a variety of control signals based on an output of the command decoder, and outputs the control signals to a variety of circuits.

Here, the first driver circuit 211 and the second driver circuit 212 are arranged so as to be symmetrical with respect to the center point 250 of the memory cell array 201. The third driver circuit 213 and the fourth driver circuit 214 are arranged so as to be symmetrical with respect to the center point 250 of the memory cell array 201. At this time, the third driver circuit 213 and the fourth driver circuit 214 are arranged so as to be perpendicular to the first driver circuit 211 and the second driver circuit 212. In one embodiment of the present invention, the expression "being symmetrical with respect to a point" refers to a positional relationship in which the first driver circuit 211 is in the position of the second driver circuit 212 when rotated 180° about the center point 250, as in the arrangement of the first driver circuit 211 and the second driver circuit 212 illustrated in FIG. 1 and FIGS. 2A and 2B. Note that the expression "being symmetrical with respect to a point" does not require being perfectly symmetrical with respect to a point and may be substantially symmetrical with respect to a point.

Figure 3A:
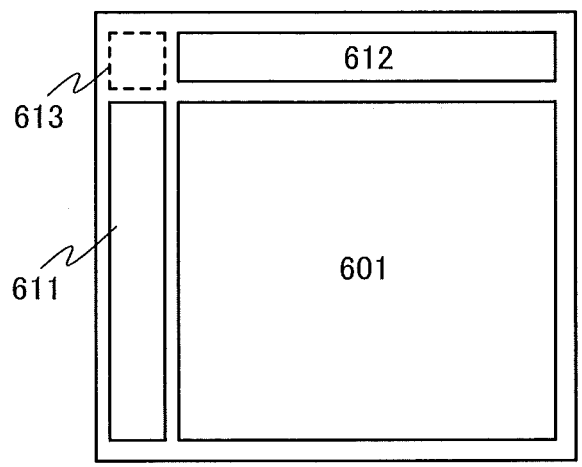
FIGS. 3A to 3C are schematic diagrams of a semiconductor device.
Figure 3B:
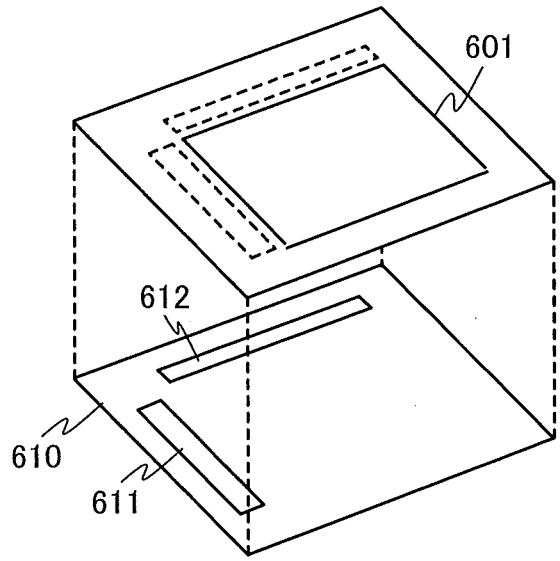
Figure 3C:
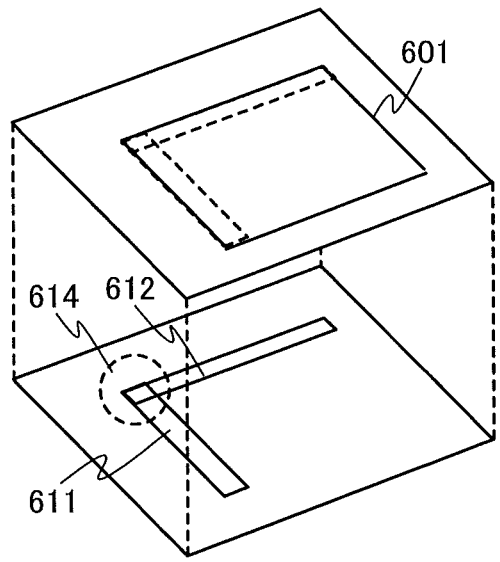

In order to drive a memory cell array 601 from one end to the other, a column decoder 611 and a row decoder 612 are provided along the memory cell array 601 as illustrated in FIG. 3A when the column decoder 611, the row decoder 612, and the memory cell array 601 are provided on the same plane. This layout accompanies a wasted region 613 and thus prevents a reduction in the area of the semiconductor device. In addition, even when a peripheral circuit 610 including the column decoder 611, the row decoder 612, and the like is provided in the lower portion of the semiconductor device and the memory cell array 601 is provided in the upper portion as illustrated in FIG. 3B, the column decoder 611 and the row decoder 612 need to be provided along the memory cell array 601. Thus, a wasted region is generated as illustrated in FIG. 3A, which therefore prevents reductions in the area and size of the semiconductor device. Furthermore, even when the column decoder 611 and the row decoder 612 are provided under the memory cell array 601, the column decoder 611 and the row decoder 612 intersect as illustrated in FIG. 3C (in an intersection portion 614). Thus, the column decoder 611 and the row decoder 612 cannot be arranged.

However, with an arrangement of divided column decoders and row decoders in the peripheral circuit 210 as illustrated in FIG. 1, a wasted region as illustrated in FIGS. 3A and 3B can be eliminated. Thus, the area of the peripheral circuit 210 can be decreased. In addition, with the arrangement of divided column decoders and row decoders in the peripheral circuit 210, the peripheral circuit 210 can be provided under the memory cell array 201. Thus, the size of the semiconductor device can be decreased. In particular, by making the area of the peripheral circuit 210 smaller than or equal to the area of the memory cell array 201, an increase in the circuit area due to the peripheral circuit 210 can be suppressed, and the area and size of the semiconductor device can be decreased. In the case where the area of the peripheral circuit 210 is considerably smaller than the area of the memory cell array 201, the scale of the peripheral circuit 210 may be increased so as to improve the function of the semiconductor device with more kinds of interfaces or commands, or the like. Note that the column decoder and the row decoder are described here, but this embodiment is not limited to the column decoder and the row decoder. The above-described effect can be obtained with any circuits that should be provided along the memory cell array 201 from the one end to the other.

In addition, with an arrangement in which divided column decoders and row decoders are provided such that the divided column decoders are arranged so as to be symmetrical to each other and the divided row decoders are arranged so as to be symmetrical to each other with respect to the center point of the memory cell array 201 as illustrated in FIGS. 2A and 2B, a wasted region can be eliminated. Thus, the area of the peripheral circuit 210 can be decreased. At least the first to fourth driver circuits 211 to 214 may be provided so as to be covered with and not to extend beyond the memory cell array 201. Furthermore, the peripheral circuit 210 can be provided under the memory cell array 201. Thus, the size of the semiconductor device can be decreased. Moreover, by making the area of the memory cell array 201 substantially equal to the area of the peripheral circuit 210, a wasted region can be eliminated. Thus, the area and size of the semiconductor device can be decreased.

Note that although FIG. 2A illustrates the case where the peripheral circuit 210 is provided under the memory cell array 201, the peripheral circuit 210 does not necessarily need to be provided under the memory cell array 201. However, in order to decrease the area and size of the semiconductor device, it is preferable that the peripheral circuit 210 including the first to fourth driver circuits 211 to 214 and the like be provided under the memory cell array 201.

FIGS. 4A to 4C illustrate arrangements of the first to fourth driver circuits 211 to 214. Note that for easy understanding, circuits other than the first to fourth driver circuits 211 to 214 are not illustrated in FIGS. 4A to 4C.

The number of wirings connected to the first driver circuit 211 and the memory cell array 201 may differ from the number of wirings, such as bit lines or word lines, connected to the second driver circuit 212 and the memory cell array 201 (see FIG. 4A). In other words, the area of the first driver circuit 211 may differ from the area of the second driver circuit 212. Even when the area of the first driver circuit 211 differs from the area of the second driver circuit 212, an inconvenience as illustrated in FIG. 3C, in other words, an inconvenience of overlap of a column decoder and a row decoder under a memory cell array can be avoided by providing a plurality of divided driver circuits. As a result, the area and size of the semiconductor device can be decreased.

On the other hand, the number of wirings connected to the first driver circuit 211 and the memory cell array 201 is preferably equal to the number of wirings, such as bit lines or word lines, connected to the second driver circuit 212 and the memory cell array 201. In that case, it is possible to reduce by half the number of wirings for connecting the first driver circuit 211 and the second driver circuit 212 to the memory cell array 201, thereby eliminating one address signal line for inputs to the first driver circuit 211 and the second driver circuit 212. As a result, the circuit scale can be decreased, and the area and size of the semiconductor device can be decreased.

In addition, with an arrangement in which the number of wirings connected to the first driver circuit 211 and the memory cell array 201 is equal to the number of wirings connected to the second driver circuit 212 and the memory cell array 201 and the first driver circuit 211 and the second driver circuit 212 are arranged so as to be substantially symmetrical with respect to the center point of the memory cell array 201, variation in parasitic resistance or parasitic capacitance among bit lines, word lines, or the like can be suppressed, and stable operation can be achieved.

Although the first driver circuit 211 and the second driver circuit 212 are described here, a similar effect can be obtained with the third driver circuit 213 and the fourth driver circuit 214.

Moreover, as illustrated in FIG. 4B, the first to fourth driver circuits 211 to 214 do not necessarily need to be provided in a peripheral portion of the peripheral circuit 210. Even when the first to fourth driver circuits 211 to 214 are not provided in the peripheral portion of the peripheral circuit 210, an inconvenience as illustrated in FIG. 3C, in other words, an inconvenience of overlap of a column decoder and a row decoder under a memory cell array can be avoided by providing a plurality of divided driver circuits. As a result, the area and size of the semiconductor device can be decreased.

FIG. 1 and FIGS. 2A and 2B illustrate the case where the number of each of the first to fourth driver circuits 211 to 214 is one; FIG. 4C illustrates the case where each of the first to fourth driver circuits 211 to 214 is divided into two.

As illustrated in FIG. 4C, a first driver circuit 211a and a second driver circuit 212a are arranged so as to be symmetrical with respect to the center point 250 of the memory cell array 201, and a first driver circuit 211b and a second driver circuit 212b are arranged so as to be symmetrical with respect to the center point 250 of the memory cell array 201. Similarly, a third driver circuit 213a and a fourth driver circuit 214a are arranged so as to be symmetrical with respect to the center point 250 of the memory cell array 201, and a third driver circuit 213b and a fourth driver circuit 214b are arranged so as to be symmetrical with respect to the center point 250 of the memory cell array 201.

The first driver circuit 211 and the second driver circuit 212 are each divided and the divided first driver circuits 211 are arranged so as to be symmetrical to the divided second driver circuits 212 with respect to the center point of the memory cell array 201. The third driver circuit 213 and the fourth driver circuit 214 are each divided and the divided third driver circuits 213 are arranged so as to be symmetrical to the divided fourth driver circuits 214 with respect to the center point of the memory cell array 201. Accordingly, a wasted region can be eliminated, and therefore, the area of the peripheral circuit 210 can be decreased. Furthermore, the peripheral circuit 210 can be provided under the memory cell array 201. Thus, the size of the semiconductor device can be decreased. Moreover, by making the area of the memory cell array 201 substantially equal to the area of the peripheral circuit 210, a wasted region can be eliminated. Thus, the area and size of the semiconductor device can be decreased.

Note that although FIG. 4C illustrates the case where each of the first to fourth driver circuits 211 to 214 is divided into two, one embodiment of the present invention is not limited to this example. Each of the first to fourth driver circuits 211 to 214 may be divided into three or more. In any case, with the arrangement in which the first to fourth driver circuits 211 to 214 are arranged so as to be symmetrical with respect to the center point 250 of the memory cell array 201, the above-described effect can be obtained.

<Circuit Configuration of Semiconductor Device>

Figure 5:
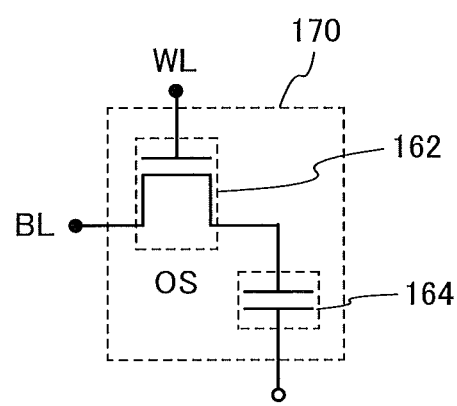
FIG. 5 is a circuit diagram of a semiconductor device.

FIG. 5 illustrates an example of a circuit configuration of a semiconductor device (a memory cell 170) which can be applied to the memory cell array 201. The semiconductor device includes a transistor 162 including an oxide semiconductor and a capacitor 164. Note that in FIG. 5, "OS" is written beside the transistor 162 in order to indicate that the transistor 162 includes an oxide semiconductor.

In the semiconductor device illustrated in FIG. 5, a bit line BL is electrically connected to a source or drain electrode of the transistor 162, a word line WL is electrically connected to a gate electrode of the transistor 162, and a source or drain electrode of the transistor 162 is electrically connected to a first terminal of the capacitor 164.

The transistor 162 including an oxide semiconductor has a characteristic of a significantly small off-state current. For that reason, when the transistor 162 is in an off state, a potential of the first terminal of the capacitor 164 (or charge accumulated in the capacitor 164) can be held for an extremely long period. Further, in the transistor 162 including an oxide semiconductor, a short channel effect is not likely to be caused, which is advantageous.

Next, writing and holding data in the semiconductor device (the memory cell 170) illustrated in FIG. 5 will be described.

First, the potential of the word line WL is set to a potential at which the transistor 162 is turned on, and the transistor 162 is turned on. Accordingly, the potential of the bit line BL is supplied to the first terminal of the capacitor 164 (writing). After that, the potential of the word line WL is set to a potential at which the transistor 162 is turned off, so that the transistor 162 is turned off. Thus, the potential of the first terminal of the capacitor 164 is held (holding).

Because the off-state current of the transistor 162 is extremely small, the potential of the first terminal of the capacitor 164 (or charge accumulated in the capacitor) can be held for a long time.

Next, reading data will be described. When the transistor 162 is turned on, the bit line BL and the capacitor 164 which are in a floating state are electrically connected to each other, and the charge is redistributed between the bit line BL and the capacitor 164. As a result, the potential of the bit line BL is changed. The amount of change in potential of the bit line BL varies depending on the potential of the first terminal of the capacitor 164 (or charge accumulated in the capacitor 164).

For example, the potential of the bit line BL after charge redistribution is $(C_B \times V_{B0} + C \times V)/(C_B + C)$, where V is the potential of the first terminal of the capacitor 164, C is the capacitance of the capacitor 164, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 170 is in either of two states in which the potentials of the first terminal of the capacitor 164 are $V_1$ and $V_0$ ($V_1 > V_0$), the potential of the bit line BL in the case of holding the potential $V_1$ ($(C_B \times V_{B0} - C \times V_1)/(C_B + C)$) is higher than the potential of the bit line BL in the case of holding the potential $V_0$ ($=(C_B \times V_{B0} - C \times V_0)/(C_B + C)$).

Then, by comparing the potential of the bit line BL with a predetermined potential, data can be read.

As described above, the semiconductor device illustrated in FIG. 5 can hold charge that is accumulated in the capacitor 164 for a long time because the off-state current of the transistor 162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Here, the measurement of a holding period for holding data in a memory cell array having the circuit configuration illustrated in FIG. 5 and the results of the measurement are described.

In this measurement, each memory cell included in the memory cell array is sequentially subjected to data writing, holding, and reading. Then, the total number of memory cells where data written matches data read was counted in relation to the length of the holding period.

Note that an 8-kbit (8192-bit) memory cell array was used for the measurement. The capacitance of the capacitor of each memory cell was 31 fF. In the measurement, the potential of the bit line BL at the time of writing was 3 V, and the potential of the word line WL at the time of holding data was −1 V. The holding periods were 1 sec, 30 sec, 100 sec, 300 sec, 1000 sec, 3000 sec, 10000 sec, 14 hr, and 48 hr.

Figure 16:
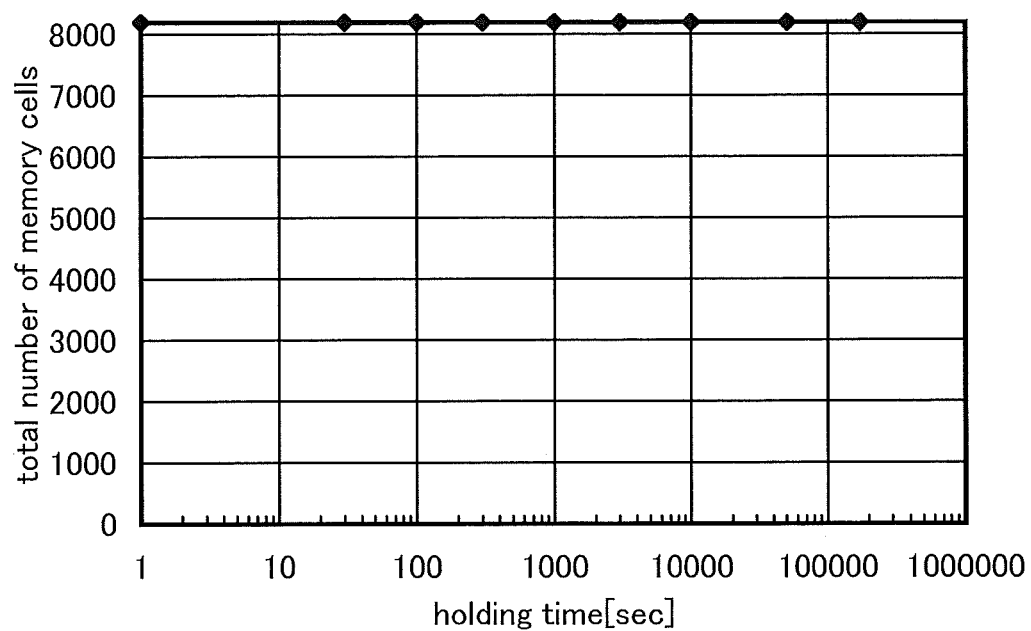
FIG. 16 is a graph showing a relation between a holding period and the total number of memory cells where data written matches data read.

FIG. 16 shows a relation between the holding period and the total number of memory cells where data written matches data read. It is confirmed that data written matches data read in all the memory cells of the memory cell array used for the measurement even when the holding period is 48 hr.

Note that a common DRAM includes a transistor including silicon in a channel formation region, and the interval between refresh operations is approximately 1/10 sec. Thus, it can be said that the frequency of refresh operations in the semiconductor device according to one embodiment of the present invention can be drastically decreased as compared to that in a common DRAM, and power consumption can be reduced.

Figure 6:
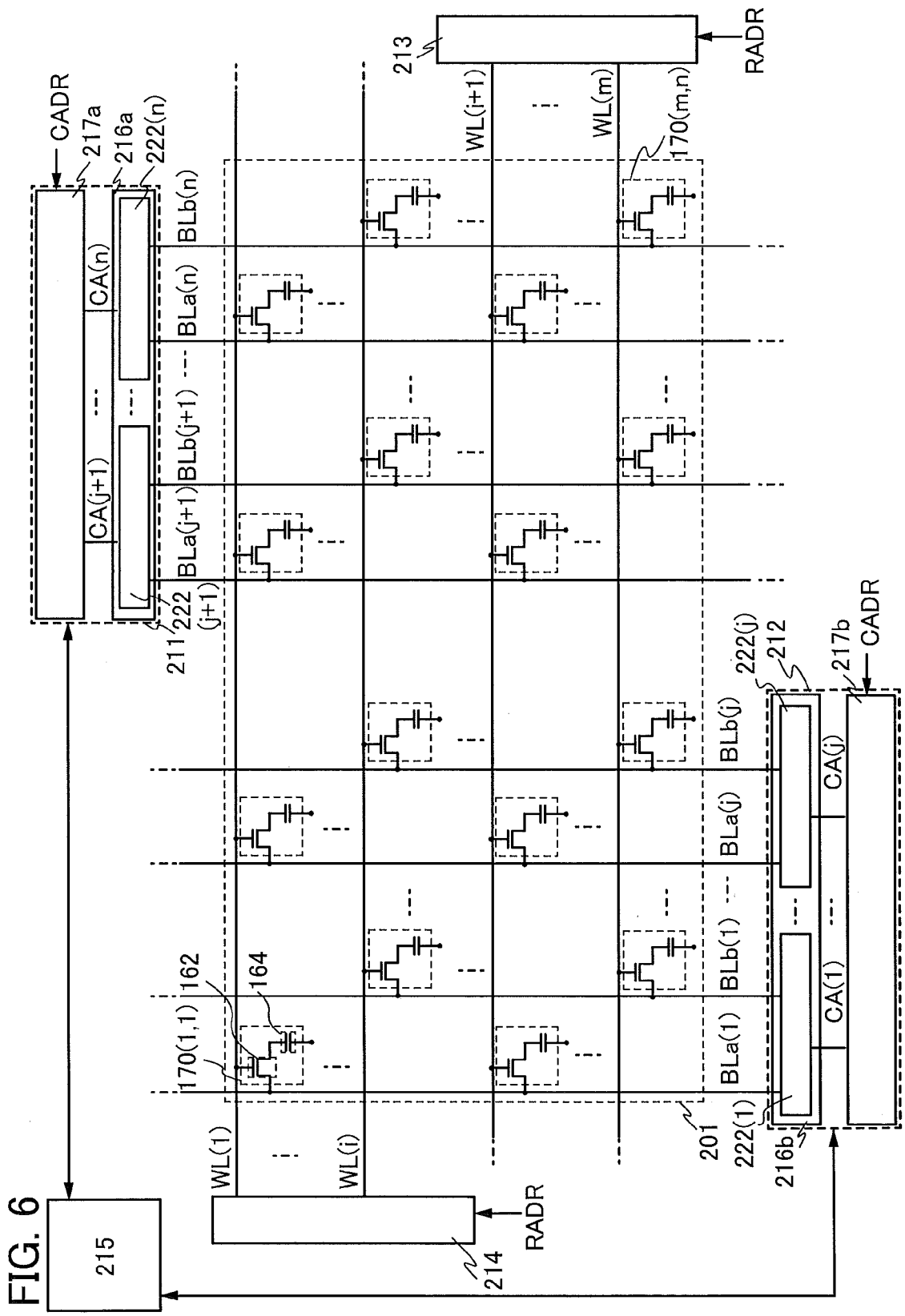
FIG. 6 is a circuit diagram of a semiconductor device.

Next, FIG. 6 illustrates the memory cell array 201 and part of the peripheral circuit. For easy understanding, FIG. 6 illustrates the memory cell array 201 and part of the peripheral circuit as if they are provided on the same plane; however, the peripheral circuit other than the memory cell array 201 is provided under the memory cell array 201. The memory cell 170 illustrated in FIG. 5 is applied to the memory cell array 201 in FIG. 6.

The memory cell array 201 illustrated in FIG. 6 includes m word lines WL, n bit lines BLa, n bit lines BLb, and a plurality of memory cells 170(1,1) to 170(m,n) arranged in a matrix of in (rows) (in the vertical direction) and n (columns) (in the horizontal direction). The word lines WL(1) to WL(i) are connected to the fourth driver circuit 214, and the word lines WL(i+1) to WL(m) are connected to the third driver circuit 213. The bit lines BLa(1) to BLa(j) and the bit lines BLb(1) to BLb(j) are connected to the second driver circuit 212, and the bit lines BLa(j+1) to BLa(n) and the bit lines BLb(j+1) to BLb(n) are connected to the first driver circuit 211. The first driver circuit 211 and the second driver circuit 212 are each connected to the fifth driver circuit 215.

The first driver circuit 211 includes the column decoder 217a and the sense amplifier group 216a, and the sense amplifier group 216a includes sense amplifiers 222(j+1) to 222(n). The column decoder 217a is connected to the sense amplifiers 222(j+1) to 222(n) through column address lines CA(j+1) to CA(n), and the sense amplifiers 222(j+1) to 222(n) are connected to the memory cell array 201 through the bit lines BLa(j+1) to BLa(n) and the bit lines BLb(j+1) to BL(n). Similarly, the second driver circuit 212 includes the column decoder 217b and the sense amplifier group 216b, and the sense amplifier group 216b include sense amplifiers 222(1) to 222(j). The column decoder 217b is connected to the sense amplifiers 222(1) to 222(j) through column address lines CA(1) to CA(j), and the sense amplifiers 222(1) to 222(j) are connected to the memory cell array 201 through the bit lines BLa(1) to BLa(j) and the bit lines BLb(1) to BLb(j).

Figure 7:
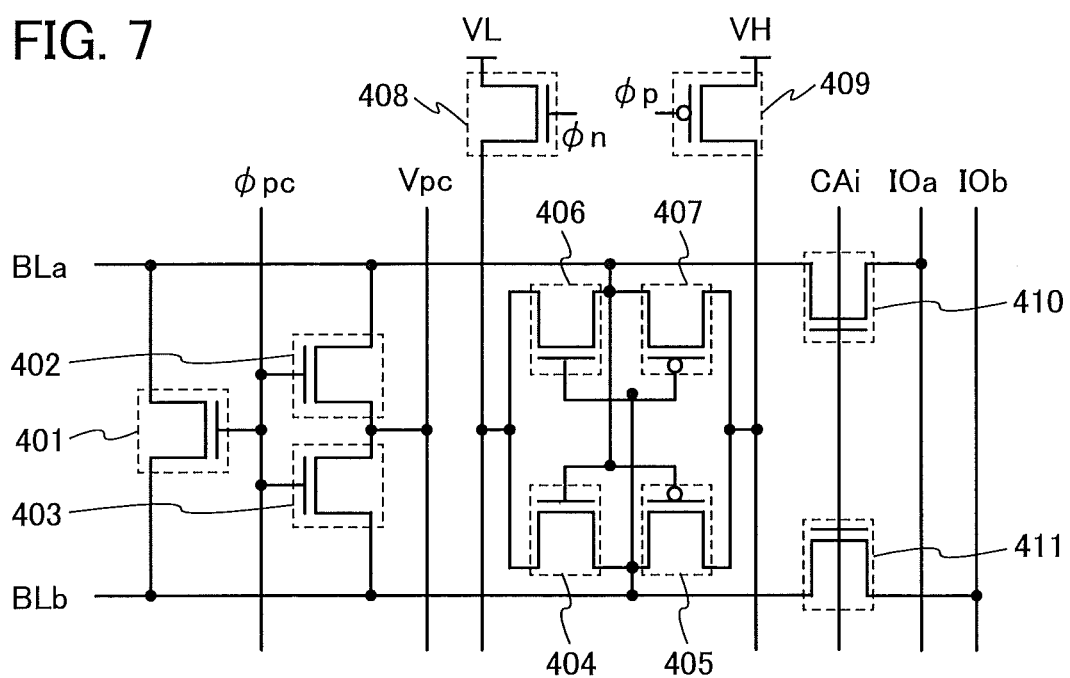
FIG. 7 is a circuit diagram of a semiconductor device.

FIG. 7 illustrates a circuit configuration of a sense amplifier which can be applied to the sense amplifier groups 216a and 216b.

In the sense amplifier illustrated in FIG. 7, a gate electrode of a transistor 401, a gate electrode of a transistor 402, and a gate electrode of a transistor 403 are connected to a signal line φpc. A source or drain electrode of the transistor 402 and a source or drain electrode of the transistor 403 are connected to a signal line Vpc. A gate electrode of a transistor 404, a gate electrode of a transistor 405, a source or drain electrode of a transistor 406, a source or drain electrode of a transistor 407, and a signal line BLa are connected. A gate electrode of the transistor 406, a gate electrode of the transistor 407, a source or drain electrode of the transistor 404, a source or drain electrode of the transistor 405, and a signal line BLb are connected. A source or drain electrode of the transistor 404, a source or drain electrode of the transistor 406, and a source or drain electrode of a transistor 408 are connected. A source or drain electrode of the transistor 405, a source or drain electrode of the transistor 407, and a source or drain electrode of a transistor 409 are connected. One of source and drain electrodes of a transistor 410 and the signal line BLa are connected. The other of the source and drain electrodes of the transistor 410 and a signal line IOa are connected. One of source and drain electrodes of a transistor 411 and the signal line BLb are connected. The other of the source and drain electrodes of the transistor 411 and a signal line IOb are connected. A gate electrode of the transistor 410, a gate electrode of the transistor 411, and a signal line CAi are connected.

In the sense amplifier illustrated in FIG. 7, the transistor 405, the transistor 407, and the transistor 409 are p-channel transistors, and the transistors 401 to 404, the transistor 406, the transistor 408, the transistor 410, and the transistor 411 are n-channel transistors.

Figure 8:
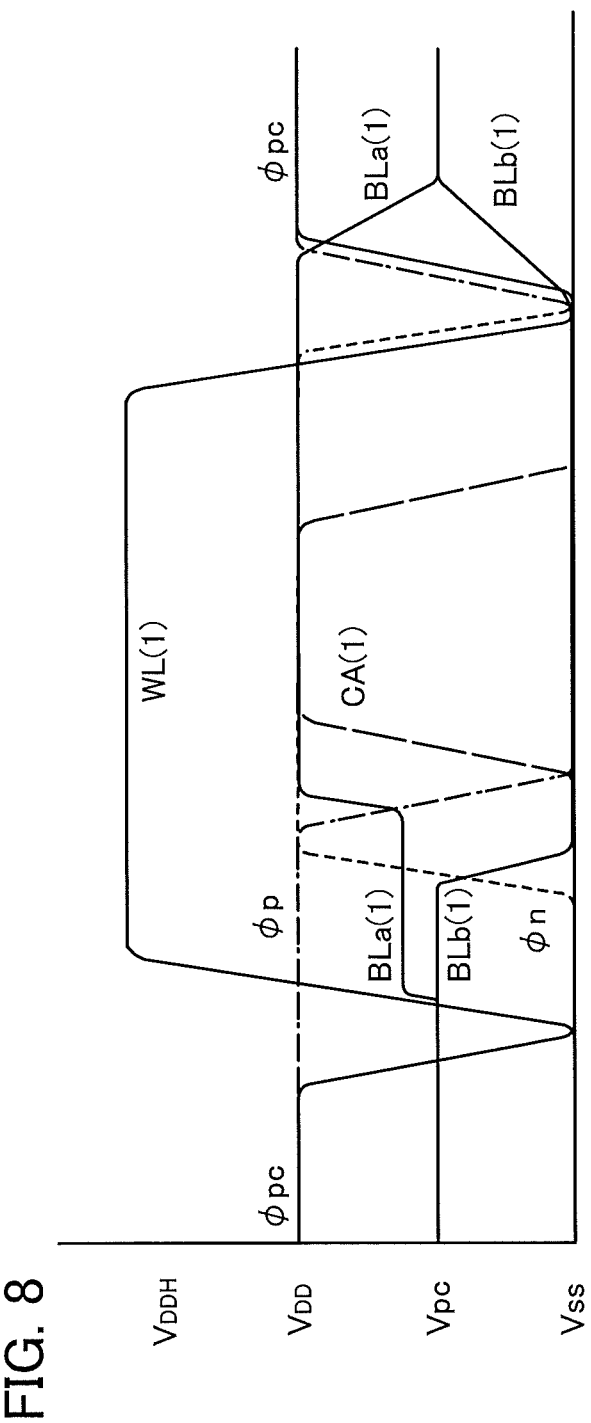
FIG. 8 is a timing chart.

Next, the cases where the memory cell array 201 is subjected to data writing, holding, and reading are described with reference to FIG. 6, FIG. 7, and FIG. 8. Note that it is assumed that a memory cell is in either of two states of holding a potential VDD and a potential VSS at a first terminal of a capacitor, and a state in which the potential VDD is held is data "1" and a state in which the potential VSS is held is data "0". Here, the case where data "1" is written to the memory cell 170(1,1) of the memory cell array 201 illustrated in FIG. 6 and the case where data "1" is read from the memory cell 170(1,1) are described.

In the case where data is written to the memory cell 170(1, 1) illustrated in FIG. 6, the signal line CA(1) in the first column which is a selected column is activated. Here, the signal line CA(1) is supplied with the potential VDD. As a result, the bit line BLa(1) and the bit line BLb(1) are electrically connected to the signal line IOa and the signal line IOb, respectively. In addition, the sense amplifier illustrated in FIG. 7 is activated by applying the potential VDD to a signal line φn and applying the potential VSS to a signal line φp. Furthermore, the potential VSS is applied to the signal line φpc. Here, a potential VH applied to a source or drain electrode of the transistor 409 is VDD, and a potential VL applied to a source or drain electrode of the transistor 408 is VSS.

Then, a read circuit, a write circuit, and a latch circuit group included in the fifth driver circuit 215 illustrated in FIG. 6 are supplied with potentials corresponding to data to be written to the signal line IOa and the signal line IOb. For example, when data "1" is written to the memory cell 170(1,1), the signal line IOa is supplied with VDD and the signal line IOb is supplied with VSS. As a result, the bit line BLa(1) is supplied with VDD and the bit line BLb(1) is supplied with VSS. Note that the potentials of the bit line BLa(1) and the bit line BLb(1) is held at VDD or VSS even when the signal line CA(1) is deactivated (here, supplied with the potential VSS) as long as the sense amplifier is activated.

Next, the word line WL(1) in the first row which is a selected row is activated, so that the transistor 162 of the memory cell 170(1,1) is turned on. Here, the word line WL(1) is supplied with a potential VDDH which is higher than the potential VDD. As a result, the first terminal of the capacitor 164 of the memory cell 170(1,1) is supplied with VDD. After that, the word line WL(1) is deactivated (here, supplied with the potential VSS), so that the transistor 162 of the memory cell 170(1,1) is turned off. In this manner, data "1" can be written to the memory cell 170(1,1). Furthermore, by turning off the transistor 162 of the memory cell 170(1,1), the potential of the first terminal of the capacitor 164 (or charge accumulated in the capacitor) is held.

Note that although the case of writing data "1" is described here, the case of writing data "0" is also similar.

Next, the case where data is read from the memory cell 170(1,1) is described with reference to a timing chart in FIG. 8.

In order to read data from the memory cell 170(1,1), the potential VDD is applied to the signal line φpc, the bit line BLa(1) and the bit line BLb(1) are precharged, and the potential Vpc is applied to the bit line BLa(1) and the bit line BLb(1). Here, the potential Vpc is VDD/2. Then, the potential VSS is applied to the signal line φpc, and thus, precharge is completed.

Next, the word line WL(1) in the first row which is a selected row is activated, so that the transistor 162 of the memory cell 170(1,1) is turned on. Here, the word line WL(1) is supplied with the potential VDDH which is higher than the potential VDD. As a result, charge is redistributed between the bit line BLa(1) and the capacitor 164 of the memory cell 170(1,1), and the potential of the bit line BLa(1) is slightly increased.

Next, the sense amplifier is activated. Here, by changing the potential applied to the signal line φn from VSS to VDD, the potential VL is applied to the n-channel transistor 408 included in the sense amplifier. As a result, the potential of the bit line BLa(1) is slightly higher than that of the bit line BLb(1), and therefore, the sense amplifier amplifies the difference and decreases the potential of the bit line BLb(1) to the potential VL. Subsequently, by changing the potential applied to the signal line φp from VDD to VSS, the potential VH is applied to the p-channel transistor 409 included in the sense amplifier. As a result, the potential of the bit line BLb(1) is equal to the potential VL which is lower than that of the bit line BLa(1), and therefore, the sense amplifier amplifies the difference and increases the potential of the bit line BLa(1) to the potential VH. As a result, the bit line BLa(1) is supplied with the potential VH and the bit line BLb(1) is supplied with the potential VL. Here, the potential VH applied to the source or drain electrode of the transistor 409 is VDD, and the potential VL applied to the source or drain electrode of the transistor 408 is VSS.

Next, the signal line CA(1) in the first column which is a selected column is activated. Here, the signal line CA(1) is supplied with the potential VDD. As a result, the bit line BLa(1) and the bit line BLb(1) are electrically connected to the signal line IOa and the signal line IOb, respectively, which are connected to the read circuit, the write circuit, and the latch circuit group of the fifth driver circuit 215. Thus, the potential of the bit line BLa(1) and the bit line BLb(1) is read.

In this manner, data is read from the memory cell 170(1,1).

After the data stored in the memory cell 170(1,1) is read out to the read circuit, the write circuit, and the latch circuit group, the signal line CA(1) is deactivated (here, supplied with the potential VSS), so that the bit line BLa(1) and the bit line BLb(1) are electrically disconnected from the signal line IOa and the signal line IOb. Then, the word line WL(1) is deactivated (here, supplied with the potential VSS), so that the transistor 162 of the memory cell 170(1,1) is turned off. At this time, data "1" is stored again in the memory cell 170(1,1). After that, the sense amplifier may be deactivated by changing the potential applied to the signal line φn from VDD to VSS and changing the potential applied to the signal line φp from VSS to VDD. The bit line BLa(1) and the bit line BLb(1) may be precharged by applying the potential VDD to the signal line φpc.

In the above manner, data "1" can be read from the memory cell 170(1,1).

Note that although the case of reading data "1" from the memory cell 170(1,1) is described here, a read operation in the case of reading data "0" is also similar. In that case, charge is redistributed between the bit line BLa(1) and the capacitor 164 of the memory cell 170(1,1), and the potential of the bit line BLa(1) is slightly decreased. The sense amplifier amplifies the difference, decreases the potential of the bit line BLa(1) to the potential VL, and increases the potential of the bit line BLb(1) to the potential VH.

Note that the number of bit lines BLa(j+1) to BLa(n) and bit lines BLb(j+1) to BLb(n) connected to the first driver circuit 211 and the memory cell array 201 illustrated in FIG. 2A and the number of bit lines BLa(1) to BLa(j) and bit lines BLb(1) to BLb(j) connected to the second driver circuit 212 and the memory cell array 201 are preferably substantially equal, but may be different. In other words, the area of the first driver circuit 211 and the area of the second driver circuit 212 are preferably substantially the same, but may be different. When the first driver circuit 211 and the second driver circuit 212 are substantially symmetrical with respect to the center point of the memory cell array 201, the above-described effect can be obtained. The same applies to the word lines WL(i+1) to WL(m) connected to the third driver circuit 213 and the memory cell array 201 and the word lines WL(1) to WL(i) connected to the fourth driver circuit 214 and the memory cell array 201.

Since the off-state current of the transistor 162 including an oxide semiconductor is extremely small, stored data can be held for an extremely long time owing to the transistor. In other words, refresh operation becomes unnecessary or the frequency of the refresh operation can be extremely lowered, which leads to a sufficient reduction in power consumption. Moreover, stored data can be held for a long period even when power is not supplied (note that the potential is preferably fixed).

Further, in the semiconductor device according to one embodiment of the present invention, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to one embodiment of the present invention does not have a limitation on the number of times data can be rewritten, which is a problem of a conventional nonvolatile memory, and the reliability thereof is drastically improved. Furthermore, since data is written by turning on or off the transistors, high-speed operation can be easily realized. Additionally, there is an advantage in that operation for erasing data is not needed.

Since a transistor including a material other than an oxide semiconductor can operate at sufficiently high speed, when this is combined with a transistor including an oxide semiconductor, a semiconductor device can perform operation (e.g., a data read operation) at sufficiently high speed. Further, a transistor including a material other than an oxide semiconductor can favorably realize the peripheral circuit 210 (including a logic circuit, a driver circuit, and the like) which needs to operate at high speed.

Furthermore, the first driver circuit 211 and the second driver circuit 212 are arranged so as to be symmetrical with respect to the center point 250 of the memory cell array 201.

The third driver circuit 213 and the fourth driver circuit 214 are arranged so as to be symmetrical with respect to the center point 250 of the memory cell array 201. At this time, the third driver circuit 213 and the fourth driver circuit 214 are arranged so as to be perpendicular to the first driver circuit 211 and the second driver circuit 212. Accordingly, a wasted region can be eliminated, and thus, the area of the peripheral circuit 210 can be decreased. Furthermore, the peripheral circuit 210 can be provided under the memory cell array 201, and thus, the size of the semiconductor device can be decreased. Moreover, a wasted region can be eliminated by making the area of the memory cell array 201 substantially equal to the area of the peripheral circuit 210. Thus, the area and size of the semiconductor device can be decreased.

A semiconductor device having a novel feature can be realized by being provided with both a peripheral circuit such as a driver circuit including a transistor including a material other than an oxide semiconductor (in other words, a transistor capable of operating at sufficiently high speed) and a memory circuit including a transistor including an oxide semiconductor (in a broader sense, a transistor whose off-state current is sufficiently small).

This embodiment can be implemented in an appropriate combination with the configurations described in the other embodiments.

Embodiment 2

In this embodiment, a structure and a manufacturing method of a semiconductor device according to one embodiment of the present invention will be described with reference to FIG. 9, FIGS. 10A and 10B, FIGS. 11A and 11B, FIGS. 12A to 12D, FIGS. 13A to 13E, and FIGS. 14A to 14D.

<Cross-Sectional Structure of Semiconductor Device>

Figure 9:
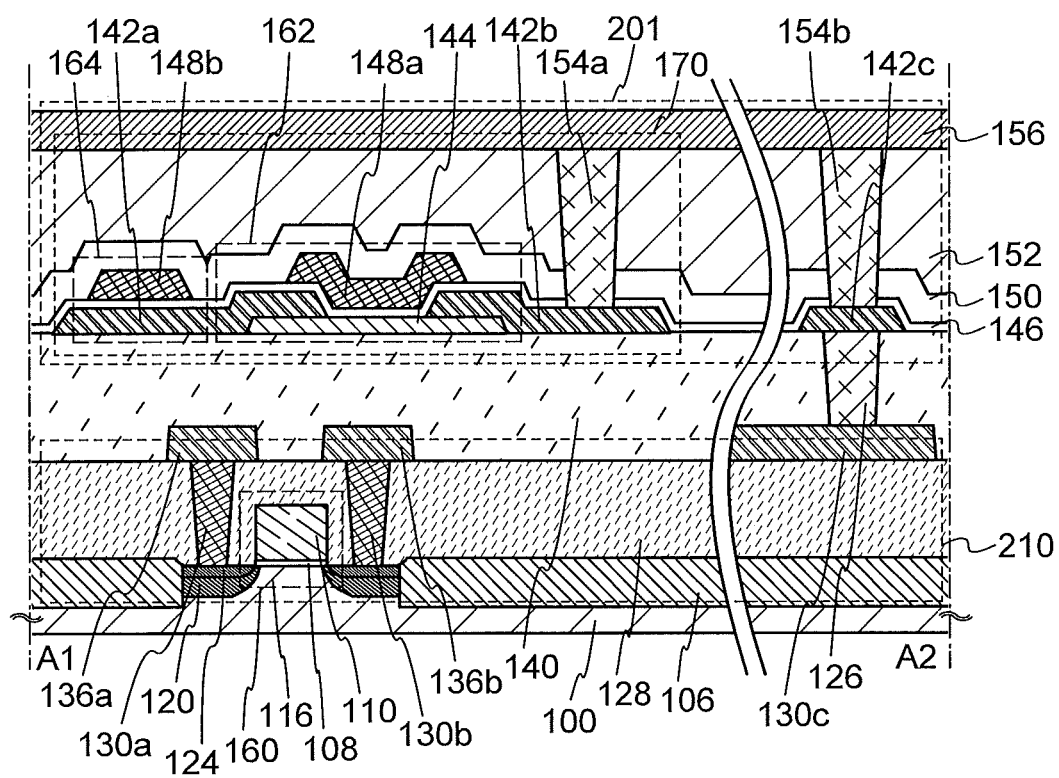
FIG. 9 is a cross-sectional view of a semiconductor device.

FIG. 9 is a cross-sectional view of a semiconductor device. In FIG. 9, A1-A2 is a cross section perpendicular to the channel length direction of a transistor. The semiconductor device illustrated in FIG. 9 includes a memory cell array 201 in an upper portion and a peripheral circuit 210 in a lower portion. The memory cell array 201 in the upper portion includes a transistor 162 including an oxide semiconductor, and the peripheral circuit 210 in the lower portion includes a transistor 160 including a semiconductor material other than an oxide semiconductor. Note that Embodiment 1 can be referred to for details of the memory cell array 201 provided in the upper portion of the semiconductor device and the peripheral circuit 210.

Either an n-channel transistor or a p-channel transistor can be used as the transistor 160 and the transistor 162. Here, both the transistor 160 and the transistor 162 are n-channel transistors in the following description. The technical feature of one embodiment of the present invention is to use a semiconductor material with which off-state current can be sufficiently decreased, such as an oxide semiconductor, in the transistor 162 so that data can be held. Therefore, it is not necessary to limit a specific structure of the semiconductor device, such as a material of the semiconductor device or a structure of the semiconductor device, to the structure described here.

The transistor 160 includes a channel formation region 116 provided in a substrate 100 including a semiconductor material (such as silicon); impurity regions 120 provided such that the channel formation region 116 is sandwiched therebetween; metal compound regions 124 in contact with the impurity regions 120; a gate insulating layer 108 provided over the channel formation region 116; a gate electrode 110 provided over the gate insulating layer 108; and a source or drain electrode 130a and a source or drain electrode 130b electrically connected to the metal compound regions 124. In addition, an insulating layer 128 is provided so as to cover the transistor 160. The source or drain electrode 130a and the source or drain electrode 130b are electrically connected to the metal compound regions 124 through openings formed in the insulating layer 128. Over the insulating layer 128, an electrode 136a is formed in contact with the source or drain electrode 130a, and an electrode 136b is formed in contact with the source or drain electrode 130b.

Further, an element isolation insulating layer 106 is formed over the substrate 100 so as to surround the transistor 160, and the insulating layer 128 is formed over the transistor 160. Note that in order to realize higher integration, the transistor 160 preferably has a structure without a sidewall insulating layer as illustrated in FIG. 9. On the other hand, in the case where characteristics of the transistor 160 have priority, a sidewall insulating layer may be provided on a side surface of the gate electrode 110, and the impurity regions 120 may include a region having a different impurity concentration in a region overlapping with the sidewall insulating layer.

The transistor 162 includes an oxide semiconductor layer 144 provided over the insulating layer 128 and the like; a source or drain electrode 142a and a source or drain electrode 142b which are electrically connected to the oxide semiconductor layer 144; a gate insulating layer 146 covering the oxide semiconductor layer 144, the source or drain electrode 142a, and the source or drain electrode 142b; and a gate electrode 148a provided over the gate insulating layer 146 so as to overlap with the oxide semiconductor layer 144.

Here, an oxide semiconductor layer used for a transistor, such as the oxide semiconductor layer 144, is preferably an oxide semiconductor layer which is purified by sufficiently removing an impurity such as hydrogen therefrom or by sufficiently supplying oxygen thereto. Specifically, the hydrogen concentration of the oxide semiconductor layer is $5 \times 10^{19}$ atoms/cm$^3$ or less, preferably $5 \times 10^{18}$ atoms/cm$^3$ or less, more preferably $5 \times 10^{17}$ atoms/cm$^3$ or less, for example. Note that the above hydrogen concentration of the oxide semiconductor layer is measured by secondary ion mass spectrometry (SIMS). The concentration of carriers of the oxide semiconductor layer, in which hydrogen is reduced to a sufficiently low concentration so that the oxide semiconductor layer is purified and in which defect states in an energy gap due to oxygen deficiency are reduced by sufficiently supplying oxygen as described above, is less than $1 \times 10^{12}$/cm$^3$, preferably less than $1 \times 10^{11}$/cm$^3$, more preferably less than $1.45 \times 10^{10}$/cm$^3$. For example, the off-state current (per unit channel width (1 μm), here) at room temperature (25° C.) is 100 zA (1 zA (zeptoampere) is $1 \times 10^{-21}$ A) or less, preferably 10 zA or less. In this manner, by using an i-type (intrinsic) or substantially i-type oxide semiconductor, a transistor (the transistor 162) which has extremely favorable off-state current characteristics can be obtained.

Although the oxide semiconductor layer processed in an island shape is used for the transistor 162 in order to suppress leakage among elements due to miniaturization, an oxide semiconductor layer not processed in an island shape may be used. When an oxide semiconductor layer is not processed in an island shape, the oxide semiconductor layer can be prevented from being contaminated by etching during processing.

A capacitor 164 includes the source or drain electrode 142a, the gate insulating layer 146, and a conductive layer 148b. That is, the source or drain electrode 142a functions as one electrode of the capacitor 164, and the conductive layer 148b functions as the other electrode of the capacitor 164.

With such a structure, capacitance can be sufficiently secured. When the oxide semiconductor layer 144 and the gate insulating layer 146 are stacked, insulation between the source or drain electrode 142a and the conductive layer 148b can be sufficiently secured. Furthermore, in the case where no capacitor is needed, a structure in which the capacitor 164 is not provided is also possible.

Note that in the transistor 162 and the capacitor 164, the source or drain electrode 142a and the source or drain electrode 142b preferably have tapered end portions. When the source or drain electrode 142a and the source or drain electrode 142b have tapered end portions, coverage of the source or drain electrode 142a and the source or drain electrode 142b with the gate insulating layer 146 can be improved and disconnection of the gate insulating layer 146 can be prevented. Here, the taper angle is in the range of 30° to 60°, for example. Note that the "taper angle" means an angle formed by the side surface and the bottom surface of a layer having a tapered shape (for example, the source or drain electrode 142a) when observed from a direction perpendicular to a cross section thereof (a plane perpendicular to the substrate surface).

An insulating layer 150 and an insulating layer 152 are provided over the transistor 162 and the capacitor 164. Then, electrodes 154a and 154b are provided in openings formed in the gate insulating layer 146, the insulating layer 150, the insulating layer 152, and the like, and a wiring 156 is formed over the insulating layer 152 so as to be connected to the electrodes 154a and 154b. The wiring 156 electrically connects one memory cell to another memory cell. The wiring 156 is also connected to an electrode 130c through the electrode 154b, an electrode 142c, and an electrode 126. Accordingly, the peripheral circuit 210 in the lower portion can be connected to the memory cell array 201 in the upper portion. Although FIG. 9 illustrates the case where the electrode 142c is electrically connected to the electrode 130c through the electrode 126, an opening may be formed in an insulating layer 140 and the electrode 142c and the electrode 130c may be in direct contact with each other.

In the semiconductor device illustrated in FIG. 9, the insulating layer 140 is provided between the memory cell array 201 in the upper portion and the peripheral circuit 210 in the lower portion.

The transistor 160 includes a semiconductor material other than an oxide semiconductor. The semiconductor material other than an oxide semiconductor may be, for example, silicon, germanium, silicon germanium, silicon carbide, gallium arsenide, or the like and is preferably a single crystal semiconductor. Alternatively, an organic semiconductor material or the like may be used. A transistor including such a semiconductor material can operate at sufficiently high speed. Therefore, a transistor including a material other than an oxide semiconductor can favorably realize a variety of circuits (e.g., a logic circuit or a driver circuit) which needs to operate at high speed.

On the other hand, the transistor 162 includes an oxide semiconductor material. A transistor including an oxide semiconductor material disclosed in this specification and the like can realize an extremely small off-state current. Owing to this feature, the memory cell 170 can hold stored data for an extremely long time. In other words, refresh operation becomes unnecessary or the frequency of the refresh operation can be extremely lowered, which leads to a sufficient reduction in power consumption. Moreover, stored data can be held for a long period even when power is not supplied (note that the potential is preferably fixed).

Further, the memory cell 170 does not require high voltage for writing data and does not have the problem of deterioration of elements. For example, unlike a conventional nonvolatile memory, it is not necessary to inject and extract electrons into and from a floating gate, and thus a problem such as deterioration of a gate insulating layer does not arise at all. That is, the memory cell 170 does not have a limitation on the number of times data can be rewritten, which is a problem of a conventional nonvolatile memory, and the reliability thereof is drastically improved. Furthermore, since data is written by turning on or off the transistor 162, high-speed operation can be easily realized. Additionally, there is an advantage in that operation for erasing data is not needed.

A semiconductor device having a novel feature can be realized by being provided with both a peripheral circuit such as a driver circuit including a transistor including a material other than an oxide semiconductor (in other words, a transistor capable of operating at sufficiently high speed) and a memory circuit including a transistor including an oxide semiconductor (in a broader sense, a transistor whose off-state current is sufficiently small).

Although FIG. 9 illustrates the example in which one layer of the memory cell array 201 is stacked over the peripheral circuit 210, one embodiment of the present invention is not limited to this example. Two or more memory cell array layers may be stacked. The second memory cell array layer is provided over the memory cell array 201 which is the first layer. The same applies to the third and following memory cell array layers. A structure similar to that of the memory cell array 201 which is the first layer can be used for the second and following memory cell array layers. Alternatively, a structure different from that of the memory cell array 201 which is the first layer can be used for the second and following memory cell array layers. With such a stacked structure, a still higher degree of integration of the semiconductor device can be achieved.

A driver circuit and a control circuit included in the peripheral circuit 210 illustrated in FIG. 9 are arranged as illustrated in FIG. 1 and FIGS. 2A and 2B. Accordingly, the area and size of the semiconductor device can be decreased.

<Cross-Sectional Structure and Planar Structure of Semiconductor Device>

Figure 10A:
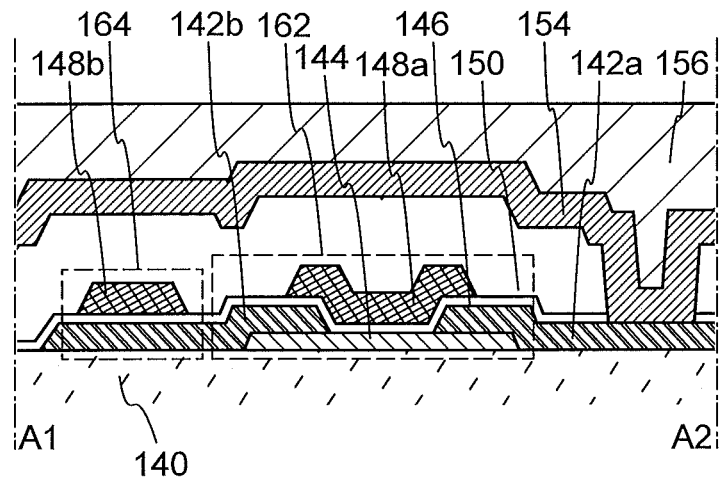
FIGS. 10A and 10B are a cross-sectional view and a plan view of a semiconductor device.
Figure 10B:
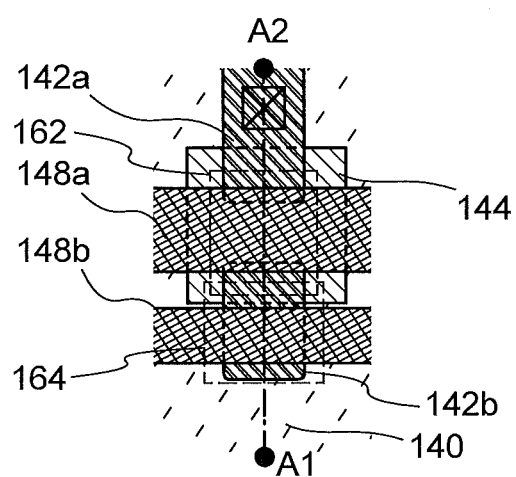

FIGS. 10A and 10B illustrate an example of a structure of the semiconductor device. FIG. 10A is a cross-sectional view of the semiconductor device, and FIG. 10B is a plan view of the semiconductor device. Here, FIG. 10A corresponds to a cross section along line A1-A2 in FIG. 10B. The semiconductor device illustrated in FIGS. 10A and 10B includes the transistor 162 including an oxide semiconductor. The transistor 162 including an oxide semiconductor can hold charge for a long time owing to its characteristics. Note that the semiconductor device illustrated in FIGS. 10A and 10B corresponds to the circuit diagram of the semiconductor device illustrated in FIG. 5.

The transistor 162 illustrated in FIGS. 10A and 10B includes an oxide semiconductor layer 144 provided over an insulating layer 140 and the like; a source or drain electrode 142a and a source or drain electrode 142b which are electrically connected to the oxide semiconductor layer 144; a gate insulating layer 146 covering the oxide semiconductor layer 144, the source or drain electrode 142a, and the source or drain electrode 142b; and a gate electrode 148a provided over the gate insulating layer 146 so as to overlap with the oxide semiconductor layer 144.

Here, the oxide semiconductor layer 144 is preferably an oxide semiconductor layer which is purified by sufficiently removing an impurity such as hydrogen therefrom and by sufficiently supplying oxygen thereto. Specifically, the hydrogen concentration of the oxide semiconductor layer 144 is $5\times10^{19}$ atoms/cm$^3$ or less, preferably $5\times10^{18}$ atoms/cm$^3$ or less, more preferably $5\times10^{17}$ atoms/cm$^3$ or less, for example. Note that the above hydrogen concentration of the oxide semiconductor layer 144 is measured by secondary ion mass spectrometry (SIMS). The concentration of carriers of the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is less than $1\times10^{12}/$cm$^3$, preferably less than $1\times10^{11}$/cm$^3$, more preferably less than $1.45\times10^{10}$/cm$^3$. For example, the off-state current (per unit channel width (1 μm), here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor, the transistor 162 which has extremely favorable off-state current characteristics can be obtained.

It is preferable that the concentration of an alkali metal or an alkaline earth metal be sufficiently decreased in the oxide semiconductor layer 144. The concentration of an alkali metal or an alkaline earth metal is decreased to such a degree that, for example, the concentration of Na is $5\times10^{16}$ cm$^{-3}$ or less, preferably $1\times10^{16}$ cm$^{-3}$ or less, more preferably $1\times10^{15}$ cm$^{-3}$ or less, the concentration of Li is $5\times10^{15}$ cm$^{-3}$ or less, preferably $1\times10^{15}$ cm$^{-3}$ or less, and the concentration of K is $5\times10^{15}$ cm$^{-3}$ or less, preferably $1\times10^{15}$ cm$^{-3}$ or less when measured through an SIMS analysis.

It has been pointed out that an oxide semiconductor is insensitive to impurities, there is no problem even when a considerable amount of metal impurities is contained in the film, and therefore, soda-lime glass which contains a large amount of alkali metal such as sodium and which is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. An alkali metal and an alkaline earth metal are unfavorable impurities for the oxide semiconductor and are preferably contained as little as possible. When an insulating film in contact with the oxide semiconductor is an oxide, an alkali metal, in particular, Na diffuses into the oxide and becomes Na$^+$. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to be within the above range in the case where the hydrogen concentration in the oxide semiconductor is lower than or equal to $5\times10^{19}$ cm$^{-3}$, particularly lower than or equal to $5\times10^{18}$ cm$^{-3}$.

Although the oxide semiconductor layer 144 processed in an island shape is used in the transistor 162 of FIGS. 10A and 10B in order to suppress leakage among elements due to miniaturization, an oxide semiconductor layer not processed in an island shape may be used. In the case where the oxide semiconductor layer is not processed to have an island shape, contamination of the oxide semiconductor layer 144 due to etching in the processing can be prevented.

A capacitor 164 in FIGS. 10A and 10B includes the source or drain electrode 142b, the gate insulating layer 146, and a conductive layer 148b. That is, the source or drain electrode 142b functions as one electrode of the capacitor 164, and the conductive layer 148b functions as the other electrode of the capacitor 164. With such a structure, capacitance can be sufficiently secured. When the oxide semiconductor layer 144 and the gate insulating layer 146 are stacked, insulation between the source or drain electrode 142b and the conductive layer 148b can be sufficiently secured. Furthermore, in the case where no capacitor is needed, a structure in which no capacitor is provided is also possible.

FIGS. 11A and 11B and FIGS. 12A to 12D each illustrate an example of a structure of a transistor which is different from that in FIGS. 10A and 10B.

Figure 11A:
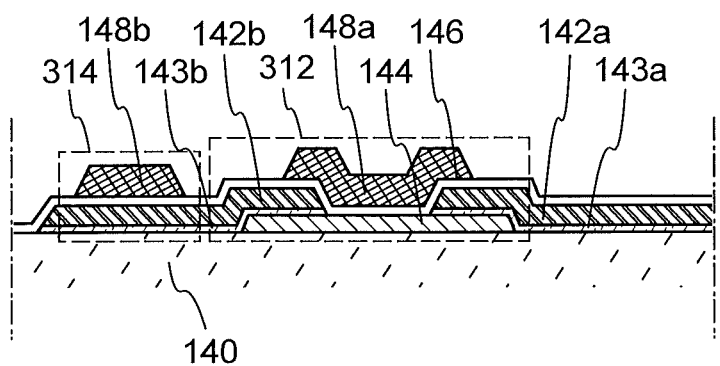
FIGS. 11A and 11B are each a cross-sectional view of a semiconductor device.

In a transistor 312 illustrated in FIG. 11A, oxide conductive layers 143a and 143b serving as source and drain regions are provided between the oxide semiconductor layer 144 and the source and drain electrodes 142a and 142b. By providing the oxide conductive layers 143a and 143b serving as source and drain regions between the oxide semiconductor layer 144 and the source and drain electrodes 142a and 142b, the resistance of the source and drain regions can be decreased and the transistor 312 can be made to operate at high speed. By stacking the oxide semiconductor layer 144, the oxide conductive layers, and the source and drain electrodes, the withstand voltage of the transistor 312 can be increased. A capacitor 314 includes the oxide conductive layer 143b, the source or drain electrode 142b, the gate insulating layer 146, and the conductive layer 148b.

Figure 11B:
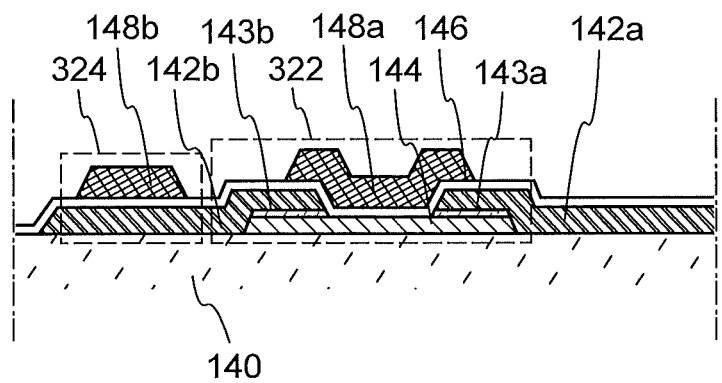

A transistor 322 illustrated in FIG. 11B is similar to the transistor 312 in FIG. 11A in that the oxide conductive layers 143a and 143b serving as source and drain regions are provided between the oxide semiconductor layer 144 and the source and drain electrodes 142a and 142b. In the transistor 312 illustrated in FIG. 11A, the oxide conductive layers 143a and 143b are in contact with the upper and side surfaces of the oxide semiconductor layer 144. On the other hand, in the transistor 322 illustrated in FIG. 11B, the oxide conductive layers 143a and 143b are in contact with the upper surface of the oxide semiconductor layer 144. Even in the case of such a structure, the resistance of the source and drain regions can be decreased and the transistor 322 can be made to operate at high speed. By stacking the oxide semiconductor layer 144, the oxide conductive layers, and the source and drain electrodes, the withstand voltage of the transistor 322 can be increased. The description of FIGS. 10A and 10B can be referred to for the structure of a capacitor 324.

Figure 12A:
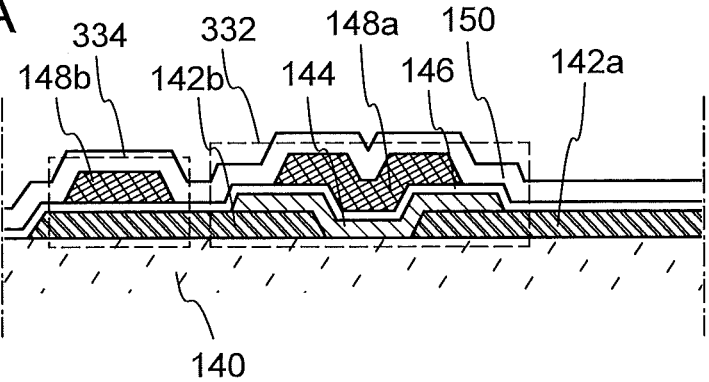
FIGS. 12A to 12D are each a cross-sectional view of a semiconductor device.

A transistor 332 illustrated in FIG. 12A is similar to the transistor 162 illustrated in FIGS. 10A and 10B in that the source and drain electrodes 142a and 142b, the oxide semiconductor layer 144, the gate insulating layer 146, and the gate electrode 148a are provided over the insulating layer 140. A difference between the transistor 332 illustrated in FIG. 12A and the transistor 162 illustrated FIGS. 10A and 10B is the position of connection between the oxide semiconductor layer 144 and the source and drain electrodes 142a and 142b. In other words, in the transistor 162, at least part of the upper surface of the oxide semiconductor layer 144 is in contact with the source and drain electrodes 142a and 142b as a result of forming the source and drain electrodes 142a and 142b after forming the oxide semiconductor layer 144. On the other hand, in the transistor 332, part of the upper surfaces of the source and drain electrodes 142a and 142b is in contact with the oxide semiconductor layer 144. The description of FIGS. 10A and 10B can be referred to for the structure of a capacitor 334.

Figure 12B:
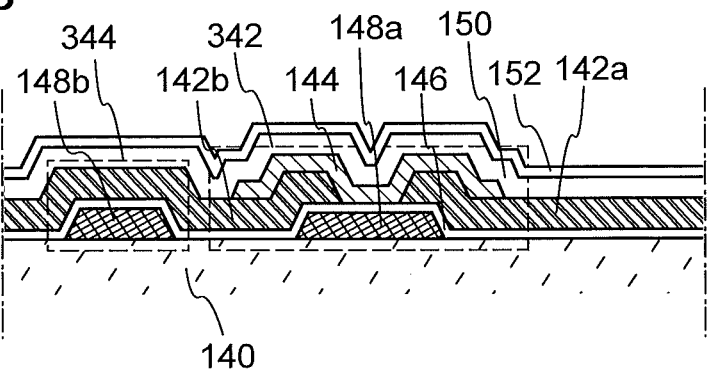
Figure 12C:
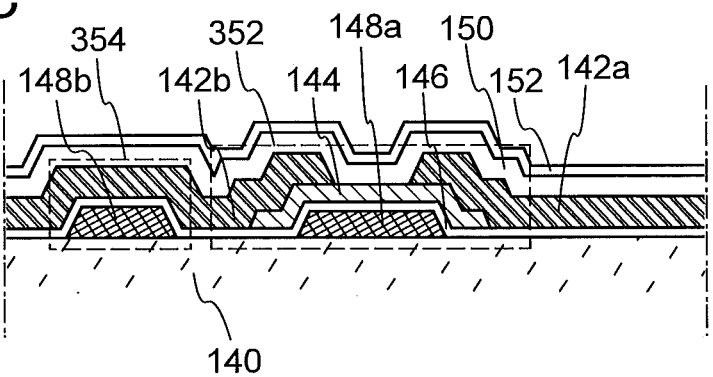

Although FIGS. 10A and 10B, FIGS. 11A and 11B, and FIG. 12A illustrate top-gate transistors, bottom-gate transistors may be used. FIGS. 12B and 12C illustrate bottom-gate transistors.

In a transistor 342 illustrated in FIG. 12B, the gate electrode 148a is provided over the insulating layer 140; the gate insulating layer 146 is provided over the gate electrode 148a; the source and drain electrodes 142a and 142b are provided over the gate insulating layer 146; and the oxide semiconductor layer 144 is provided over the gate insulating layer 146 and the source and drain electrodes 142a and 142b so as to overlap with the gate electrode 148a. A capacitor 344 includes the conductive layer 148b, the gate insulating layer 146, and the source or drain electrode 142b which are provided over the insulating layer 140.

An insulating layer 150 and an insulating layer 152 may be provided over the transistor 342 and the capacitor 344.

A transistor 352 illustrated in FIG. 12C is similar to the transistor 342 illustrated in FIG. 12B in that the gate electrode 148a, the gate insulating layer 146, the source and drain electrodes 142a and 142b, and the oxide semiconductor layer 144 are provided over the insulating layer 140. A difference between the transistor 352 illustrated in FIG. 12C and the transistor 342 illustrated FIG. 12B is the position of contact between the oxide semiconductor layer 144 and the source and drain electrodes 142a and 142b. In other words, in the transistor 342, at least part of the lower surface of the oxide semiconductor layer 144 is in contact with the source and drain electrodes 142a and 142b as a result of forming the oxide semiconductor layer 144 after forming the source and drain electrodes 142a and 142b. On the other hand, in the transistor 352, part of the lower surfaces of the source and drain electrodes 142a and 142b is in contact with the oxide semiconductor layer 144. The description of FIG. 12B can be referred to for the structure of a capacitor 354.

Figure 12D:
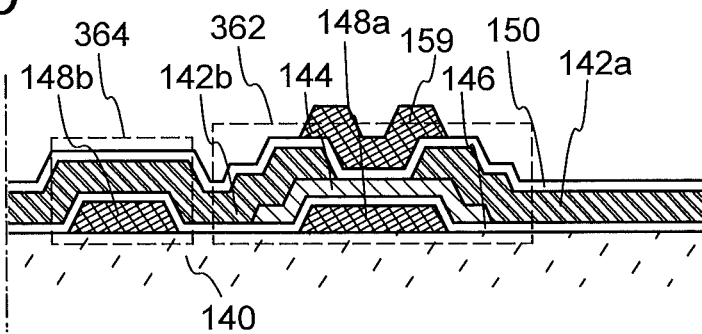

Moreover, a transistor may have a dual-gate structure including two gate electrodes positioned above and below a channel forming region with gate insulating layers interposed therebetween. FIG. 12D illustrates a dual-gate transistor.

A transistor 362 illustrated in FIG. 12D is similar to the transistor 342 illustrated in FIG. 12B in that the gate electrode 148a, the gate insulating layer 146, the source and drain electrodes 142a and 142b, and the oxide semiconductor layer 144 are provided over the insulating layer 140. In FIG. 12D, additionally, the insulating layer 150 is provided so as to cover the source and drain electrodes 142a and 142b and the oxide semiconductor layer 144, and a conductive layer 159 is provided over the insulating layer 150 so as to overlap with the oxide semiconductor layer 144. The insulating layer 150 functions as a second gate insulating layer, and the conductive layer 159 functions as a second gate electrode. With such a structure, in a bias-temperature stress test (hereinafter referred to as a BT test) for examining reliability of transistors, the amount of change in threshold voltage of the transistor through the BT test can be reduced. The potential of the conductive layer 159 may be the same as or different from that of the gate electrode 148a. The potential of the conductive layer 159 may be GND or 0 V, or the conductive layer 159 may be in a floating state.

<Method for Manufacturing Semiconductor Device>

Next, a method for manufacturing the transistor 162 will be described with reference to FIGS. 13A to 13E.

Figure 13A:
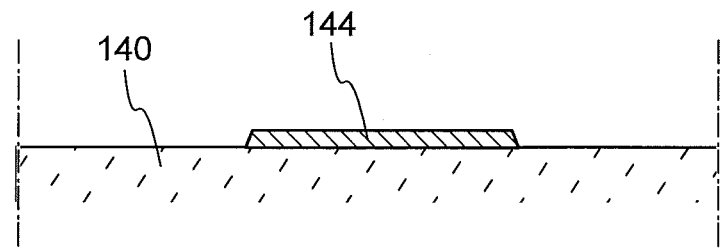
FIGS. 13A to 13E are cross-sectional views illustrating a manufacturing process of a semiconductor device.

First, the oxide semiconductor layer 144 is formed by forming an oxide semiconductor layer over the insulating layer 140 and then by processing the oxide semiconductor layer (see FIG. 13A).

The insulating layer 140 is formed using a material including an inorganic insulating material such as silicon oxide, silicon oxynitride, silicon nitride oxide, silicon nitride, or aluminum oxide. It is preferable to use a low dielectric constant (low-k) material for the insulating layer 140 because capacitance due to overlap of electrodes or wirings can be sufficiently reduced. Note that a porous insulating layer with any of the above materials may be employed as the insulating layer 140. A porous insulating layer has a lower dielectric constant than an insulating layer with high density, and thus allows a further reduction in capacitance generated by electrodes or wirings. Alternatively, the insulating layer 140 can be formed using an organic insulating material such as polyimide or acrylic. The insulating layer 140 can be formed to have a single-layer structure or a stacked-layer structure using the above-described material. In this embodiment, the case of using silicon oxide for the insulating layer 140 is described.

A material used for the oxide semiconductor layer preferably contains at least indium (In) or zinc (Zn). It is particularly preferable that In and Zn are contained. As a stabilizer for reducing change in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids which include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn—based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In:Ga:Zn. Further, a metal element in addition to In, Ga, and Zn may be contained.

The oxide semiconductor layer can be a thin film using a material represented by the chemical formula, $InMO_3(ZnO)_m$ (m>0, where in is not an integer). Here, M represents one or more metal elements selected from Ga, Al, Fe, Mn, and Co. For example, M may be Ga, Ga and Al, Ga and Mn, Ga and Co, or the like. Alternatively, a material represented by $In_3SnO_5(ZnO)_n$ (n>0, where n is an integer) may be used as an oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/

3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding centerline average roughness that is defined by JIS B 0601 so as to be able to be applied to a surface. $R_a$ can be expressed as an "average value of the absolute values of deviations from a reference surface to a specific surface" and is defined by the following formula (1).

[Formula 1]

$$R_a = \frac{1}{S_0} \int_{y_1}^{y_2} \int_{x_1}^{x_2} |f(x, y) - Z_0| dx dy \quad (1)$$

Note that, in the above formula, $S_0$ represents the area of a measurement surface (a rectangular region which is defined by four points represented by the coordinates $(x_1,y_1)$, $(x_1,y_2)$, $(x_2,y_1)$, and $(x_2,y_2)$), and $Z_0$ represents average height of a measurement surface. $R_a$ can be measured using an atomic force microscope (AFM).

The thickness of the oxide semiconductor layer is preferably greater than or equal to 3 nm and less than or equal to 30 nm. This is because the transistor might be normally on when the oxide semiconductor layer is too thick (e.g., when the thickness is greater than or equal to 50 nm).

The oxide semiconductor layer is preferably formed by a method in which impurities such as hydrogen, water, a hydroxyl group, or hydride do not enter the oxide semiconductor layer. For example, the oxide semiconductor layer can be formed by a sputtering method or the like.

In this embodiment, the oxide semiconductor layer is formed by a sputtering method with the use of an In—Ga—Zn—O-based target.

As an In—Ga—Zn—O-based target, for example, a target having a composition ratio of $In_2O_3:Ga_2O_3:ZnO=1:1:1$ [molar ratio] can be used. Note that it is not necessary to limit the material and the composition ratio of the target to the above. For example, a target having a composition ratio of $In_2O_3:Ga_2O_3:ZnO=1:1:2$ [molar ratio] can be used.

In the case where an In—Zn—O-based material is used as an oxide semiconductor, a target therefor has a composition ratio of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=15:1 to 1.5:1 in an atomic ratio ($In_2O_3:ZnO=15:2$ to 3:4 in a molar ratio). For example, in a target used for formation of an In—Zn-based oxide semiconductor which has an atomic ratio of In:Zn:O=1:1:X, the relation of X>1, preferably X>1.5, is satisfied.

Further, an In—Sn—Zn-based oxide can be referred to as ITZO. In the case of using ITZO as the oxide semiconductor, a target which has an atomic ratio of In:Sn:Zn of 1:2:2, 2:1:3, 1:1:1, 20:45:35, or the like is used.

The relative density of the target is greater than or equal to 90% and less than or equal to 100%, preferably greater than or equal to 95% and less than or equal to 99.9%. This is because, with the use of the metal oxide target with a high relative density, a dense oxide semiconductor layer can be formed.

A film formation atmosphere may be a rare gas (typically, argon) atmosphere, an oxygen atmosphere, or a mixed atmosphere containing a rare gas and oxygen. An atmosphere of a high-purity gas from which impurities such as hydrogen, water, a hydroxyl group, or hydride are sufficiently removed is preferable, in order to prevent hydrogen, water, a hydroxyl group, hydride, or the like from entering the oxide semiconductor layer.

For example, the oxide semiconductor layer can be formed as follows.

First, the substrate is held in a film formation chamber which is kept under reduced pressure, and is then heated so that the substrate temperature reaches a temperature higher than 200° C. and lower than or equal to 500° C., preferably higher than 300° C. and lower than or equal to 500° C., more preferably higher than or equal to 350° C. and lower than or equal to 450° C.

Then, a high-purity gas from which impurities such as hydrogen, water, a hydroxyl group, or hydride are sufficiently removed is introduced into the film formation chamber from which remaining moisture is being removed, and the oxide semiconductor layer is formed over the substrate with the use of the target. To remove moisture remaining in the film formation chamber, an entrapment vacuum pump such as a cryopump, an ion pump, or a titanium sublimation pump is desirably used as an evacuation unit. Further, an evacuation unit may be a turbo pump provided with a cold trap. In the film formation chamber which is evacuated with a cryopump, for example, impurities such as hydrogen, water, a hydroxyl group, or hydride (preferably, also a compound containing a carbon atom) are removed, whereby the concentration of impurities such as hydrogen, water, a hydroxyl group, or hydride in the oxide semiconductor layer formed in the film formation chamber can be reduced.

In the case where the substrate temperature is low (for example, less than or equal to 100° C.) during film formation, a substance containing a hydrogen atom may enter the oxide semiconductor; thus, it is preferable that the substrate be heated at a temperature in the above range. When the oxide semiconductor layer is formed with the substrate heated at the temperature described above, since the substrate temperature is high, hydrogen bonds are cut by heat and a substance containing a hydrogen atom is less likely to be taken into the oxide semiconductor layer. Therefore, when the oxide semiconductor layer is formed with the substrate heated at the temperature described above, the concentration of impurities such as hydrogen, water, a hydroxyl group, or hydride in the oxide semiconductor layer can be sufficiently reduced. Moreover, damage due to sputtering can be reduced.

As an example of film formation conditions, the following conditions are employed: the distance between the substrate and the target is 60 mm; the pressure is 0.4 Pa; the direct-current (DC) power is 0.5 kW; the substrate temperature is 400° C.; and the film formation atmosphere is an oxygen atmosphere (the proportion of the oxygen flow rate is 100%). Note that a pulse direct-current power source is preferable because powder substances (also referred to as particles or dust) generated in film formation can be reduced and the film thickness can be uniform.

Note that before the oxide semiconductor layer is formed by a sputtering method, powder substances (also referred to as particles or dust) attached to a formation surface of the oxide semiconductor layer are preferably removed by reverse sputtering in which an argon gas is introduced and plasma is generated. The reverse sputtering refers to a method in which voltage is applied to a substrate to generate plasma in the vicinity of the substrate to modify a surface on the substrate side. Note that instead of argon, a gas of nitrogen, helium, oxygen, or the like may be used.

The oxide semiconductor layer 144 is formed by processing an oxide semiconductor layer. The oxide semiconductor layer can be processed by forming a mask having a desired shape over the oxide semiconductor layer and by etching the oxide semiconductor layer. The mask may be formed by a method such as photolithography. Alternatively, a method such as an inkjet method may be used to form the mask. For the etching of the oxide semiconductor layer, either wet etching or dry etching may be employed. It is needless to say that both of them may be employed in combination.

After that, heat treatment (first heat treatment) may be performed on the oxide semiconductor layer 144. The heat treatment further removes the substance including a hydrogen atom from the oxide semiconductor layer 144; thus, the structure of the oxide semiconductor layer 144 can be ordered and defect states in the energy gap can be reduced. The heat treatment is performed in an inert gas atmosphere at a temperature higher than or equal to 250° C. and lower than or equal to 700° C., preferably higher than or equal to 450° C. and lower than or equal to 600° C., or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

For example, after an object to be processed is introduced into an electric furnace including a resistance heater or the like, the heat treatment can be performed at 450° C. for one hour in a nitrogen atmosphere. The oxide semiconductor layer 144 is not exposed to the air during the heat treatment so that entry of water or hydrogen can be prevented.

A transistor with extremely excellent characteristics can be realized with the use of the oxide semiconductor layer which is an i-type (intrinsic) or substantially i-type oxide semiconductor layer obtained by reducing an impurity through the heat treatment.

The above heat treatment can also be referred to as dehydration treatment, dehydrogenation treatment, or the like because it has the effect of removing hydrogen, water, or the like. The heat treatment can be performed, for example, before the oxide semiconductor layer is processed into an island shape or after the gate insulating layer is formed. Such dehydration treatment or dehydrogenation treatment may be conducted once or plural times.

Figure 13B:
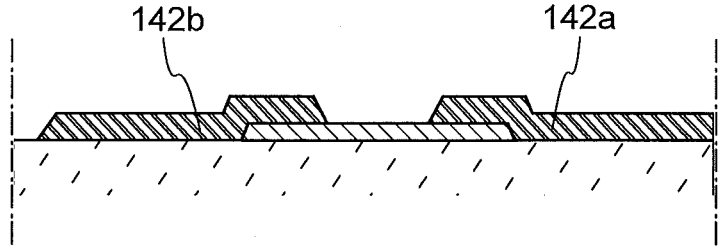

Next, the source and drain electrodes 142a and 142b are formed by forming a conductive layer used for forming source and drain electrodes (including a wiring formed using the same layer as the source and drain electrodes) over the oxide semiconductor layer 144 and the like and by processing the conductive layer (see FIG. 13B).

The conductive layer can be formed by a PVD method or a CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that in the case where the conductive layer has a single-layer structure of a titanium film or a titanium nitride film, there is an advantage that the conductive layer can be easily processed into the source and drain electrodes 142a and 142b having tapered shapes.

The conductive layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials including silicon or silicon oxide can be used.

The conductive layer is preferably etched such that the source and drain electrodes 142a and 142b are formed to have tapered end portions. Here, the taper angle is in the range of 30° to 60°, for example. When the source and drain electrodes 142a and 142b are formed by etching so as to have tapered end portions, coverage of the source and drain electrodes 142a and 142b with the gate insulating layer 146 which is formed later can be improved and disconnection of the gate insulating layer 146 can be prevented.

The channel length (L) of the transistor in the upper portion is determined by a distance between lower edge portions of the source or drain electrode 142a and the source or drain electrode 142b. Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. The resolution of light exposure with extreme ultraviolet rays is high and the depth of focus is large. For these reasons, the channel length (L) of the transistor to be formed later can be set in the range of 10 nm to 1000 nm (1 µm), and the circuit can operate at higher speed. In addition, power consumption of the semiconductor device can be reduced by miniaturization.

Figure 13C:
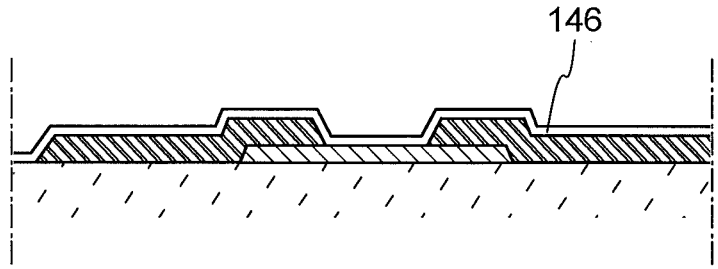

Next, the gate insulating layer 146 is formed so as to cover the source and drain electrodes 142a and 142b and to be in contact with part of the oxide semiconductor layer 144 (see FIG. 13C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked-layer structure in which these materials are combined. There is no particular limitation on the thickness of the gate insulating layer 146; the thickness is preferably small in order to ensure the operation of the transistor when the semiconductor device is miniaturized. For example, in the case of using silicon oxide, the thickness can be in the range of 1 nm to 100 nm, preferably 10 nm to 50 nm.

When the gate insulating layer is thin as described above, gate leakage due to a tunneling effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added. The use of a high-k material for the gate insulating layer 146 makes it possible to increase the thickness in order to suppress gate leakage as well as ensuring electrical properties. Note that a stacked-layer structure of a film including a high-k material and a film including any of silicon oxide, silicon nitride, silicon oxynitride, silicon nitride oxide, aluminum oxide, and the like may also be employed.

Further, the insulating layer in contact with the oxide semiconductor layer 144 (in this embodiment, the gate insulating layer 146) may be formed using an insulating material containing a Group 13 element and oxygen. Many oxide semiconductor materials contain a Group 13 element, and thus, an insulating material containing a Group 13 element works well with the oxide semiconductor. By using such an insulating material for the insulating layer in contact with the oxide semiconductor, an interface with the oxide semiconductor layer can be kept in a favorable state.

Here, an insulating material containing a Group 13 element refers to an insulating material containing one or more Group 13 elements. As an example of the insulating material containing a Group 13 element, gallium oxide, aluminum oxide, aluminum gallium oxide, gallium aluminum oxide, or the like can be given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, a material containing gallium oxide may be used for a gate insulating layer, so that favorable characteristics can be kept at the interface between the oxide semiconductor layer and the gate insulating layer. When the oxide semiconductor layer and the insulating layer containing gallium oxide are provided in contact with each other, pile-up of hydrogen at the interface between the oxide semiconductor layer and the insulating layer can be suppressed, for example. Note that a similar effect can be obtained in the case where an element belonging to the same group as a constituent element of the oxide semiconductor is used for an insulating layer. For example, it is effective to form an insulating layer with the use of a material containing aluminum oxide. Note that aluminum oxide has a property of not easily transmitting water. Thus, it is preferable to use a material containing aluminum oxide in terms of preventing entry of water into the oxide semiconductor layer.

The insulating material of the insulating layer in contact with the oxide semiconductor layer 144 is preferably made to contain oxygen in a proportion higher than that in the stoichiometric composition by heat treatment in an oxygen atmosphere or by oxygen doping. "Oxygen doping" refers to adding oxygen into a bulk. Note that the term "bulk" is used in order to clarify that oxygen is added not only to a surface of a thin film but also to the inside of the thin film. In addition, "oxygen doping" includes oxygen plasma doping in which oxygen plasma is added to a bulk. The oxygen doping may be performed by an ion implantation method or an ion doping method.

For example, in the case where the insulating layer in contact with the oxide semiconductor layer 144 is formed using gallium oxide, the composition of gallium oxide can be set to be $Ga_2O_x$ (x=3+α, 0<α<1) by heat treatment in an oxygen atmosphere or by oxygen doping. In the case where the insulating layer in contact with the oxide semiconductor layer 144 is formed using aluminum oxide, the composition of aluminum oxide can be set to be $Al_2O_x$ (x=3+α, 0<α<1) by heat treatment in an oxygen atmosphere or by oxygen doping. In the case where the insulating layer in contact with the oxide semiconductor layer 144 is formed using gallium aluminum oxide (aluminum gallium oxide), the composition of gallium aluminum oxide (aluminum gallium oxide) can be set to be $Ga_xAl_{2-x}O_{3+\alpha}$ (0<x<2, 0<α<1) by heat treatment in an oxygen atmosphere or by oxygen doping.

By oxygen doping, an insulating layer which has a region where the proportion of oxygen is higher than that in the stoichiometric composition can be formed. When the insulating layer having such a region is in contact with the oxide semiconductor layer, excess oxygen in the insulating layer is supplied to the oxide semiconductor layer, and oxygen deficiency in the oxide semiconductor layer or at an interface between the oxide semiconductor layer and the insulating layer can be reduced.

Note that the insulating layer having a region where the proportion of oxygen is higher than that in the stoichiometric proportion may be applied to an insulating layer serving as a base film for the oxide semiconductor layer 144 instead of the gate insulating layer 146, or both the gate insulating layer 146 and the base film.

After the gate insulating layer 146 is formed, second heat treatment is preferably performed in an inert gas atmosphere or an oxygen atmosphere. The temperature of the heat treatment is set in the range of 200° C. to 450° C., preferably 250°

C. to 350° C. For example, the heat treatment may be performed at 250° C. for one hour in a nitrogen atmosphere. By the second heat treatment, variation in electrical characteristics of the transistor can be reduced. Further, in the case where the gate insulating layer 146 includes oxygen, oxygen can be supplied to the oxide semiconductor layer 144 to cover oxygen deficiency in the oxide semiconductor layer 144.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as to contain a substance including a hydrogen atom as little as possible.

Figure 13D:
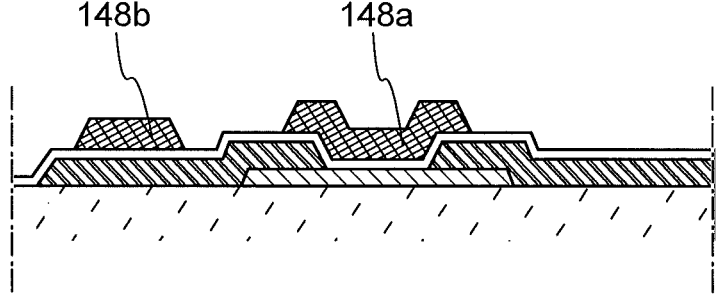

Next, a conductive layer for forming a gate electrode (including a wiring formed using the same layer as the gate electrode) is formed and is processed, so that the gate electrode 148a and the conductive layer 148b are formed (see FIG. 13D).

The gate electrode 148a and the conductive layer 148b can be formed using a metal material such as molybdenum, titanium, tantalum, tungsten, aluminum, copper, neodymium, or scandium, or an alloy material containing any of these materials as its main component. Note that the gate electrode 148a and the conductive layer 148b may have a single-layer structure or a stacked-layer structure.

Figure 13E:
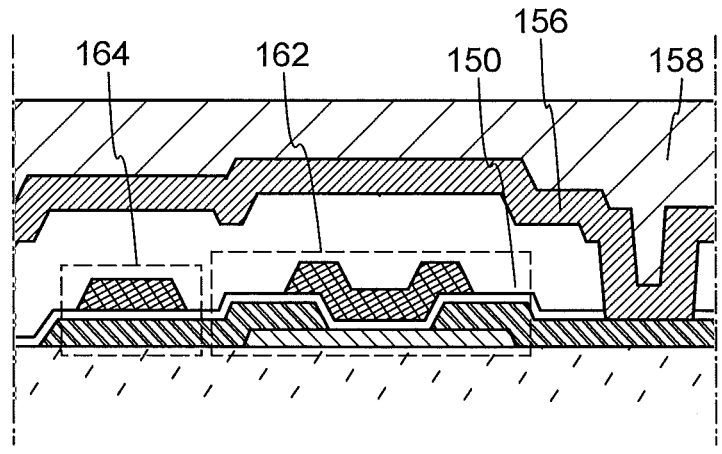

Then, the insulating layer 150 is formed over the gate insulating layer 146, the gate electrode 148a, and the conductive layer 148b (see FIG. 13E). The insulating layer 150 can be formed by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that the insulating layer 150 is preferably formed using a low dielectric constant material or a low dielectric constant structure (such as a porous structure). This is because when the insulating layer 150 has a low dielectric constant, capacitance generated between wirings, electrodes, or the like can be reduced and operation at higher speed can be achieved. Note that although the insulating layer 150 has a single-layer structure in this embodiment, an embodiment of the disclosed invention is not limited to this example. The insulating layer 150 may have a stacked-layer structure including two or more layers. Note that in the case where the insulating layer 152 is formed over the insulating layer 150, a material and a manufacturing method similar to those for the insulating layer 150 can be employed.

Next, an opening reaching the source or drain electrode 142a is formed in the gate insulating layer 146 and the insulating layer 150. Then, the wiring 156 in contact with the source or drain electrode 142a is formed over the insulating layer 150 (see FIG. 13E). The opening is formed by selective etching with a mask or the like.

The wiring 156 is formed by forming a conductive layer by a PVD method or a CVD method and then by patterning the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

Specifically, it is possible to employ a method, for example, in which a thin titanium film (about 5 nm thick) is formed in a region including the opening in the insulating layer 150 by a PVD method and then, an aluminum film is formed so as to be embedded in the opening. Here, the titanium film formed by a PVD method functions to reduce an oxide film (e.g., a natural oxide film) formed on a surface where the titanium film is formed, and to decrease the contact resistance with a lower electrode or the like (here, the source or drain electrode 142a). In addition, hillock of the aluminum film can be prevented. A copper film may be formed by a plating method after the formation of a barrier film of titanium, titanium nitride, or the like.

Next, an insulating layer 158 is formed so as to cover the wiring 156 (see FIG. 13E).

Like the insulating layer 150, the insulating layer 158 can be formed by a PVD method, a CVD method, or the like. The insulating layer 158 can be formed so as to have a single-layer structure or a stacked-layer structure using a material including an inorganic insulating material such as silicon oxide, silicon oxynitride, silicon nitride, hafnium oxide, gallium oxide, or aluminum oxide or a material including an organic material such as polyimide or acrylic.

Through the above steps, the transistor 162 including the oxide semiconductor layer 144, which is purified, and the capacitor 164 are completed (see FIG. 13E).

Note that in the case of forming the transistor 332 and the capacitor 334 illustrated in FIG. 12A, the source and drain electrodes 142a and 142b are formed over the insulating layer 140, and the oxide semiconductor layer 144 is formed over the insulating layer 140 and the source and drain electrodes 142a and 142b. Then, the gate insulating layer 146 is formed over the source and drain electrodes 142a and 142b and the oxide semiconductor layer 144. After that, over the gate insulating layer 146, the gate electrode 148a is formed so as to overlap with the oxide semiconductor layer 144, and the conductive layer 148b is formed so as to overlap with the source or drain electrode 142b.

In the case of forming the transistor 342 and the capacitor 344 illustrated in FIG. 12B, the gate electrode 148a and the conductive layer 148b are formed over the insulating layer 140, and the gate insulating layer 146 is formed over the insulating layer 140, the gate electrode 148a, and the conductive layer 148b. Then, the source and drain electrodes 142a and 142b are formed over the gate insulating layer 146. After that, the oxide semiconductor layer 144 is formed over the gate insulating layer 146 so as to overlap with the gate electrode 148a; thus, the transistor 342 and the capacitor 344 are completed. Note that the insulating layer 150 and the insulating layer 152 may be formed so as to cover the transistor 342 and the capacitor 344. For example, the insulating layer 150 preferably contains oxygen in a proportion higher than that in the stoichiometric proportion by heat treatment in an oxygen atmosphere or by oxygen doping, and the insulating layer 152 preferably hardly allows water or hydrogen to pass through. This is because when the insulating layer 152 hardly allows water or hydrogen to pass through, it is possible to prevent water or hydrogen from entering the oxide semiconductor layer 144, and when the insulating layer 150 contains oxygen in a proportion higher than that in the stoichiometric proportion, it is possible to form the oxide semiconductor layer 144 which is i-type or substantially i-type by filling oxygen vacancies in the oxide semiconductor layer 144.

In the case of forming the transistor 352 and the capacitor 354 illustrated in FIG. 12C, the gate electrode 148a and the conductive layer 148b are formed over the insulating layer 140, and the gate insulating layer 146 is formed over the insulating layer 140, the gate electrode 148a, and the conductive layer 148b. Then, the oxide semiconductor layer 144 is formed over the gate insulating layer 146 so as to overlap with the gate electrode 148a. After that, the source and drain electrodes 142a and 142b are formed over the oxide semiconductor layer 144; thus, the transistor 352 and the capacitor 354 are completed. Note that the description of FIG. 12B can be referred to for the insulating layer 150 and the insulating layer 152.

In the case of forming the transistor 362 and the capacitor 364 illustrated in FIG. 12D, the gate electrode 148a and the conductive layer 148b are formed over the insulating layer 140, and the gate insulating layer 146 (in FIG. 12D, the first gate insulating layer) is formed over the insulating layer 140, the gate electrode 148a (in FIG. 12D, the first gate electrode), and the conductive layer 148b. Then, the oxide semiconductor layer 144 is formed over the gate insulating layer 146 so as to overlap with the gate electrode 148a, and the source and drain electrodes 142a and 142b are formed over the oxide semiconductor layer 144. After that, the insulating layer 150 (in FIG. 12D, the second gate insulating layer) is formed over the oxide semiconductor layer 144 and the source and drain electrodes 142a and 142b, and the conductive layer 159 (in FIG. 12D, the second gate electrode) is formed so as to overlap with the oxide semiconductor layer 144. Thus, the transistor 362 and the capacitor 364 are completed. Note that the description of the gate electrode 148a can be referred to for the conductive layer 159.

Next, methods for manufacturing the transistors and the capacitors illustrated in FIGS. 11A and 11B will be described.

A method for manufacturing the transistor 312 and the capacitor 314 illustrated in FIG. 11A will be described.

First, the oxide semiconductor layer 144 is formed over the insulating layer 140, and an oxide conductive layer and a conductive layer are stacked over the insulating layer 140 and the oxide semiconductor layer 144.

As a method for forming the oxide conductive layer, a sputtering method, a vacuum evaporation method (an electron beam evaporation method or the like), an arc discharge ion plating method, or a spray method is used. As a material of the oxide conductive layer, zinc oxide, zinc aluminum oxide, zinc aluminum oxynitride, zinc gallium oxide, indium tin oxide, or the like can be used. In addition, any of the above materials may contain silicon oxide. Note that the description of the conductive layer used for forming the source and drain electrodes 142a and 142b can be referred to for the film formation method and the material of the conductive layer.

Next, the source and drain electrodes 142a and 142b and the oxide conductive layers 143a and 143b are formed by forming a mask over the conductive layer and selectively etching the conductive layer and the oxide conductive layer.

Note that when etching treatment for the conductive layer and the oxide conductive layer is performed, etching conditions (e.g., type of an etching agent, the concentration of an etching agent, and etching time) are adjusted as appropriate in order to prevent excessive etching of the oxide semiconductor layer.

Next, the gate insulating layer 146 is formed over the source and drain electrodes 142a and 142b and the oxide semiconductor layer 144. After that, over the gate insulating layer 146, the gate electrode 148a is formed so as to overlap with the oxide semiconductor layer 144, and the conductive layer 148b is formed so as to overlap with the source or drain electrode 142b.

Through the above steps, the transistor 312 and the capacitor 314 are completed (see FIG. 11A).

In the case of manufacturing the transistor 322 and the capacitor 324 illustrated in FIG. 11B, an oxide semiconductor layer and an oxide conductive layer are stacked and are processed in one photolithography step, so that an island-shaped oxide semiconductor layer and an island-shaped oxide conductive layer are formed. Next, the oxide conductive layers 143a and 143b serving as source and drain regions are formed by forming the source and drain electrodes 142a and 142b over the island-shaped oxide conductive layer and then by etching the island-shaped oxide conductive layer using the source and drain electrodes 142a and 142b as a mask.

Next, the gate insulating layer 146 is formed over the source and drain electrodes 142a and 142b and the oxide semiconductor layer 144. After that, over the gate insulating layer 146, the gate electrode 148a is formed so as to overlap with the oxide semiconductor layer 144, and the conductive layer 148b is formed so as to overlap with the source or drain electrode 142b.

Through the above steps, the transistor 322 and the capacitor 324 are completed (see FIG. 11B).

In each of the transistors described in this embodiment, the oxide semiconductor layer 144 is purified and thus contains hydrogen at a concentration of $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the carrier density of the oxide semiconductor layer 144 is, for example, less than $1 \times 10^{12}$/cm$^3$, preferably less than $1.45 \times 10^{10}$/cm$^3$, which is sufficiently lower than the carrier density of a general silicon wafer (approximately $1 \times 10^{14}$/cm$^3$). In addition, the off-state current of the transistor 162 is sufficiently small. For example, the off-state current (per unit channel width (1 μm), here) of the transistor 162 at room temperature (25° C.) is 100 zA (1 zA (zeptoampere) is $1 \times 10^{-21}$ A) or less, preferably 10 zA or less.

The concentration of an alkali metal or an alkaline earth metal is sufficiently decreased in the oxide semiconductor layer 144. The concentration of an alkali metal or an alkaline earth metal is decreased to such a degree that, for example, the concentrations of Na is $5 \times 10^{16}$ cm$^{-3}$ or less, preferably $1 \times 10^{16}$ cm$^{-3}$ or less, more preferably $1 \times 10^{15}$ cm$^{-3}$ or less, the concentration of Li is $5 \times 10^{15}$ cm$^{-3}$ or less, preferably $1 \times 10^{15}$ cm$^{-3}$ or less, and the concentration of K is $5 \times 10^{15}$ cm$^{-3}$ or less, preferably $1 \times 10^{15}$ cm$^{-3}$ or less.

In this manner, by using the oxide semiconductor layer 144 which is purified and is intrinsic, it becomes easy to sufficiently reduce the off-state current of the transistor. With the use of such a transistor as described above, a semiconductor device in which stored data can be held for an extremely long time can be provided.

The configurations, methods, and the like described in this embodiment can be combined as appropriate with any of the configurations, methods, and the like described in the other embodiments.

Embodiment 3

One embodiment of an oxide semiconductor layer which can be used for a channel formation region of any of the transistors in the above embodiments will be described with reference to FIGS. 14A to 14D.

The oxide semiconductor layer of this embodiment has a structure including a first crystalline oxide semiconductor layer and a second crystalline oxide semiconductor layer which is stacked over the first crystalline oxide semiconductor layer and has a larger thickness than the first crystalline oxide semiconductor layer.

A first oxide semiconductor film with a thickness greater than or equal to 1 nm and less than or equal to 10 nm is formed over an insulating layer 140.

In this embodiment, an oxide insulating layer with a thickness greater than or equal to 50 nm and less than or equal to 600 nm is formed as the insulating layer 140 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

The first oxide semiconductor film is formed by a sputtering method, and the substrate temperature in the film formation by a sputtering method is set to be higher than or equal to 200° C. and lower than or equal to 400° C. In this embodiment, the first oxide semiconductor film is formed to a thickness of 5 nm in an oxygen atmosphere, an argon atmosphere, or an atmosphere including argon and oxygen under conditions where a target for an oxide semiconductor (a target for an In—Ga—Zn-based oxide semiconductor ($In_2O_3:Ga_2O_3:ZnO=1:1:2$ [molar ratio])) is used, the distance between the substrate and the target is 170 mm, the substrate temperature is 250° C., the pressure is 0.4 Pa, and the direct-current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 145a is formed (see FIG. 14A).

Although it depends on the temperature of the first heat treatment, the first heat treatment causes crystallization from a film surface and crystal grows from the film surface toward the inside of the film; thus, c-axis aligned crystal is obtained. By the first heat treatment, a large amount of zinc and oxygen gather about the film surface, and one or more layers of graphene-type two-dimensional crystal including zinc and oxygen and having a hexagonal upper plane are formed at the outermost surface; the one or more layers at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 140 that is an oxide insulating layer is diffused to an interface between the insulating layer 140 and the first crystalline oxide semiconductor layer 145a or the vicinity of the interface (within ±5 nm from the interface), whereby oxygen vacancies in the first crystalline oxide semiconductor layer are reduced. Therefore, it is preferable that oxygen be included in (a bulk of) the insulating layer 140 used as a base insulating layer for the first crystalline oxide semiconductor layer or at the interface between the first crystalline oxide semiconductor layer 145a and the insulating layer 140 at an amount that exceeds at least the stoichiometric proportion.

Next, a second oxide semiconductor film with a thickness more than 10 mm is formed over the first crystalline oxide semiconductor layer 145a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor film formed above and in contact with the surface of the first crystalline oxide semiconductor layer, and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for an oxide semiconductor (a target for an In—Ga—Zn-based oxide semiconductor ($In_2O_3:Ga_2O_3:ZnO=1:1:2$ [molar ratio])) is used, the distance between the substrate and the target is 170 mm, the substrate temperature is 400° C., the pressure is 0.4 Pa, and the direct-current (DC) power is 0.5 kW.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, a second crystalline oxide semiconductor layer 145b is formed (see FIG. 14B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds with the use of the first crystalline oxide semiconductor layer 145a as a nucleus, in the thickness direction, that is, from the bottom to the inside; thus, the second crystalline oxide semiconductor layer 145b is formed.

It is preferable that steps from the formation of the insulating layer 140 to the second heat treatment be successively performed without exposure to the air. The steps from the formation of the insulating layer 140 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 14A:
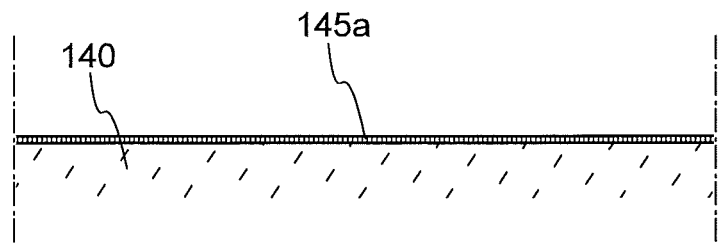
FIGS. 14A to 14D are cross-sectional views illustrating a manufacturing process of a semiconductor device.
Figure 14B:
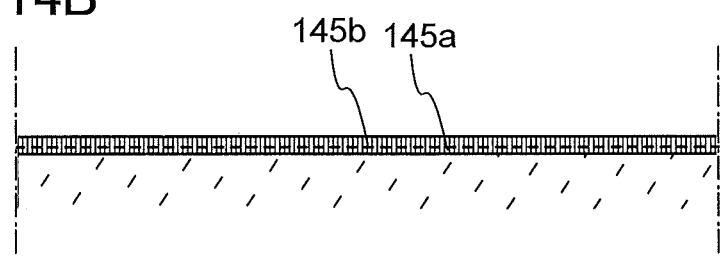
Figure 14C:
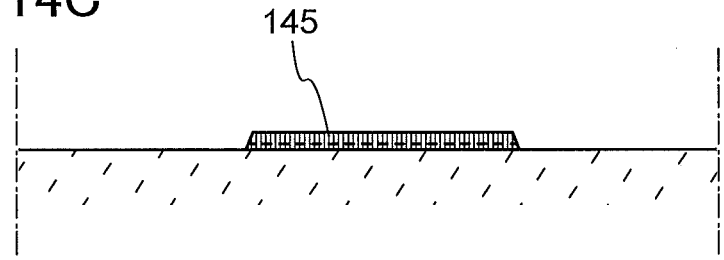
Figure 14D:
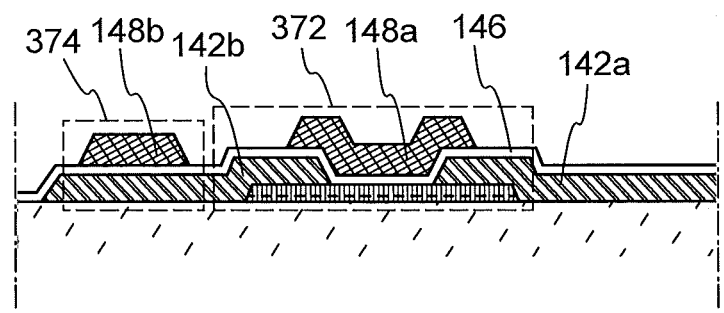

Next, the stack of the oxide semiconductor layers including the first crystalline oxide semiconductor layer 145a and the second crystalline oxide semiconductor layer 145b is processed into an oxide semiconductor layer 145 including a stack of island-shaped oxide semiconductor layers (see FIG. 14C). In FIG. 14C, the interface between the first crystalline oxide semiconductor layer 145a and the second crystalline oxide semiconductor layer 145b are indicated by a dotted line, and the stack structure of the first crystalline oxide semiconductor layer and the second crystalline oxide semiconductor layer is illustrated; however, the interface is actually not distinct and is illustrated for easy understanding.

The stack of the oxide semiconductor layers can be processed by being etched after a mask having a desired shape is formed over the stack of the oxide semiconductor layers. The mask may be formed by a method such as photolithography. Alternatively, a method such as an inkjet method may be used to form the mask.

For the etching of the stack of oxide semiconductor layers, either wet etching or dry etching may be employed. It is needless to say that both of them may be employed in combination.

A feature of the first crystalline oxide semiconductor layer and the second crystalline oxide semiconductor layer obtained by the above formation method is that these layers have c-axis alignment. Note that the first crystalline oxide semiconductor layer and the second crystalline oxide semiconductor layer comprise an oxide including a crystal with c-axis alignment (also referred to as c-axis aligned crystal (CAAC)), which has neither a single crystal structure nor an amorphous structure. The first crystalline oxide semiconductor layer and the second crystalline oxide semiconductor layer partly include a crystal grain boundary.

In any case, in order to obtain CAAC, it is important to form hexagonal crystals in an initial stage of deposition of an oxide semiconductor film and to cause crystal growth from the hexagonal crystals as a seed. In order to achieve this, it is preferable that a substrate heating temperature be 100° C. to 500° C., more preferably 200° C. to 400° C., still preferably 250° C. to 300° C. In addition, the deposited oxide semiconductor film is subjected to heat treatment at a temperature higher than the substrate heating temperature in the film formation. Accordingly, microdefects in the film and defects at the interface of stacked layers can be repaired.

Note that the first and second crystalline oxide semiconductor layers are formed using an oxide material containing at least Zn, for example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; or a Zn—O-based material. In addition, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide material containing indium (In), gallium (Ga), and zinc (Zn), and there is no limitation on the composition ratio thereof. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

After that, the source and drain electrodes 142a and 142b, the gate insulating layer 146, the gate electrode 148a, and the conductive layer 148b are formed; thus, a transistor 372 and a capacitor 374 are completed. Embodiment 2 can be referred to for materials and formation methods of the source and drain electrodes 142a and 142b, the gate insulating layer 146, the gate electrode 148a, and the conductive layer 148b.

The oxide semiconductor layer 145 including the stack of the oxide semiconductor layers formed by the above formation method can be used as appropriate for a semiconductor device disclosed in this specification (the transistor described in Embodiment 2).

In the transistor 372, in which the stack of the oxide semiconductor layers of this embodiment is used as the oxide semiconductor layer 144, an electric field is not applied from one surface to the other surface of the oxide semiconductor layer and current does not flow in the thickness direction of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 145, the transistor can have stable electric characteristics and high reliability.

This embodiment can be implemented in an appropriate combination with the configurations described in the other embodiments.

Embodiment 4

In this embodiment, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 17A to 17E, FIGS. 18A to 18C, and FIGS. 19A to 19C. In FIGS. 17A to 17E, FIGS. 18A to 18C, and FIGS. 19A to 19C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Furthermore, in FIGS. 17A to 17E, O surrounded by a circle represents tetracoodianate O and O surrounded by a double circle represents tricoodenate O.

Figure 17A:
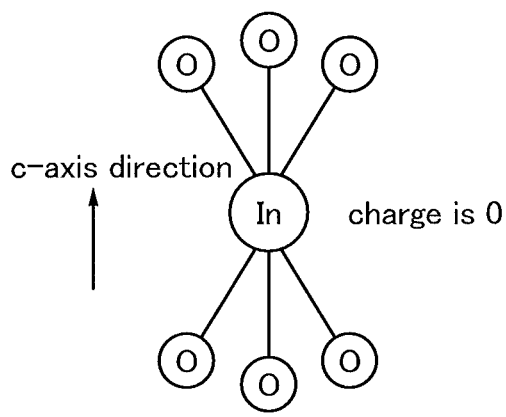
FIGS. 17A to 17E are diagrams illustrating a crystal structure of an oxide material.

FIG. 17A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 17A is actually an octahedral structure, but is illustrated as a planar structure for simplicity. Note that three tetracoordinate O atoms exist in each of an upper half and a lower half in FIG. 17A. In the small group illustrated in FIG. 17A, electric charge is 0.

Figure 17D:
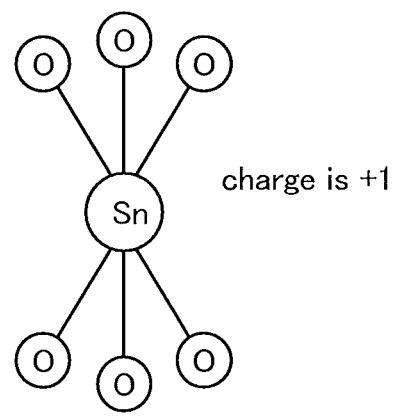
Figure 17B:
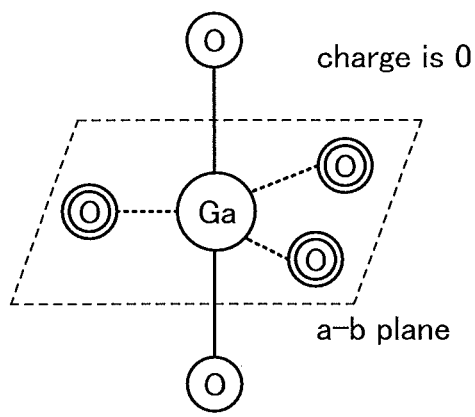

FIG. 17B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 17B. An In atom can also have the structure illustrated in FIG. 17B because an In atom can have five ligands. In the small group illustrated in FIG. 17B, electric charge is 0.

Figure 17E:
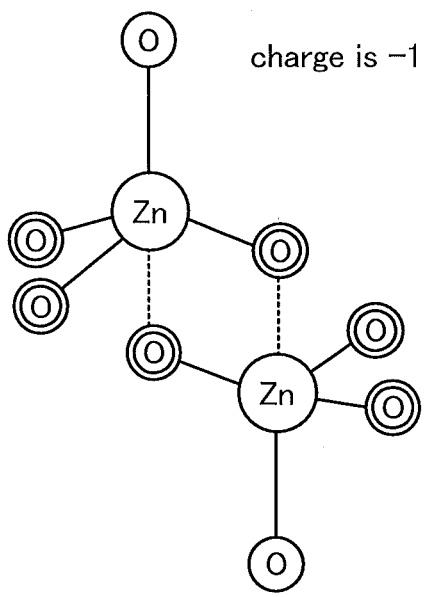
Figure 17C:
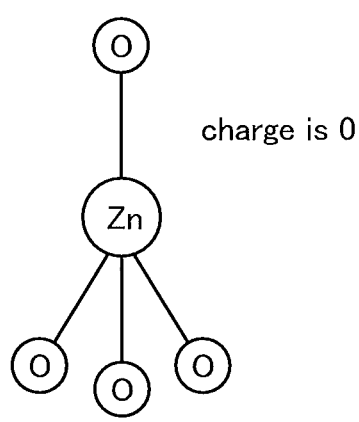

FIG. 17C illustrates a structure including one tetracoordinate Zn atom and four tetracoordinate O atoms proximate to the Zn atom. In FIG. 17C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 17C. In the small group illustrated in FIG. 17C, electric charge is 0.

FIG. 17D illustrates a structure including one hexacoordinate Sn atom and six tetracoordinate O atoms proximate to the Sn atom. In FIG. 17D, three tetracoordinate O atoms exist in each of an upper half and a lower half. In the small group illustrated in FIG. 17D, electric charge is +1.

FIG. 17E illustrates a small group including two Zn atoms. In FIG. 17E, one tetracoordinate O atom exists in each of an upper half and a lower half. In the small group illustrated in FIG. 17E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 17A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 18A:
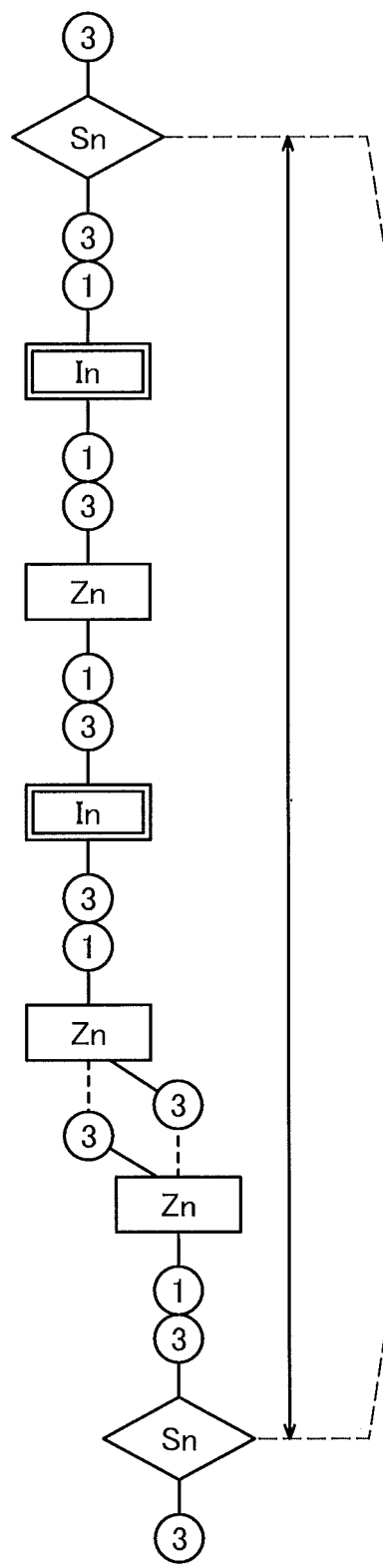
FIGS. 18A to 18C are diagrams illustrating a crystal structure of an oxide material.
Figure 18B:
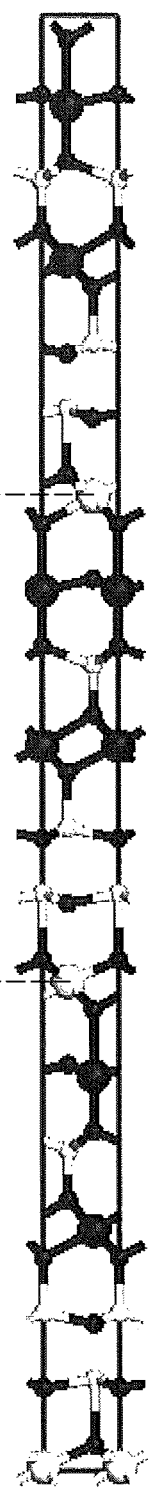
Figure 18C:
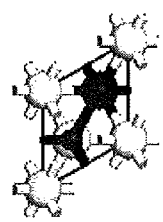

FIG. 18A illustrates a model of a medium group included in a layered structure of an In—Sn—Zn—O-based material. FIG. 18B illustrates a large group including three medium groups. Note that FIG. 18C illustrates an atomic arrangement in the case where the layered structure in FIG. 18B is observed from the c-axis direction.

In FIG. 18A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 18A, one tetracoordinate O atom existing in each of an upper half and a lower half with respect to an In atom is denoted by circled 1. FIG. 18A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 18A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 17E can be given. For example, with one small group including two Zn atoms, electric charge of one small group including a Sn atom can be cancelled, so that the total electric charge of the layered structure can be 0.

When the large group illustrated in FIG. 18B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 19A:
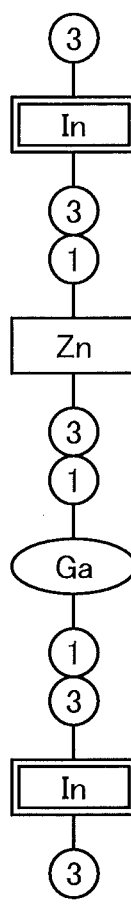
FIGS. 19A to 19C are diagrams illustrating a crystal structure of an oxide material.

For example, FIG. 19A illustrates a model of a medium group included in a layered structure of an In—Ga—Zn—O-based material.

In the medium group included in the layered structure of the In—Ga—Zn—O-based material in FIG. 19A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 19B:
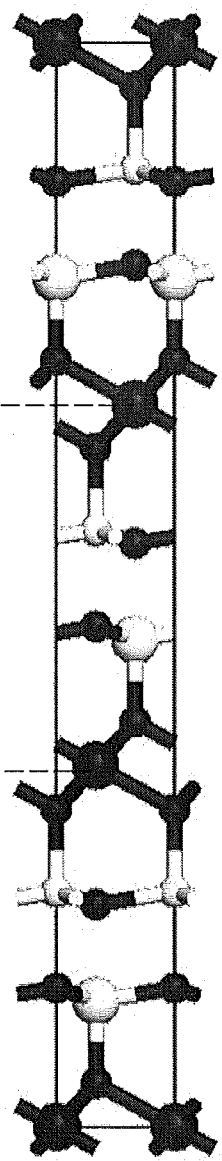
Figure 19C:
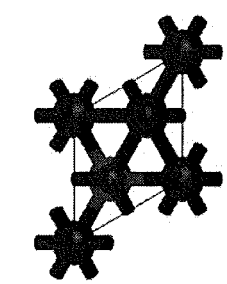

FIG. 19B illustrates a large group including three medium groups. Note that FIG. 19C illustrates an atomic arrangement in the case where the layered structure in FIG. 19B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 19A but also a medium group in which the arrangement of the In atom, the Ga atom, and the Zn atom is different from that in FIG. 19A.

When the large group illustrated in FIG. 19B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 34A:
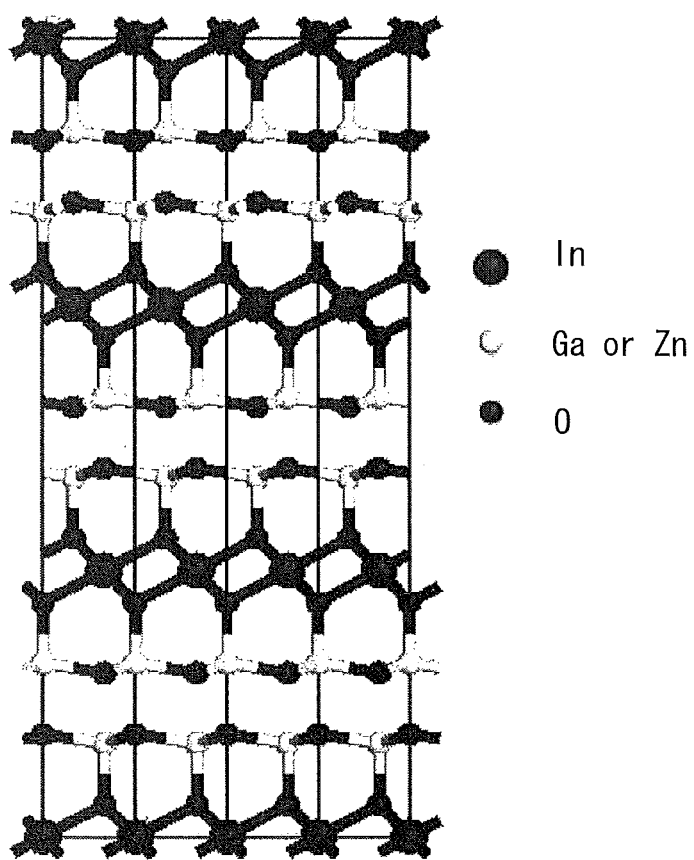
FIGS. 34A and 34B are diagrams illustrating a crystal structure of an oxide material.

In the case where n=1 ($InGaZnO_4$), a crystal structure illustrated in FIG. 34A can be obtained, for example. Note that in the crystal structure in FIG. 34A, since a Ga atom and an In atom each have five ligands as described with FIG. 17B, a structure in which Ga is replaced with In can be obtained.

Figure 34B:
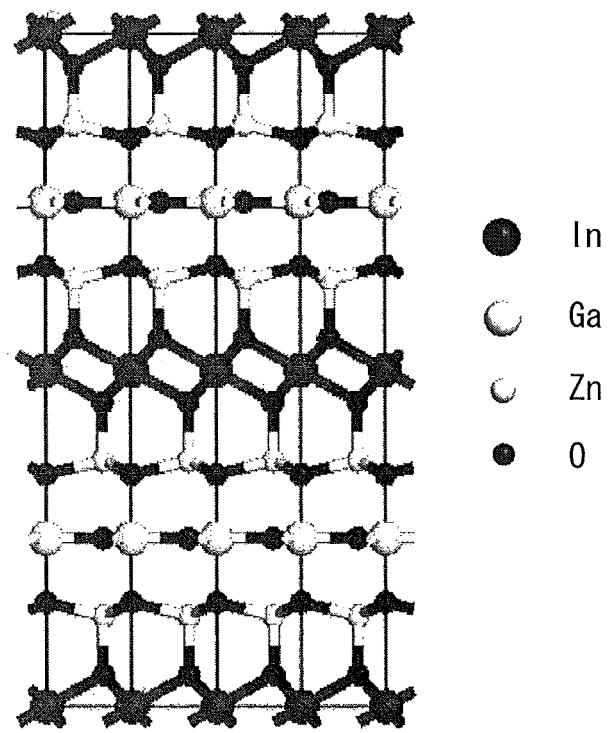

In the case where n=2 ($InGaZn_2O_5$), a crystal structure illustrated in FIG. 34B can be obtained, for example. Note that in the crystal structure in FIG. 34B, since a Ga atom and an In atom each have five ligands as described with FIG. 17B, a structure in which Ga is replaced with In can be obtained.

Embodiment 5

In this embodiment, the field-effect mobility of a transistor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed by Formula 2 below.

[Formula 2]

$$\mu = \mu_0 \exp\left(-\frac{E}{kT}\right) \quad (2)$$

Here, E represents the height of the potential barrier, k represents the Boltzmann constant, and T represents the absolute temperature. When the potential barrier is assumed to be attributed to a defect, the height of the potential barrier can be expressed by Formula 3 below according to the Levinson model.

[Formula 3]

$$E = \frac{e^2 N^2}{8\varepsilon n} = \frac{e^3 N^2 t}{8\varepsilon C_{ox} V_g} \quad (3)$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed by Formula 4 below.

[Formula 4]

$$I_d = \frac{W \mu V_g V_d C_{ox}}{L} \exp\left(-\frac{E}{kT}\right) \quad (4)$$

Here, L represents the channel length and W represents the channel width, and L and W are each 10 μm. In addition, $V_d$ represents the drain voltage. When dividing both sides of the above equation by $V_g$ and then taking logarithms of both sides, Formula 5 can be obtained as follows.

[Formula 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad (5)$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/Vs from Formula 2 and Formula 3. The measured mobility of an In—Sn—Zn oxide including a defect is approximately 40 cm²/Vs. However, assuming that no defect exists inside the semiconductor and at the interface between the semiconductor and an insulating film, the mobility $\mu_0$ of the oxide semiconductor is expected to be 120 cm²/Vs.

Even when no defect exists inside a semiconductor, scattering at an interface between a channel and a gate insulating layer affects the transport property of the transistor. In other words, the mobility $\mu_1$ at a position that is distance x away from the interface between the channel and the gate insulator can be expressed by Formula 6 below.

[Formula 6]

$$\frac{1}{\mu_1} = \frac{1}{\mu_0} + \frac{D}{B}\exp\left(-\frac{x}{l}\right) \quad (6)$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Figure 20:
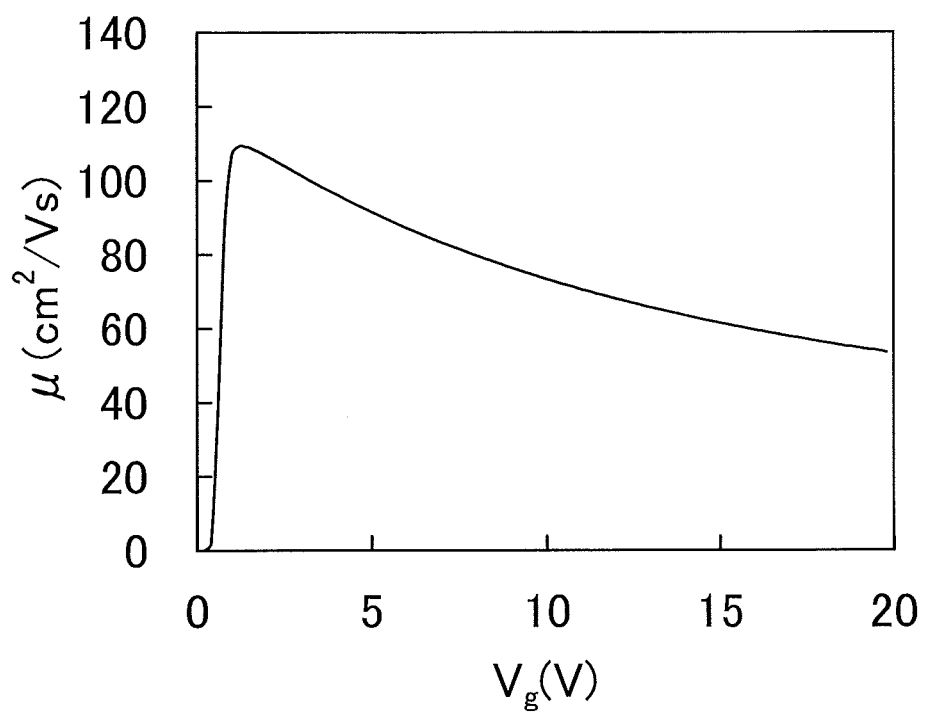
FIG. 20 shows the gate voltage dependence of mobility obtained by calculation.

Calculation results of the mobility $\mu_2$ of a transistor whose channel includes an ideal oxide semiconductor without a defect inside the semiconductor are shown in FIG. 20. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 nm, and the drain voltage $V_d$ was assumed to be 0.1 V.

As shown in FIG. 20, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 21A to 21C, FIGS. 22A to 22C, and FIGS. 23A to 23C. FIGS. 24A and 24B illustrate cross-sectional structures of the transistors used for the calculation. The transistors illustrated in FIGS. 24A and 24B each include a semiconductor region 903a and a semiconductor region 903c which have n⁺-type conductivity in an oxide semiconductor layer. The resistivities of the semiconductor region 903a and the semiconductor region 903c are $2 \times 10^{-3}$ Ωcm.

The transistor illustrated in FIG. 24A is formed over a base insulating layer 901 and an embedded insulator 902 which is embedded in the base insulating layer 901 and formed of aluminum oxide. The transistor includes the semiconductor region 903a, the semiconductor region 903c, an intrinsic semiconductor region 903b serving as a channel formation region therebetween, and a gate electrode 905. The width of the gate electrode 905 is 33 nm.

A gate insulating layer 904 is formed between the gate electrode 905 and the semiconductor region 903b. In addition, a sidewall insulator 906a and a sidewall insulator 906b are formed on both side surfaces of the gate electrode 905, and an insulator 907 is formed over the gate electrode 905 so as to prevent a short circuit between the gate electrode 905 and another wiring. The sidewall insulator has a width of 5 nm A source electrode 908a and a drain electrode 908b are provided in contact with the semiconductor region 903a and the semiconductor region 903c, respectively. Note that the channel width of this transistor is 40 nm.

The transistor of FIG. 24B is the same as the transistor of FIG. 24A in that it is formed over the base insulating layer 901 and the embedded insulator 902 formed of aluminum oxide and that it includes the semiconductor region 903a, the semiconductor region 903c, the intrinsic semiconductor region 903b provided therebetween, the gate electrode 905 having a width of 33 nm, the gate insulating layer 904, the sidewall insulator 906a, the sidewall insulator 906b, the insulator 907, the source electrode 908a, and the drain electrode 908b.

The transistor illustrated in FIG. 24A is different from the transistor illustrated in FIG. 24B in the conductivity type of semiconductor regions under the sidewall insulator 906a and the sidewall insulator 906b. In the transistor illustrated in FIG. 24A, the semiconductor regions under the sidewall insulator 906a and the sidewall insulator 906b are part of the semiconductor region 903a and the semiconductor region 903c having n⁺-type conductivity, whereas in the transistor illustrated in FIG. 24B, the semiconductor regions under the sidewall insulator 906a and the sidewall insulator 906b are part of the intrinsic semiconductor region 903b. In other words, in the semiconductor layer of FIG. 24B, a region having a width of $L_{off}$ which overlaps with neither the semiconductor region 903a (the semiconductor region 903c) nor the gate electrode 905 is provided. This region is called an offset region, and the width $L_{off}$ is called an offset length. As is seen from the drawing, the offset length is equal to the width of the sidewall insulator 906a (the sidewall insulator 906b).

Figure 21A:
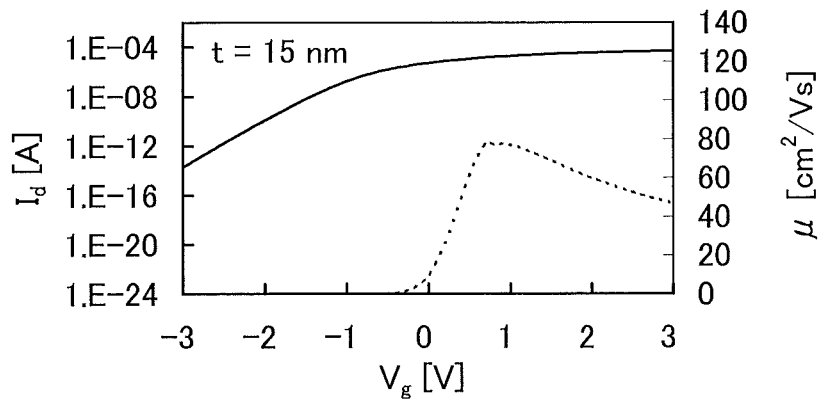
FIGS. 21A to 21C show the gate voltage dependence of drain current and mobility obtained by calculation.
Figure 21B:
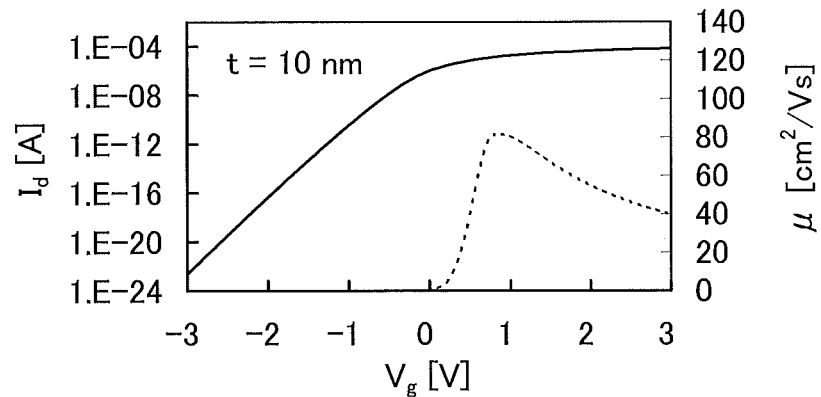
Figure 21C:
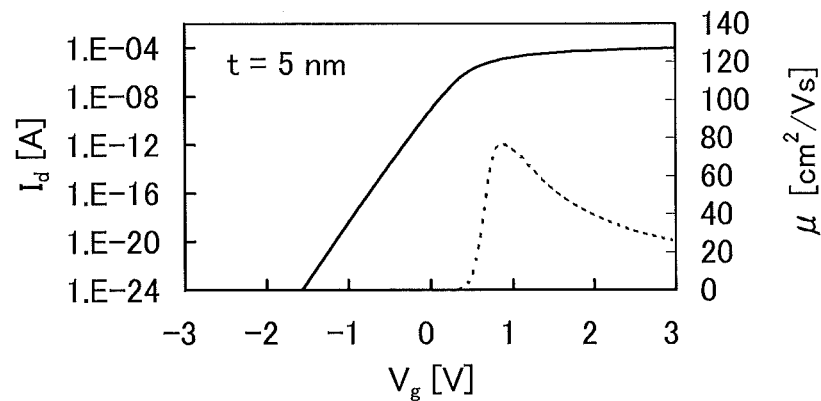

The other parameters used in calculation are as described above. For the calculation, device simulation software Sentaurus Device manufactured by Synopsys, Inc. was used. FIGS. 21A to 21C show the gate voltage ($V_g$: a potential difference between the gate and the source) dependence of the drain current ($I_d$, a solid line) and the mobility (μ, a dotted line) of the transistor having the structure illustrated in FIG. 24A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ (on-state current) in an on state. The graphs show that the drain current exceeds 10 μA at a gate voltage of around 1 V.

Figure 22A:
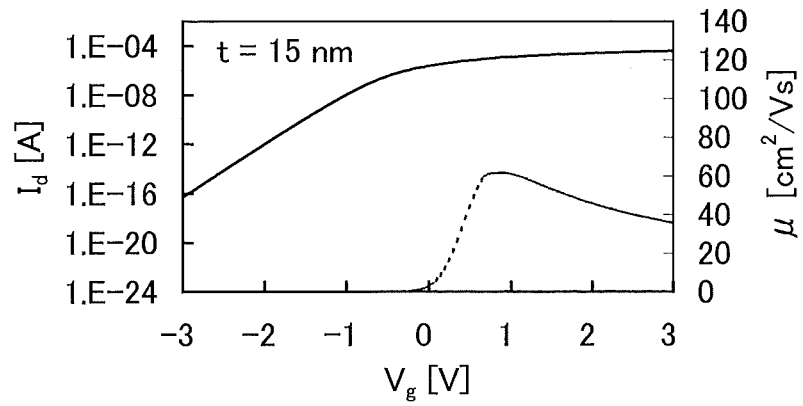
FIGS. 22A to 22C show the gate voltage dependence of drain current and mobility obtained by calculation.
Figure 22B:
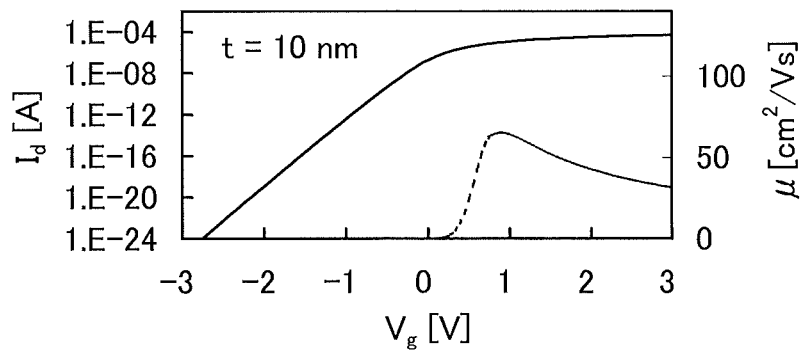
Figure 22C:
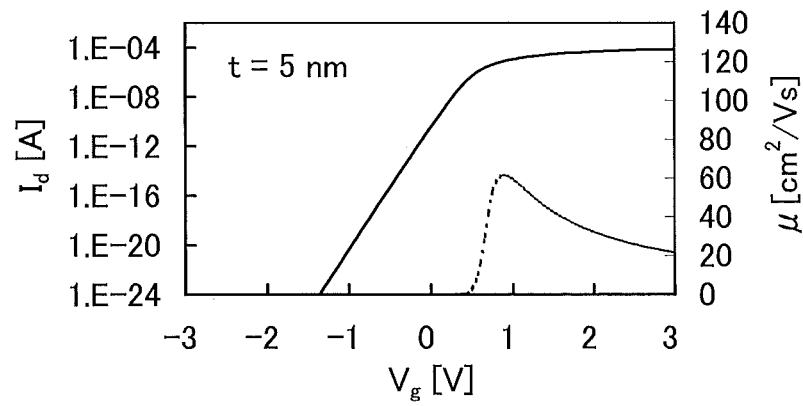

FIGS. 22A to 22C show the gate voltage $V_g$ dependence of the drain current $I_d$ (a solid line) and the mobility μ (a dotted line) of the transistor having the structure illustrated in FIG. 24B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 22A shows the gate voltage dependence of the transistor in the case where the thickness of the gate insulating layer is 15 nm, FIG. 22B shows that of the transistor in the case where the thickness of the gate insulating layer is 10 nm, and FIG. 22C shows that of the transistor in the case where the thickness of the gate insulating layer is 5 nm.

Figure 23A:
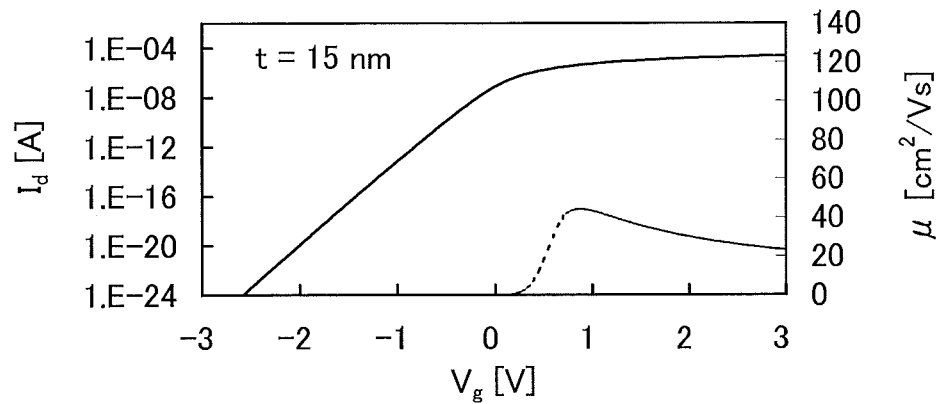
FIGS. 23A to 23C show the gate voltage dependence of drain current and mobility obtained by calculation.
Figure 23B:
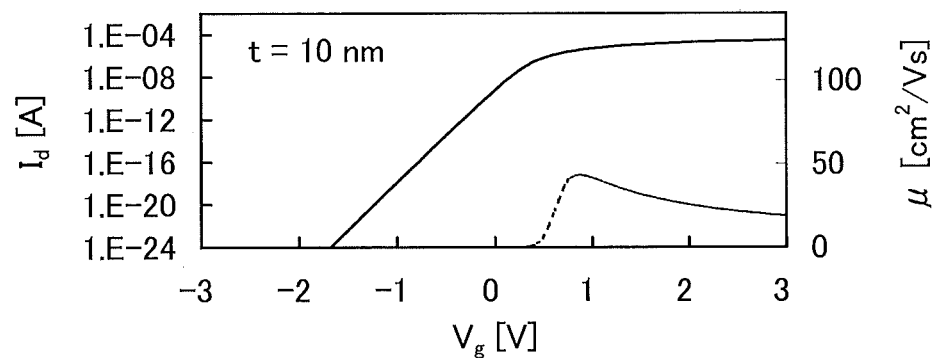
Figure 23C:
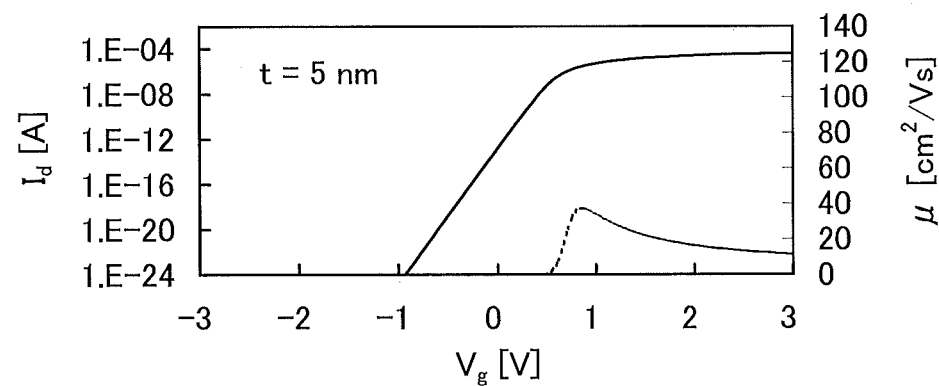
Figure 24A:
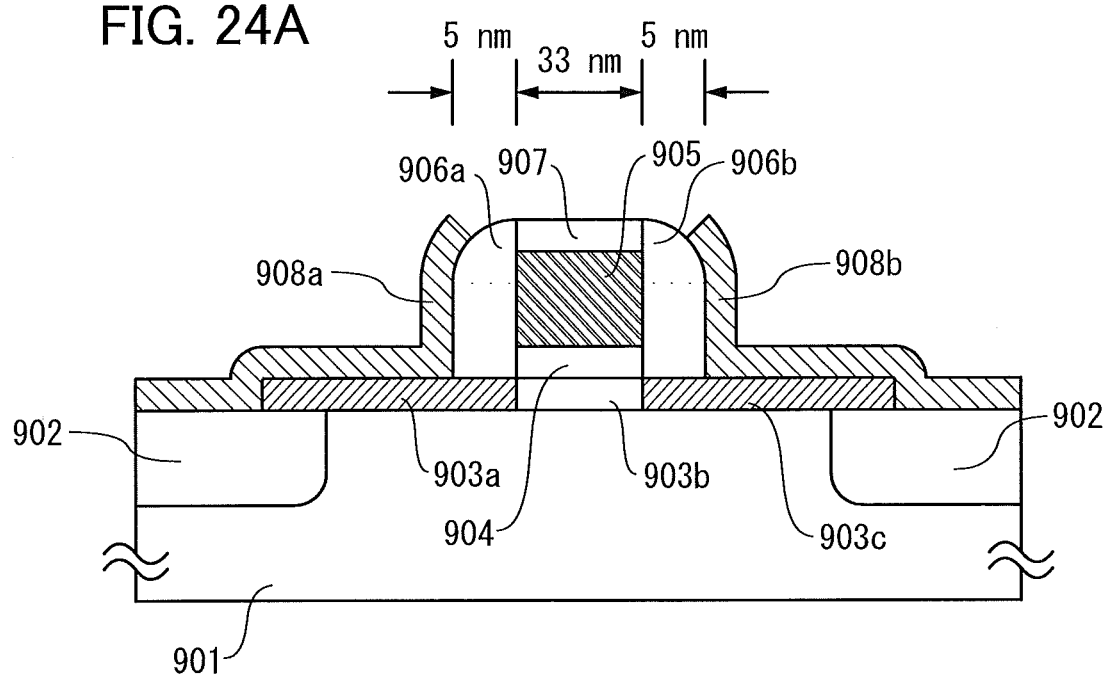
FIGS. 24A and 24B illustrate cross-sectional structures of transistors which are used in calculation.
Figure 24B:
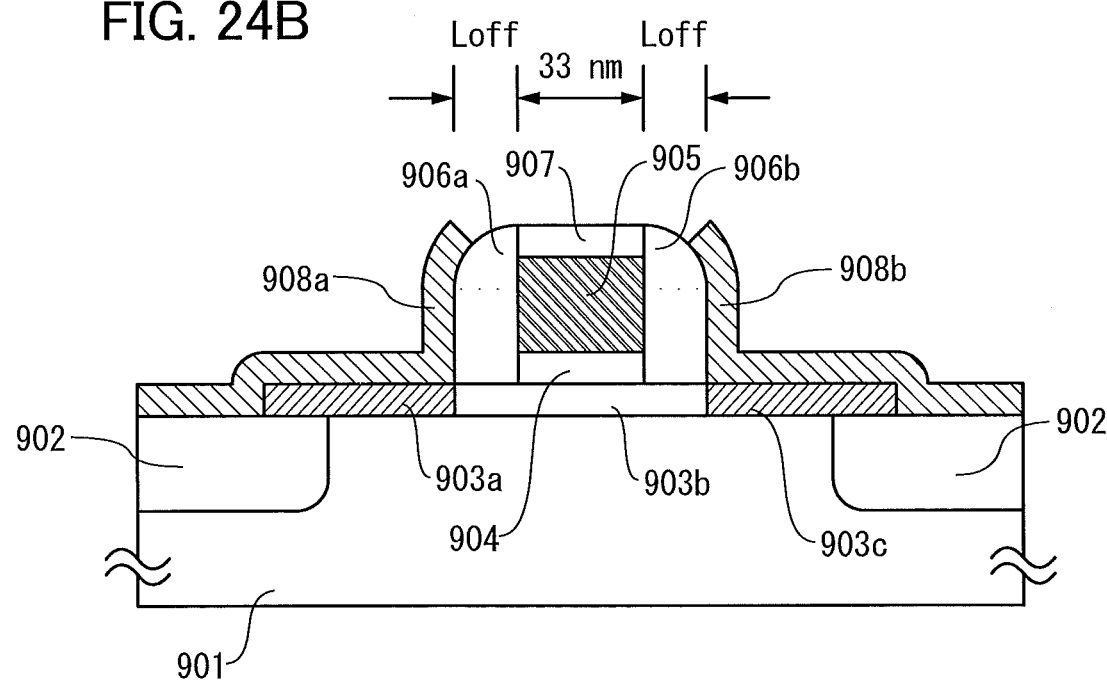

Further, FIGS. 23A to 23C show the gate voltage dependence of the drain current $I_d$ (a solid line) and the mobility μ (a dotted line) of the transistor having the structure illustrated in FIG. 24B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 23A shows the gate voltage dependence of the transistor in the case where the thickness of the gate insulating layer is 15 nm, FIG. 23B shows that of the transistor in the case where the thickness of the gate insulating layer is 10 nm, and FIG. 23C shows that of the transistor in the case where the thickness of the gate insulating layer is 5 nm.

In either of the structures, as the gate insulator is thinner, the off-state current is significantly decreased, whereas no noticeable change arises in the peak value of the mobility μ and the on-state current.

Note that the peak of the mobility μ is approximately 80 cm²/Vs in FIGS. 21A to 21C, approximately 60 cm²/Vs in FIGS. 22A to 22C, and approximately 40 cm²/Vs in FIGS. 23A to 23C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

Embodiment 6

In this embodiment, the cases where the semiconductor device described in any of the above embodiments is applied to electronic devices will be described with reference to FIGS. 15A to 15F. The cases where any of the above-described semiconductor devices is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 15A:
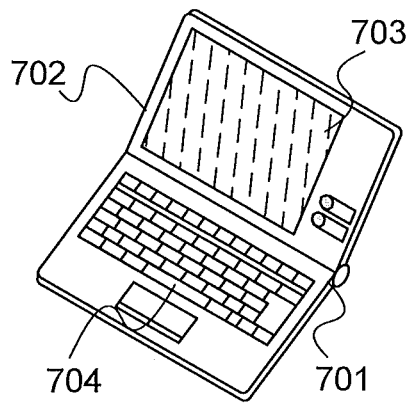
FIGS. 15A to 15F are diagrams each illustrating an electronic device.

FIG. 15A illustrates a notebook personal computer, which includes a housing 701, a housing 702, a display portion 703, a keyboard 704, and the like. The semiconductor device described in any of the above embodiments is provided in at least one of the housings 701 and 702. Thus, a notebook personal computer with sufficiently low power consumption, in which writing and reading of data can be performed at high speed and data can be stored for a long time, can be realized.

Figure 15D:
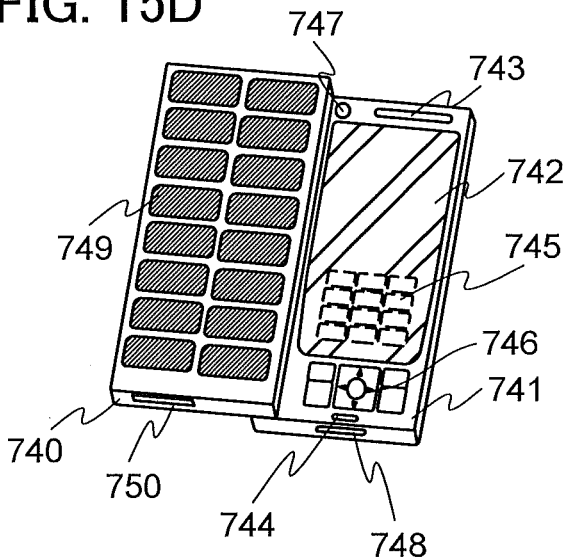
Figure 15B:
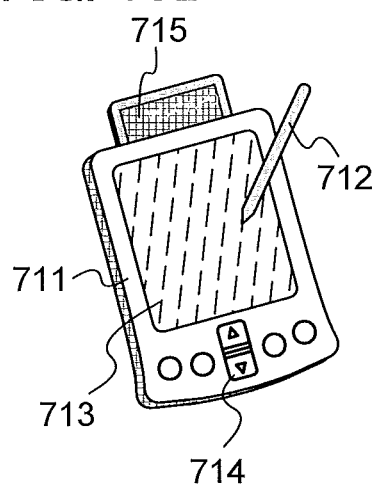

FIG. 15B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in any of the above embodiments is provided in the main body 711. Thus, a portable information terminal with sufficiently low power consumption, in which writing and reading of data can be performed at high speed and data can be stored for a long time, can be realized.

Figure 15E:
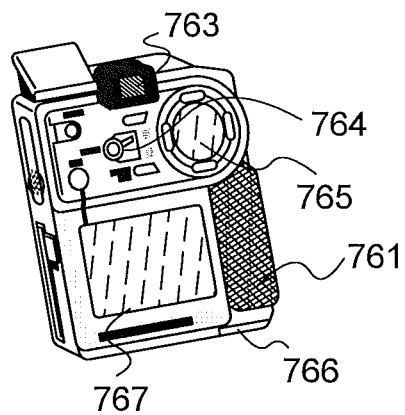
Figure 15C:
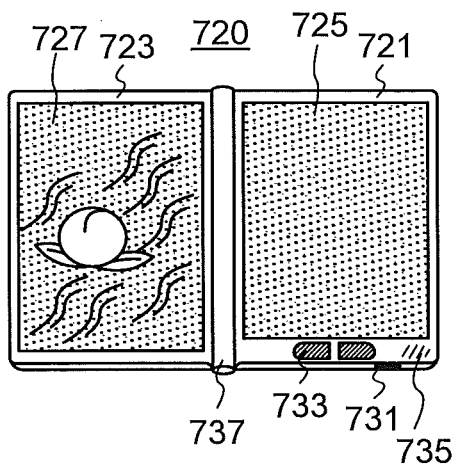

FIG. 15C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. The semiconductor device described in any of the above embodiments is provided in at least one of the housings 721 and 723. Thus, an electronic book with sufficiently low power consumption, in which writing and reading of data can be performed at high speed and data can be stored for a long time, can be realized.

FIG. 15D illustrates a mobile phone set, which includes two housings, a housing 740 and a housing 741. Moreover, the housings 740 and 741 in a state where they are developed as illustrated in FIG. 15D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in any of the above embodiments is provided in at least one of the housings 740 and 741. Thus, a mobile phone set with sufficiently low power consumption, in which writing and reading of data can be performed at high speed and data can be stored for a long time, can be realized.

FIG. 15E illustrates a digital camera, which includes a main body 761, a display portion 767, an eyepiece 763, an operation switch 764, a display portion 765, a battery 766, and the like. The semiconductor device described in any of the above embodiments is provided in the main body 761. Thus, a digital camera with sufficiently low power consumption, in which writing and reading of data can be performed at high speed and data can be stored for a long time, can be realized.

Figure 15F:
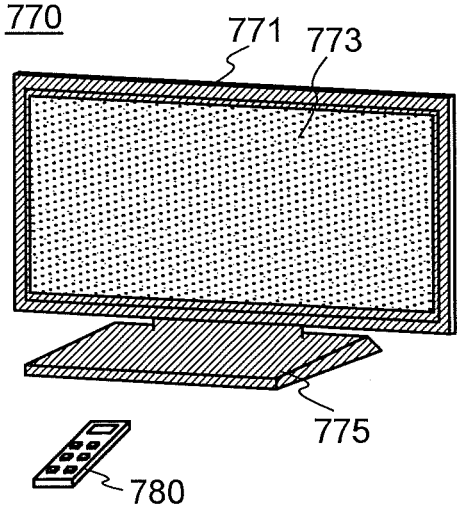

FIG. 15F is a television set 770, which includes a housing 771, a display portion 773, a stand 775, and the like. The television set 770 can be operated with a switch included in the housing 771 or with a remote controller 780. The semiconductor device described in any of the above embodiments is incorporated in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

Example 1

A transistor in which an oxide semiconductor containing In, Sn, and Zn as main components is used as a channel formation region can have favorable characteristics by depositing the oxide semiconductor while heating a substrate or by performing heat treatment after an oxide semiconductor film is formed. Note that a main component refers to an element contained in a composition at greater than or equal to 5 at. %.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 25A:
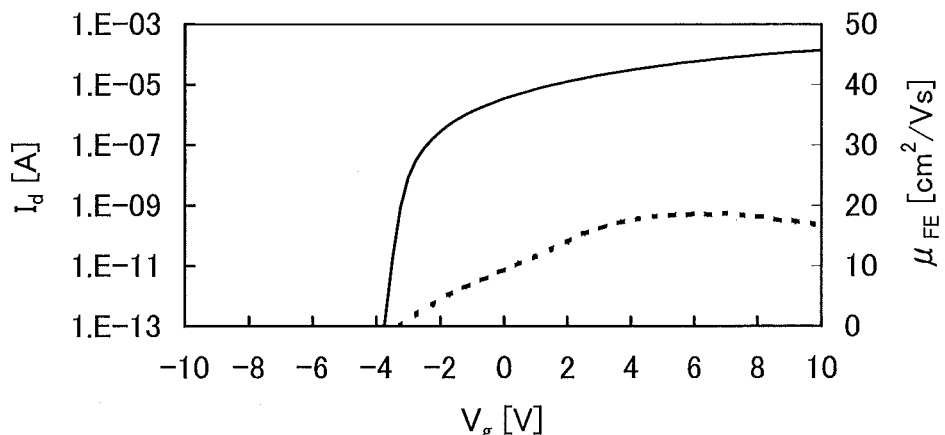
FIGS. 25A to 25C show $V_g$-$I_d$ characteristics and field-effect mobility of a transistor including an oxide semiconductor film.
Figure 25B:
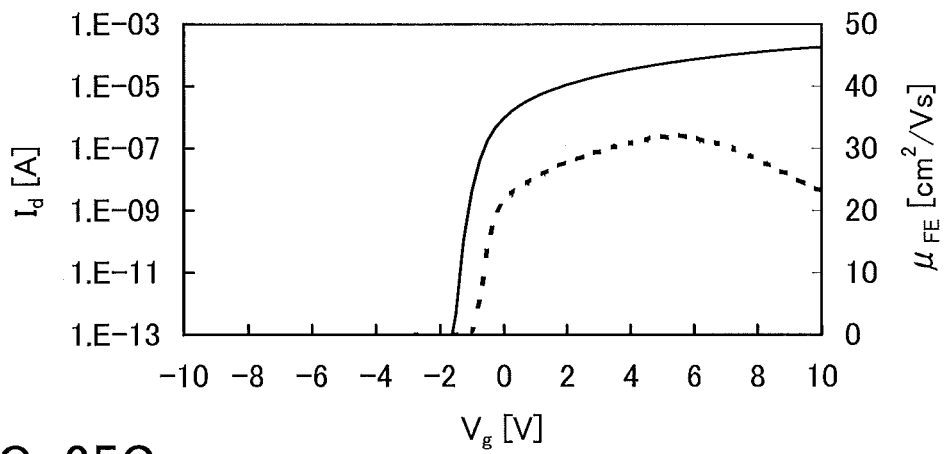
Figure 25C:
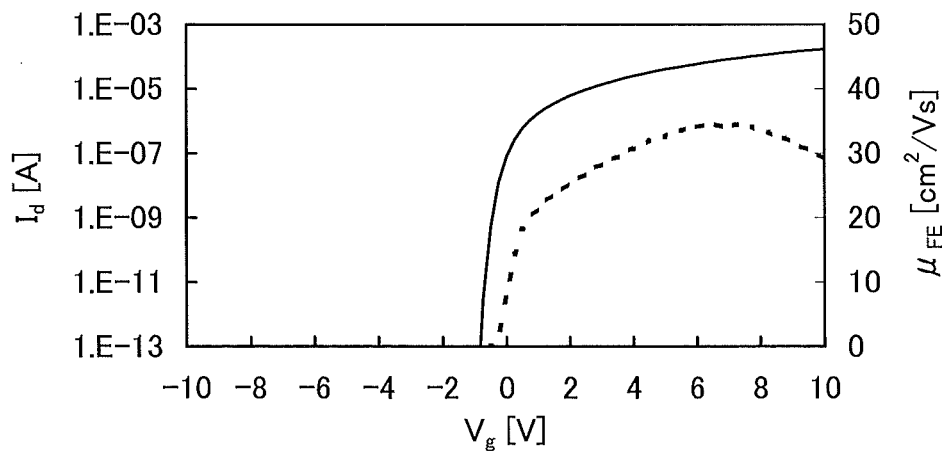

As an example, FIGS. 25A to 25C each show characteristics of a transistor in which an oxide semiconductor film containing In, Sn, and Zn as main components and having a channel length L of 3 μm and a channel width W of 10 μm, and a gate insulating layer with a thickness of 100 nm are used. Note that $V_d$ was set to 10 V.

FIG. 25A shows characteristics of a transistor whose oxide semiconductor film containing In, Sn, and Zn as main components was formed by a sputtering method without heating a substrate intentionally. The field-effect mobility of the transistor is 18.8 cm$^2$/Vsec. On the other hand, when the oxide semiconductor film containing In, Sn, and Zn as main components is formed while heating the substrate intentionally, the field-effect mobility can be improved. FIG. 25B shows characteristics of a transistor whose oxide semiconductor film containing In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film containing In, Sn, and Zn as main components. FIG. 25C shows characteristics of a transistor whose oxide semiconductor film containing In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture contained in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 25A and 25B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target to In:Sn:Zn=2:1:3.

The temperature of the intentional heating of the substrate or the temperature of the heat treatment is greater than or equal to 150° C., preferably greater than or equal to 200° C., more preferably greater than or equal to 400° C. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to drain voltage (a potential difference between a drain and a source). Then, the substrate temperature was set to 150° C. and $V_d$ was set to 0.1 V. After that, 20 V of $V_g$ was applied so that the intensity of an electric field applied to the gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 26A:
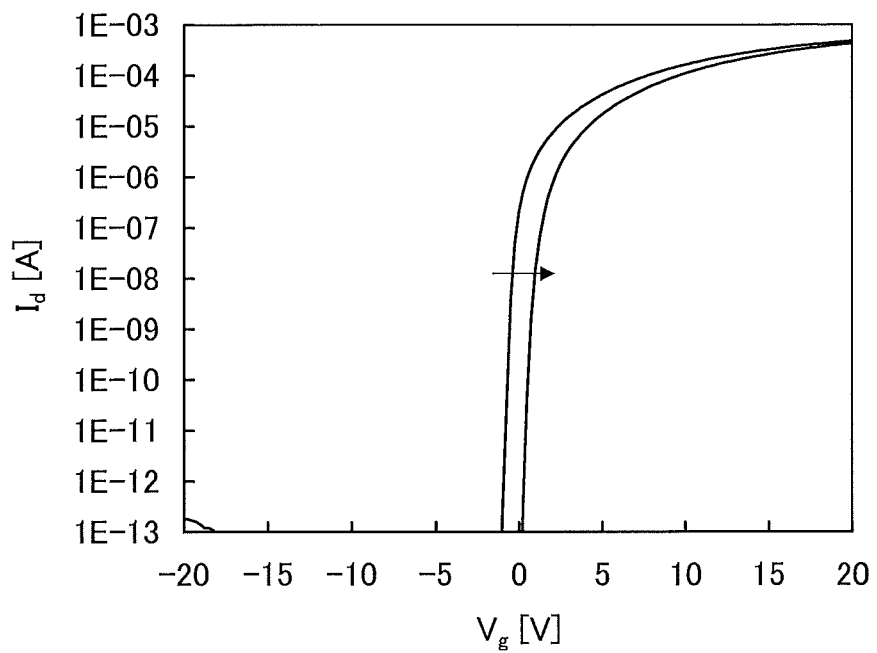
FIGS. 26A and 26B show $V_g$-$I_d$ characteristics after a BT test of a transistor of Sample 1.
Figure 26B:
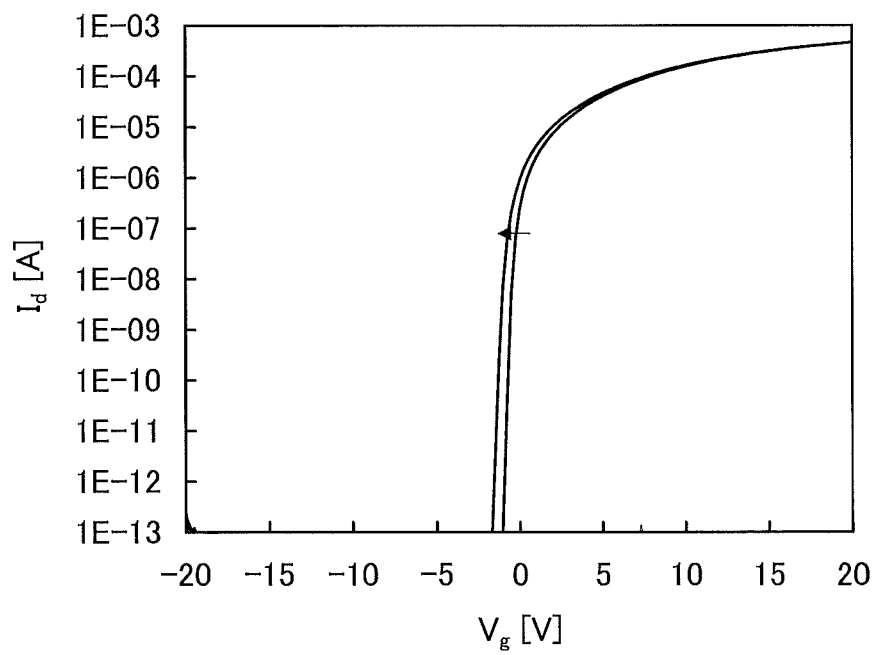
Figure 27A:
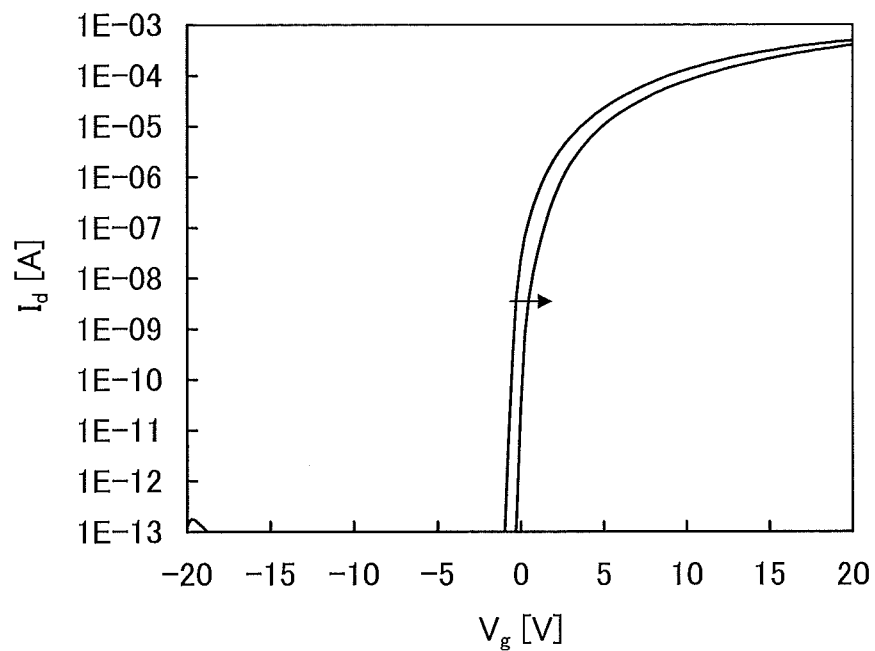
FIGS. 27A and 27B show $V_g$-$I_d$ characteristics after a BT test of a transistor of Sample 2.
Figure 27B:
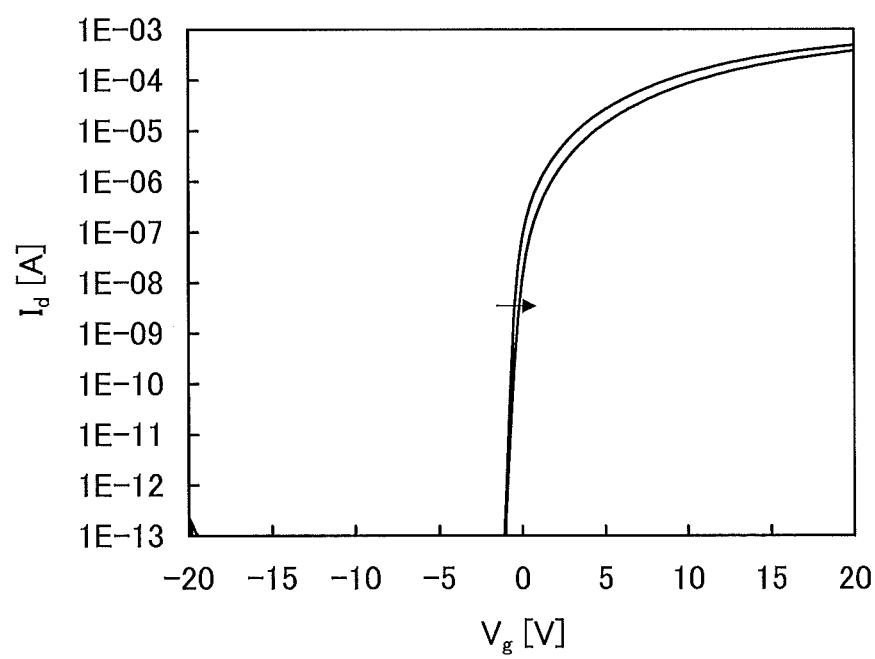

FIGS. 26A and 26B show a result of the positive BT test of Sample 1 and a result of the negative BT test of Sample 1, respectively. FIGS. 27A and 27B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is contained in the oxide semiconductor by the heat treatment, oxygen deficiency caused constantly can be compensated for with excess oxygen. The excess oxygen is oxygen existing mainly between lattices. When the concentration of excess oxygen is set to greater than or equal to $1\times10^{16}$/cm$^3$ and less than or equal to $2\times10^{20}$/cm$^3$, excess oxygen can be contained in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
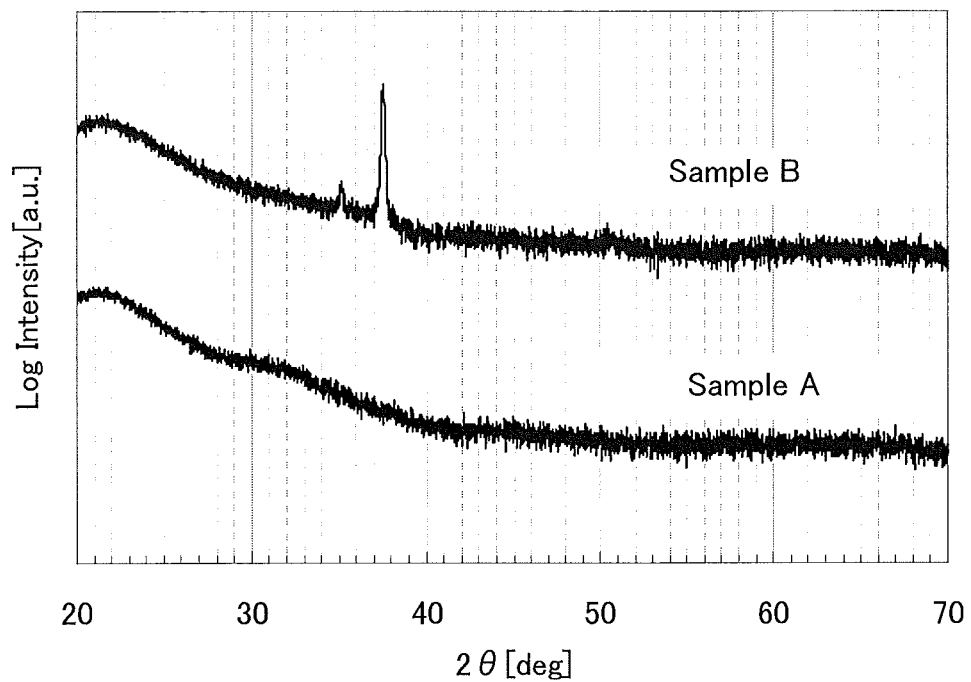
FIG. 28 is a graph showing XRD spectra of Sample A and Sample B.

FIG. 28 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating the substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being contained in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be less than or equal to 1 aA/μm. Here, the unit of the off-state current is used to indicate current per micrometer of a channel width.

Figure 29:
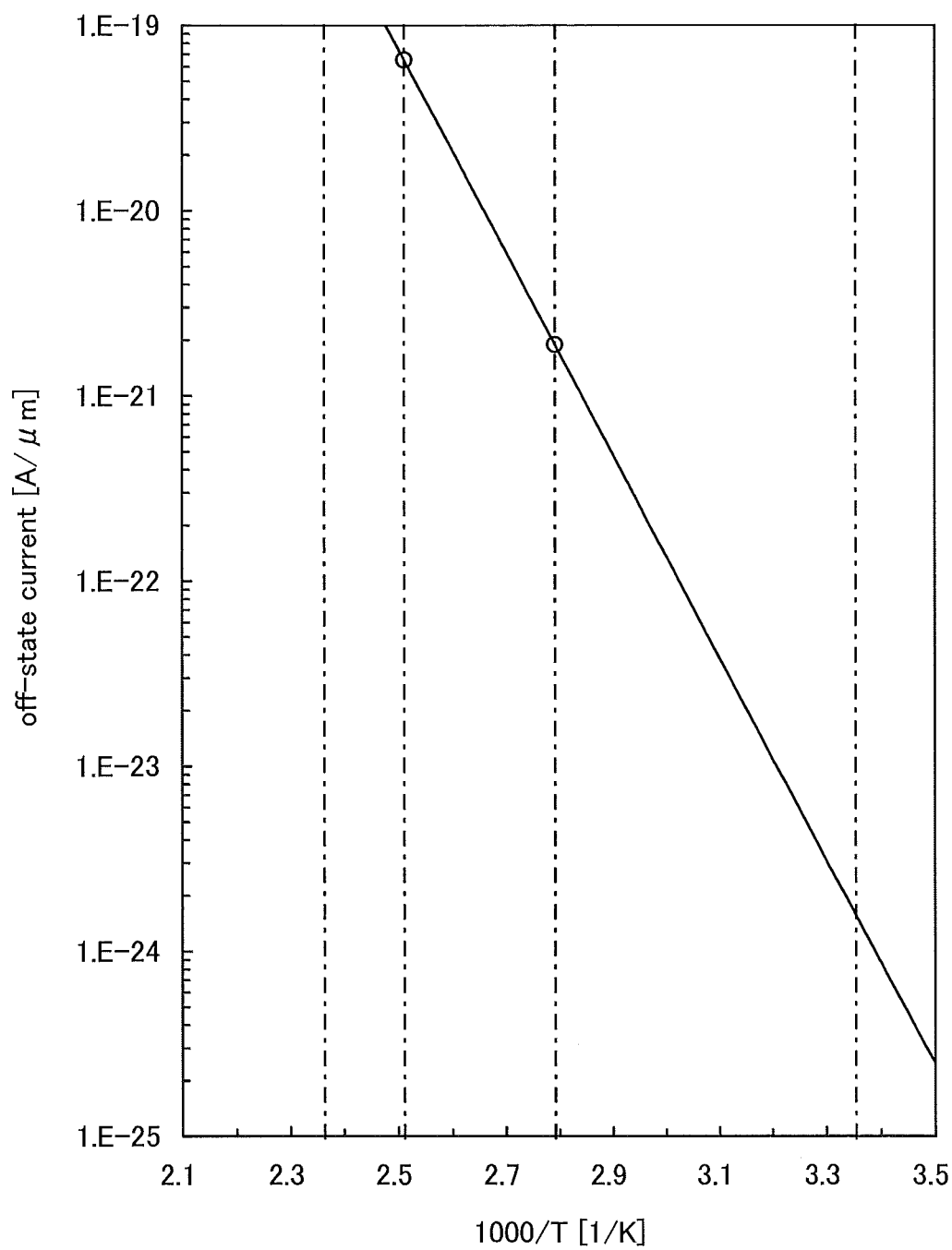
FIG. 29 is a graph showing a relation between the off-state current of a transistor and the substrate temperature in measurement.

FIG. 29 shows a relation between the off-state current of a transistor and the inverse of substrate temperature (absolute temperature) at measurement. Here, for simplicity, the abscissa represents a value (1000/T) obtained by multiplying an inverse of substrate temperature at measurement by 1000.

Specifically, as shown in FIG. 29, the off-state current can be less than or equal to 1 aA/μm ($1\times10^{-18}$ A/μm), less than or equal to 100 zA/μm ($1\times10^{-19}$ A/μm), and less than or equal to 1 zA/μm ($1\times10^{-21}$ A/μm) when the substrate temperature is 125° C., 85° C., and room temperature (27° C.), respectively. Preferably, the off-state current can be less than or equal to 0.1 aA/μm ($1\times10^{-19}$ A/μm), less than or equal to 10 zA/μm ($1\times10^{-20}$ A/μm), and less than or equal to 0.1 zA/μm ($1\times10^{-22}$ A/μm) when the substrate temperatures is 125° C., 85° C., and room temperature, respectively.

Note that in order to prevent hydrogen and moisture from being contained in the oxide semiconductor film during formation thereof, it is preferable to increase the purity of a sputtering gas by sufficiently suppressing leakage from the outside of a film formation chamber and degasification through an inner wall of the film formation chamber. For example, a gas with a dew point of less than or equal to −70° C. is preferably used as the sputtering gas in order to prevent moisture from being contained in the film. In addition, it is preferable to use a target which is highly purified so as not to contain impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 µm, a channel width W of 10 µm, $L_{ov}$ of 0 µm, and dW of 0 µm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as $L_{ov}$, and the width of a portion of the pair of electrodes, which does not overlap with an oxide semiconductor film, is referred to as dW.

Figure 30:
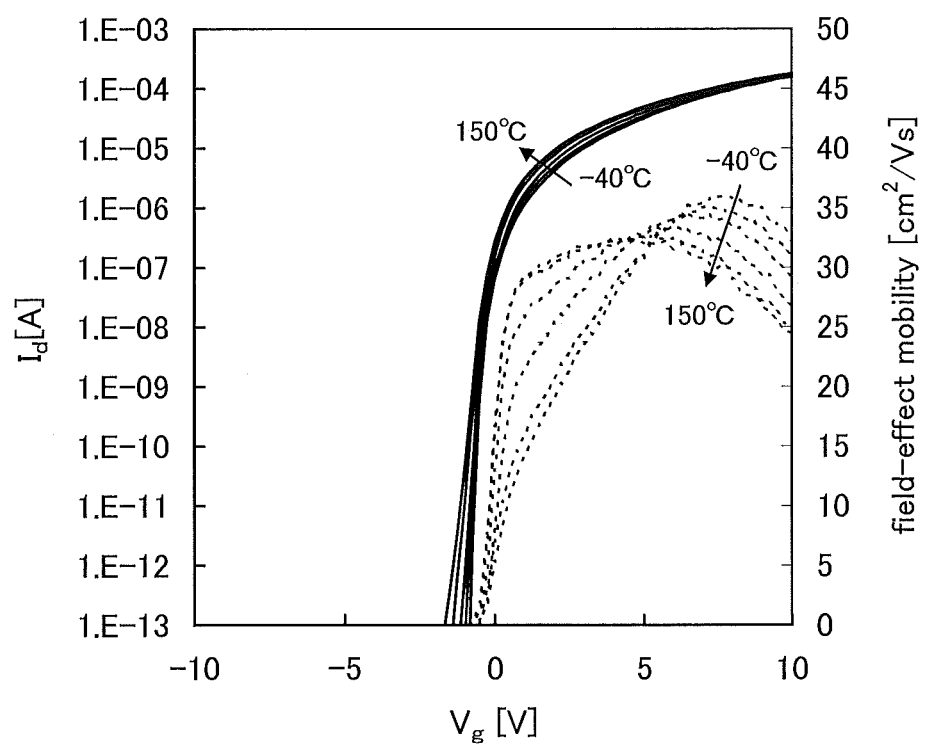
FIG. 30 shows the $V_g$ dependence of $I_d$ and field-effect mobility.
Figure 31A:
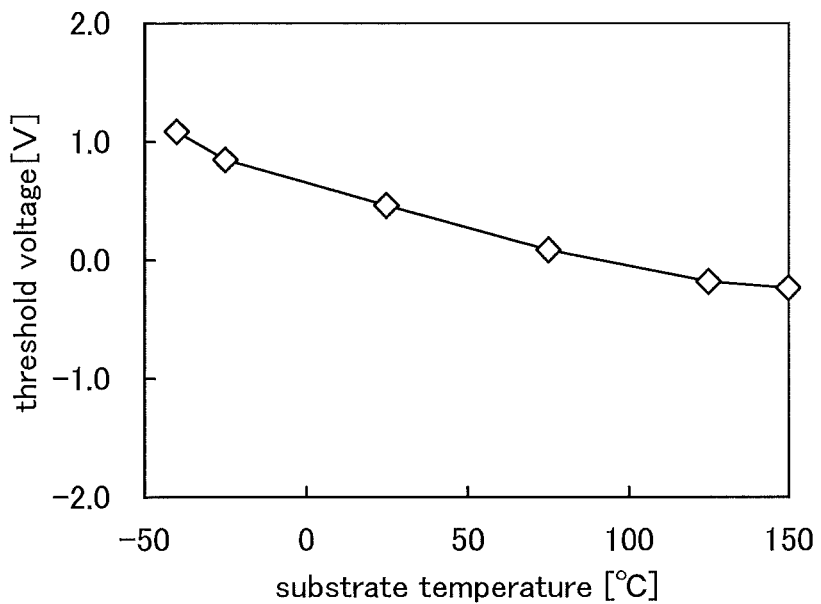
FIGS. 31A and 31B are graphs showing a relation between threshold voltage and substrate temperature and a relation between field-effect mobility and substrate temperature.

FIG. 30 shows the $V_g$ dependence of $I_d$ (a solid line) and field-effect mobility (a dotted line). FIG. 31A shows a relation between the substrate temperature and the threshold voltage, and FIG. 31B shows a relation between the substrate temperature and the field-effect mobility.

From FIG. 31A, it is found that the threshold voltage gets lower as the substrate temperature increases. Note that the threshold voltage is decreased from 1.09 V to −0.23 V in the range from −40° C. to 150° C.

Figure 31B:
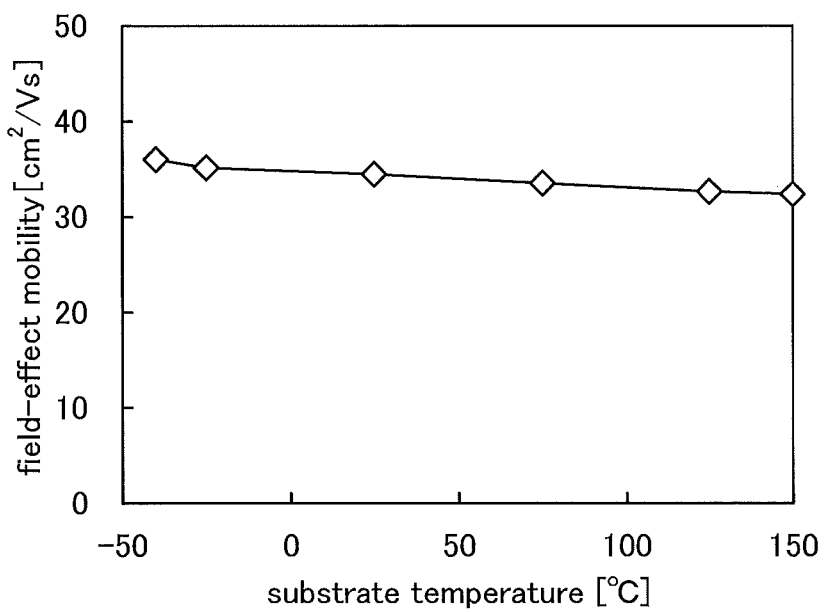

From FIG. 31B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of greater than or equal to 30 cm²/Vsec, preferably greater than or equal to 40 cm²/Vsec, more preferably greater than or equal to 60 cm²/Vsec can be obtained with the off-state current maintained at less than or equal to 1 aA/µm, which can achieve on-state current needed for an LSI. For example, in an FET where L/W is 33 nm/40 nm, an on-state current of greater than or equal to 12 µA can flow when the gate voltage is 2.7 V and the drain voltage is 1.0 V. In addition, sufficient electrical characteristics can be ensured in a temperature range needed for an operation of a transistor. With such characteristics, an integrated circuit having a novel function can be realized without decreasing the operation speed even when a transistor including an oxide semiconductor is also provided in an integrated circuit formed using a Si semiconductor.

Example 2

In this example, an example of a transistor in which an In—Sn—Zn—O film is used as an oxide semiconductor film will be described with reference to FIGS. 32A and 32B and the like.

Figure 32A:
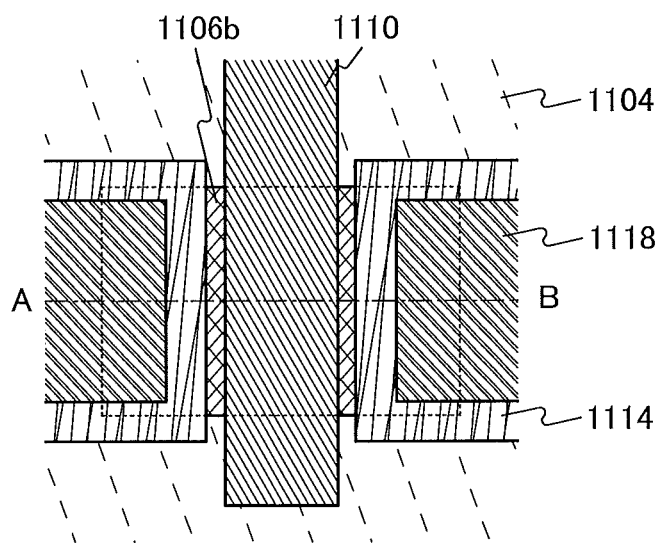
FIGS. 32A and 32B are a top view and a cross-sectional view of a transistor which is one embodiment of the present invention.
Figure 32B:
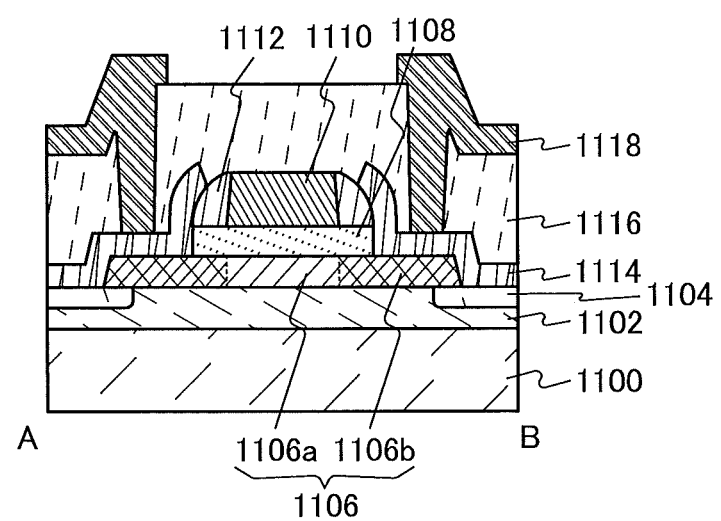

FIGS. 32A and 32B are a top view and a cross-sectional view of a coplanar transistor having a top-gate top-contact structure. FIG. 32A is the top view of the transistor. FIG. 32B illustrates cross section A-B along dashed-dotted line A-B in FIG. 32A.

The transistor illustrated in FIG. 32B includes a substrate 1100; a base insulating layer 1102 provided over the substrate 1100; a protective insulating film 1104 provided in the periphery of the base insulating layer 1102; an oxide semiconductor film 1106 provided over the base insulating layer 1102 and the protective insulating film 1104 and including a high-resistance region 1106a and low-resistance regions 1106b; a gate insulating layer 1108 provided over the oxide semiconductor film 1106; a gate electrode 1110 provided to overlap with the oxide semiconductor film 1106 with the gate insulating layer 1108 provided therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

Example 3

In this example, another example of a transistor in which an In—Sn—Zn—O film is used as an oxide semiconductor film and which is different from the above will be described.

Figure 33A:
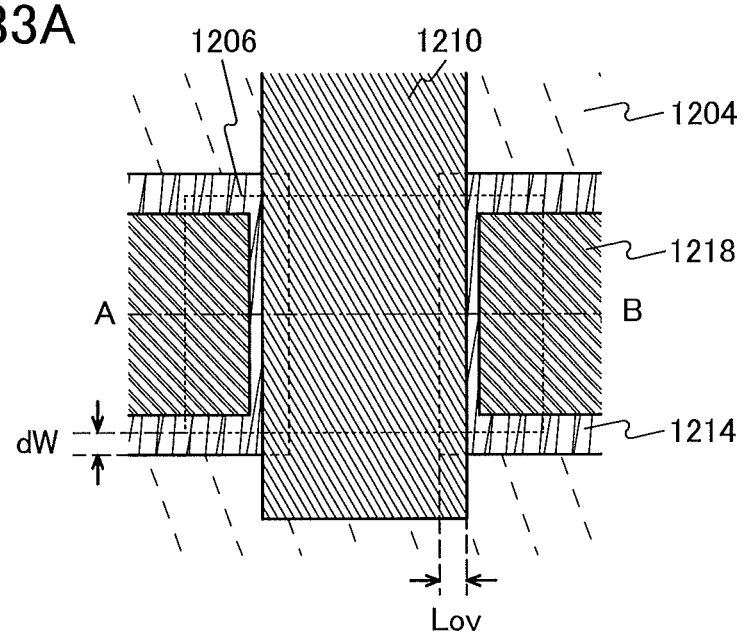
FIGS. 33A and 33B are a top view and a cross-sectional view of a transistor which is one embodiment of the present invention.
Figure 33B:
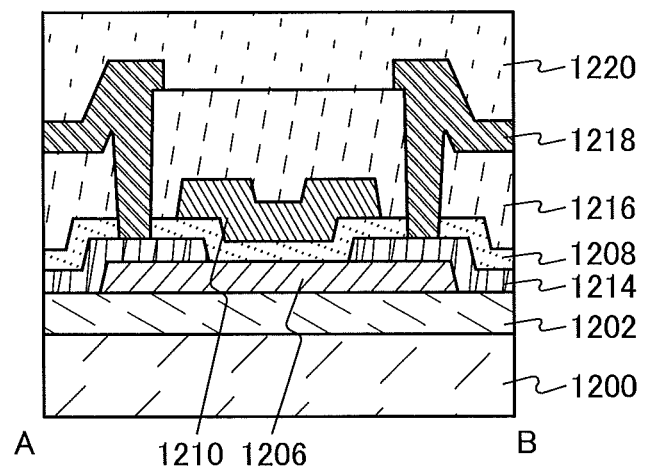

FIGS. 33A and 33B are a top view and a cross-sectional view which illustrate a structure of a transistor manufactured in this example. FIG. 33A is the top view of the transistor. FIG. 33B is the cross-sectional view along dashed-dotted line A-B in FIG. 33A.

The transistor illustrated in FIG. 33B includes a substrate 1200; a base insulating layer 1202 provided over the substrate 1200; an oxide semiconductor film 1206 provided over the base insulating layer 1202; a pair of electrodes 1214 in contact with the oxide semiconductor film 1206; a gate insulating layer 1208 provided over the oxide semiconductor film 1206 and the pair of electrodes 1214; a gate electrode 1210 provided to overlap with the oxide semiconductor film 1206 with the gate insulating layer 1208 provided therebetween; an interlayer insulating film 1216 provided to cover the gate insulating layer 1208 and the gate electrode 1210; wirings 1218 connected to the pair of electrodes 1214 through openings formed in the interlayer insulating film 1216; and a protective film 1220 provided to cover the interlayer insulating film 1216 and the wirings 1218.

As the substrate 1200, a glass substrate can be used. As the base insulating layer 1202, a silicon oxide film can be used. As the oxide semiconductor film 1206, an In—Sn—Zn—O film can be used. As the pair of electrodes 1214, a tungsten film can be used. As the gate insulating layer 1208, a silicon oxide film can be used. The gate electrode 1210 can have a layered structure of a tantalum nitride film and a tungsten film. The interlayer insulating film 1216 can have a layered structure of a silicon oxynitride film and a polyimide film. The wirings 1218 can each have a layered structure in which a titanium film, an aluminum film, and a titanium film are formed in this order. As the protective film 1220, a polyimide film can be used.

Note that in the transistor having the structure illustrated in FIG. 33A, the width of a portion where the gate electrode 1210 overlaps with one of the pair of electrodes 1214 is referred to as $L_{ov}$. Similarly, the width of a portion of the pair of electrodes 1214, which does not overlap with the oxide semiconductor film 1206, is referred to as UV.

EXPLANATION OF REFERENCE

100: substrate, 106: element isolation insulating layer, 108: gate insulating layer, 110: gate electrode, 116: channel formation region, 120: impurity region, 124: metal compound region, 126: electrode, 128: insulating layer, 130a: source or drain electrode, 130b: source or drain electrode, 130c: electrode, 136a: electrode, 136b: electrode, 140: insulating layer, 142a: source or drain electrode, 142b: source or drain electrode, 142c: electrode, 143a: oxide conductive layer, 143b: oxide conductive layer, 144: oxide semiconductor layer, 145: oxide semiconductor layer, 145a: crystalline oxide semiconductor layer, 145b: crystalline oxide semiconductor layer, 146: gate insulating layer, 148a: gate electrode, 148b: conductive layer, 150: insulating layer, 152: insulating layer, 154a: electrode, 154b: electrode, 156: wiring, 158: insulating layer, 159: conductive layer, 160: transistor, 162: transistor, 164: capacitor, 170: memory cell, 201: memory cell array, 210: peripheral circuit, 211: driver circuit, 212: driver circuit, 213: driver circuit, 214: driver circuit, 215: driver circuit, 218: controller, 219: mode register, 220: I/O buffer, 221: address buffer, 222: sense amplifier, 250: center point, 312: transistor, 314: capacitor, 211a: driver circuit, 211b: driver circuit, 212a: driver circuit, 212b: driver circuit, 213a: driver circuit, 213b: driver circuit, 214a: driver circuit, 214b: driver circuit, 216a: sense amplifier group, 216b: sense amplifier group, 217a: column decoder, 217b: column decoder, 223a: row decoder, 223b: row decoder, 322: transistor, 324: capacitor, 332: transistor, 334: capacitor, 342: transistor, 344: capacitor, 352: transistor, 354: capacitor, 362: transistor, 364: capacitor, 372: transistor, 374: capacitor, 401: transistor, 402: transistor, 403: transistor, 404: transistor, 405: transistor, 406: transistor, 407: transistor, 408: transistor, 409: transistor, 410: transistor, 411: transistor, 601: memory cell array, 610: peripheral circuit, 611: column decoder, 612: row decoder, 613: region, 614: intersection portion 701: housing, 702: housing, 703: display portion, 704: keyboard, 711: main body, 712: stylus, 713: display portion, 714: operation button, 715: external interface, 720: electronic book, 721: housing, 723: housing, 725: display portion, 727: display portion, 731: power switch, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, 780: remote controller, 901: base insulating layer, 902: embedded insulator, 903a: semiconductor region, 903b: semiconductor region, 903c: semiconductor region, 904: gate insulating layer, 905: gate electrode, 906a: sidewall insulator, 906b: sidewall insulator, 907: insulator, 908a: source electrode, 908b: drain electrode, 1100: substrate, 1102: base insulating layer, 1104: protective insulating film, 1106: oxide semiconductor film, 1106a: high-resistance region, 1106b: low-resistance region, 1108: gate insulating layer, 1110: gate electrode, 1112: sidewall insulating film, 1114: pair of electrodes, 1116: interlayer insulating film, 1118: wiring, 1200: substrate, 1202: base insulating layer, 1206: oxide semiconductor film, 1208: gate insulating layer, 1210: gate electrode, 1214: pair of electrodes, 1216: interlayer insulating film, 1218: wiring, and 1220: protective film.

This application is based on Japanese Patent Application serial no. 2010-197559 filed with Japan Patent Office on Sep. 3, 2010, Japanese Patent Application serial no. 2011-006632 filed with Japan Patent Office on Jan. 17, 2011, and Japanese Patent Application serial no. 2011-107806 filed with Japan Patent Office on May 13, 2011, the entire contents of which are hereby incorporated by reference.

The invention claimed is:

1. A semiconductor device comprising:
   first to fourth driver circuits; and
   a memory cell array comprising a plurality of memory cells arranged in a matrix over the first to fourth driver circuits,
   wherein one of the plurality of memory cells comprises:
      a transistor comprising a gate electrode, a source electrode, a drain electrode, an oxide semiconductor layer, and a gate insulating layer; and
      a capacitor comprising a pair of electrode layers and a dielectric layer therebetween, wherein one of the pair of electrode layers comprises the source electrode or the drain electrode, and the dielectric layer comprises the gate insulating layer,
   wherein the first driver circuit and the second driver circuit are arranged so as to be substantially symmetrical with respect to a center point of the memory cell array,
   wherein the third driver circuit and the fourth driver circuit are arranged so as to be perpendicular to the first driver circuit and the second driver circuit, and
   wherein the third driver circuit and the fourth driver circuit are arranged so as to be substantially symmetrical with respect to the center point of the memory cell array.

2. The semiconductor device according to claim 1, wherein the first to fourth driver circuits are covered with the memory cell array.

3. The semiconductor device according to claim 1, wherein the first and second driver circuits each comprise a column decoder and a sense amplifier portion, and the third and fourth driver circuits each comprise a row decoder.

4. The semiconductor device according to claim 1, wherein the number of wirings connected to the first driver circuit and the memory cell array is equal to the number of wirings connected to the second driver circuit and the memory cell array.

5. The semiconductor device according to claim 1, wherein the number of wirings connected to the third driver circuit and the memory cell array is equal to the number of wirings connected to the fourth driver circuit and the memory cell array.

6. The semiconductor device according to claim 1, wherein the first to fourth driver circuits comprise a material other than an oxide semiconductor.

7. The semiconductor device according to claim 1, wherein the first to fourth driver circuits comprise silicon, germanium, silicon germanium, silicon carbide, or gallium arsenide.

8. The semiconductor device according to a claim 1, wherein the transistor comprises a semiconductor material having an energy gap of more than 3 eV.

9. The semiconductor device according to a claim 1, wherein the first to fourth driver circuits are provided on an SOI substrate.

10. The semiconductor device according to a claim 1, wherein the first to fourth driver circuits are provided under a peripheral portion of the memory cell array.

11. A semiconductor device comprising:
   first to fourth driver circuits; and
   a memory cell array comprising a plurality of memory cells arranged in a matrix over the first to fourth driver circuits,
   wherein one of the plurality of memory cells comprises:

a transistor comprising a gate electrode, a source electrode, a drain electrode, an oxide semiconductor layer, and a gate insulating layer; and a capacitor comprising a pair of electrode layers and a dielectric layer therebetween, wherein one of the pair of electrode layers comprises the source electrode or the drain electrode, and the dielectric layer comprises the gate insulating layer, wherein an area of the first driver circuit differs from an area of the second driver circuit, wherein the third driver circuit and the fourth driver circuit are arranged so as to be perpendicular to the first driver circuit and the second driver circuit, and wherein an area of the third driver circuit differs from an area of the fourth driver circuit.

12. The semiconductor device according to claim 11, wherein the first to fourth driver circuits are covered with the memory cell array.

13. The semiconductor device according to claim 11, wherein the first and second driver circuits each comprise a column decoder and a sense amplifier portion, and the third and fourth driver circuits each comprise a row decoder.

14. The semiconductor device according to claim 11, wherein the number of wirings connected to the first driver circuit and the memory cell array differs from the number of wirings connected to the second driver circuit and the memory cell array.

15. The semiconductor device according to claim 11, wherein the number of wirings connected to the third driver circuit and the memory cell array differs from the number of wirings connected to the fourth driver circuit and the memory cell array.

16. The semiconductor device according to claim 11, wherein the first to fourth driver circuits comprise a material other than an oxide semiconductor.

17. The semiconductor device according to claim 11, wherein the first to fourth driver circuits comprise silicon, germanium, silicon germanium, silicon carbide, or gallium arsenide.

18. The semiconductor device according to a claim 11, wherein the transistor comprises a semiconductor material having an energy gap of more than 3 eV.

19. The semiconductor device according to a claim 11, wherein the first to fourth driver circuits are provided on an SOI substrate.

20. The semiconductor device according to a claim 11, wherein the first to fourth driver circuits are provided under a peripheral portion of the memory cell array.

* * * * *

UNITED STATES PATENT AND TRADEMARK OFFICE
CERTIFICATE OF CORRECTION

PATENT NO. : 8,508,967 B2
APPLICATION NO. : 13/223490
DATED : August 13, 2013
INVENTOR(S) : Shunpei Yamazaki et al.

Page 1 of 1

It is certified that error appears in the above-identified patent and that said Letters Patent is hereby corrected as shown below:

In the Specification

Column 10, line 44, replace "$V_1(C_B \times V_{BO} - C \times V_1)/(C_B+C))$" with --$V_1(=(C_B \times V_{BO}+C \times V_1)/(C_B+C))$--;

Column 10, line 46, replace "$V_0(=(C_B \times V_{BO} - C \times V_0)/(C_B+C)$" with --$V_0(=(C_B \times V_{BO}+C \times V_0)/(C_B+C))$--;

Column 11, line 30, replace "in" with --*m*--;

Column 13, line 50, replace "10a" with --IOa--;

Column 41, line 62, after "10" replace "nm" with --µm--;

Column 48, line 14, replace "2θ" with --2θ--;

Column 50, line 61, replace "UV" with --d*W*--.

Signed and Sealed this
Eleventh Day of March, 2014

Michelle K. Lee
*Deputy Director of the United States Patent and Trademark Office*